(12) United States Patent
Kang et al.

(10) Patent No.: US 10,243,149 B2
(45) Date of Patent: Mar. 26, 2019

(54) COMPOSITION, THIN FILM INCLUDING THE COMPOSITION, AND ORGANIC LIGHT-EMITTING DEVICE INCLUDING THE COMPOSITION OR THE THIN FILM

(71) Applicants: SAMSUNG ELECTRONICS CO., LTD., Suwon-si, Gyeonggi-do (KR); Samsung SDI Co., Ltd., Yongin-si, Gyeonggi-do (KR)

(72) Inventors: Hosuk Kang, Suwon-si (KR); Hyunjung Kim, Suwon-si (KR); Namheon Lee, Suwon-si (KR); Miyoung Chae, Suwon-si (KR); Sangmo Kim, Hwaseong-si (KR); Jongsoo Kim, Suwon-si (KR); Joonghyuk Kim, Seoul (KR); Myungsun Sim, Suwon-si (KR); Sooghang Ihn, Hwaseong-si (KR); Soonok Jeon, Seoul (KR); Yeonsook Chung, Seoul (KR); Yongsik Jung, Yongin-si (KR); Dalho Huh, Suwon-si (KR)

(73) Assignees: SAMSUNG ELECTRONICS CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/399,332

(22) Filed: Jan. 5, 2017

(65) Prior Publication Data
US 2017/0194570 A1 Jul. 6, 2017

(30) Foreign Application Priority Data
Jan. 5, 2016 (KR) .................. 10-2016-0001035

(51) Int. Cl.
*H01L 51/50* (2006.01)
*H01L 51/00* (2006.01)
(Continued)

(52) U.S. Cl.
CPC ........ *H01L 51/0072* (2013.01); *C09K 11/025* (2013.01); *C09K 11/06* (2013.01);
(Continued)

(58) Field of Classification Search
None
See application file for complete search history.

(56) References Cited

U.S. PATENT DOCUMENTS

2008/0194853 A1* 8/2008 Kim ............... C07F 15/0033
556/13
2012/0161617 A1 6/2012 Fukuzaki
(Continued)

FOREIGN PATENT DOCUMENTS

EP 2966146 A1 1/2016
EP 3109247 A1 12/2016
(Continued)

OTHER PUBLICATIONS

Extended European Search Report dated Apr. 28, 2017, issued for the European Patent Application No. 17150177.8-1375.
(Continued)

*Primary Examiner* — Gregory D Clark
(74) *Attorney, Agent, or Firm* — Cantor Colburn LLP

(57) ABSTRACT

A composition including a first compound represented by Formula 1 and a second compound represented by Formula 2:

$$Ar_1\text{-}(L_1)_{a1}\text{-}Ar_2 \quad \text{Formula 1}$$

$$Ar_{11}\text{-}(L_{11})_{a11}\text{-}Ar_{12} \quad \text{Formula 2}$$

wherein $Ar_1$, $Ar_2$, $Ar_{11}$, $Ar_{12}$, $L_1$, $L_{11}$, a1, and a11 are the same as described in the specification.

23 Claims, 1 Drawing Sheet

(51) Int. Cl.
*C09K 11/02* (2006.01)
*C09K 11/06* (2006.01)
*H01L 51/52* (2006.01)

(52) U.S. Cl.
CPC .......... *H01L 51/008* (2013.01); *H01L 51/009* (2013.01); *C09K 2211/1007* (2013.01); *C09K 2211/1014* (2013.01); *C09K 2211/1022* (2013.01); *C09K 2211/1029* (2013.01); *C09K 2211/1033* (2013.01); *C09K 2211/1037* (2013.01); *C09K 2211/1044* (2013.01); *C09K 2211/1059* (2013.01); *C09K 2211/1092* (2013.01); *C09K 2211/185* (2013.01); *H01L 51/0085* (2013.01); *H01L 51/5016* (2013.01); *H01L 51/5206* (2013.01); *H01L 51/5221* (2013.01); *H01L 2251/5384* (2013.01)

(56) References Cited

U.S. PATENT DOCUMENTS

| | | |
|---|---|---|
| 2015/0228908 A1 | 8/2015 | Lee et al. |
| 2017/0077421 A1 | 3/2017 | Ihn et al. |

FOREIGN PATENT DOCUMENTS

| | | | | |
|---|---|---|---|---|
| EP | 3142162 A1 | | 3/2017 | |
| JP | 2011-054696 A | | 3/2011 | |
| JP | 2001-176250 | * | 9/2011 | ............ C09K 11/06 |
| JP | 2013-115087 A | | 6/2013 | |
| JP | 2014-094935 A | | 5/2014 | |
| KR | 10-2010-0131745 A | | 12/2010 | |
| KR | 10-2012-0130074 A | | 11/2012 | |
| KR | 10-1502316 B1 | | 3/2015 | |
| WO | 2013-084885 A1 | | 6/2013 | |
| WO | 2015140073 A1 | | 9/2015 | |

OTHER PUBLICATIONS

Jin Won Sun et al. "A Fluorescent Organic Light-Emitting Diode with 30% External Quantum Efficiency", Adv. Mater. 2014, vol. 26, No. 32, 5684-5688.

Ming-Shiang Lin et al. "Incorporation of a CN group into mCP: a new bipolar host material for highly efficient blue and white electrophosphorescent devices", J. Mater. Chem. 2012, vol. 22, No. 31, 16114.

* cited by examiner

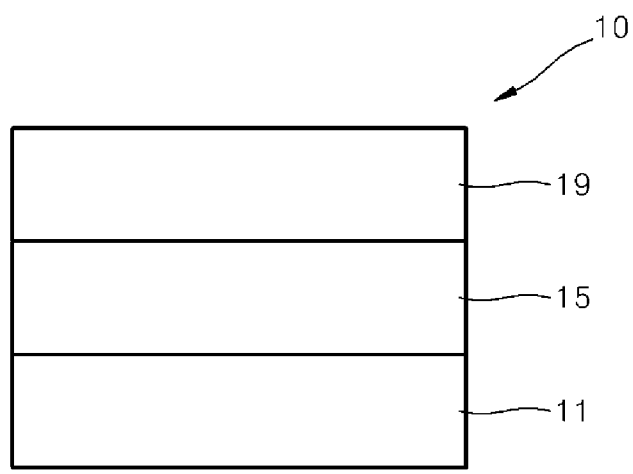

COMPOSITION, THIN FILM INCLUDING THE COMPOSITION, AND ORGANIC LIGHT-EMITTING DEVICE INCLUDING THE COMPOSITION OR THE THIN FILM

CROSS-REFERENCE TO THE RELATED APPLICATION

This application claims priority to Korean Patent Application No. 10-2016-0001035, filed on Jan. 5, 2016, in the Korean Intellectual Property Office, and all the benefits accruing therefrom under 35 U.S.C. § 119, the content of which is incorporated herein in its entirety by reference.

BACKGROUND

1. Field

The present disclosure relates to a composition, a thin film including the composition, and an organic light-emitting device including the composition or the thin film.

2. Description of the Related Art

Organic light-emitting devices (OLEDs) are self-emitting devices that have wide viewing angles, high contrast ratios, and short response times. OLEDs also exhibit excellent luminance, driving voltage, and response speed characteristics, and can produce full-color images.

For example, an organic light-emitting device may include an anode, a cathode, and an organic layer disposed between the anode and the cathode and may further include an emission layer. The organic light-emitting device may also include a hole transport region disposed between the anode and the emission layer, and an electron transport region disposed between the emission layer and the cathode. Holes injected from the anode are transported to the emission layer through the hole transport region, and electrons injected from the cathode are transported to the emission layer through the electron transport region. Carriers, such as the holes and electrons, can then recombine in the emission layer to generate excitons. When the excitons drop from an excited state to a ground state, light is emitted.

Various types of organic light emitting devices are known. However, there still remains a need in OLEDs having low driving voltage, high efficiency, high brightness, and long lifespan.

SUMMARY

Provided are a composition including a first compound and a second compound that each have a given formula, a thin film including the composition, and an organic light-emitting device including the composition or the thin film and having low driving voltage, high efficiency, high luminance, and long lifespan.

Additional aspects will be set forth in part in the description which follows and, in part, will be apparent from the description, or may be learned by practice of the presented embodiments.

According to an aspect of an embodiment, a composition includes a first compound represented by Formula 1 and a second compound represented by Formula 2:

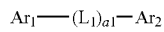

Formula 1

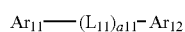

Formula 2

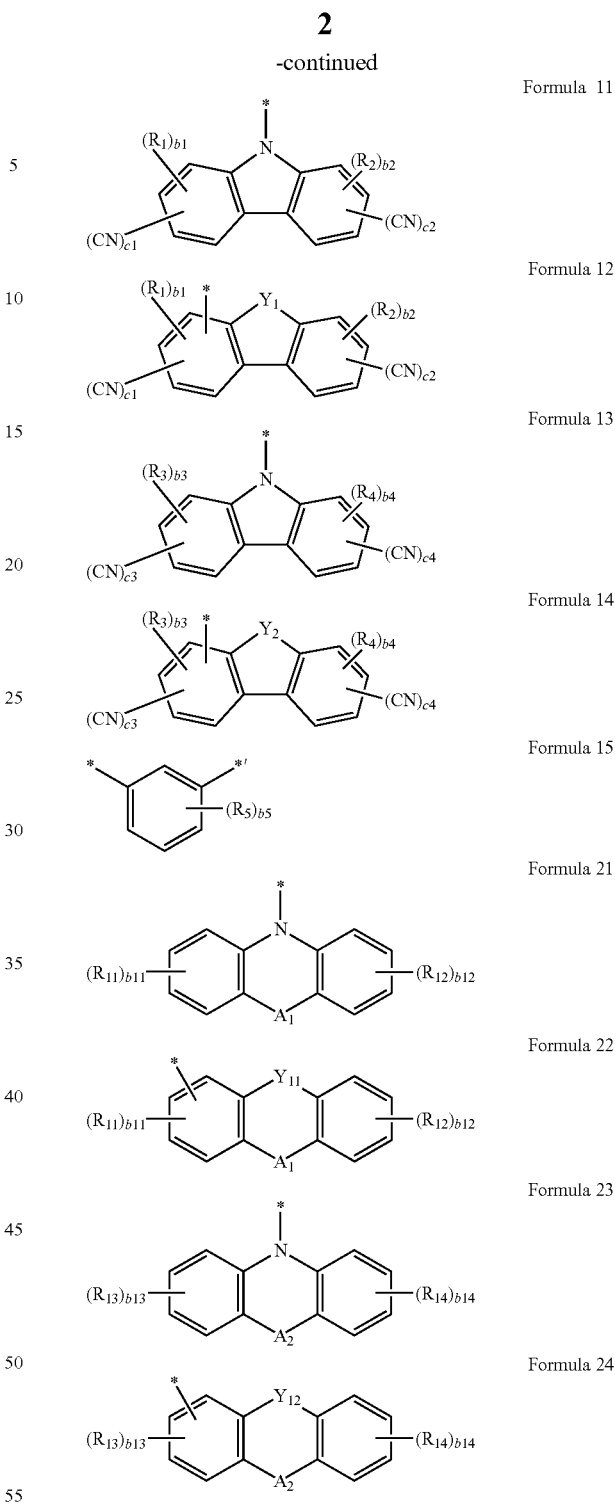

wherein $Ar_1$ in Formula 1 may be a group represented by Formula 11 or 12, $Ar_2$ in Formula 1 may be a group represented by Formula 13 or 14, $Y_1$ in Formula 12 may be oxygen (O), sulfur (S), or $N(R_{21})$, $Y_2$ in Formula 14 may be O, S, or $N(R_{22})$, $L_1$ in Formula 1 may be a group represented by Formula 15, a1 in Formula 1 may be an integer selected from 1 to 5, wherein when a1 is two or more, two or more groups $L_1$ may be identical to or different from each other, $R_1$ to $R_5$, $R_{21}$, and $R_{22}$ in Formulae 11 to 15 may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, and —Si($Q_1$)($Q_2$)($Q_3$), b1 to b5 in Formulae 11 to 15 may each independently be an integer selected from 0 to 4, the number of the cyano group in a group represented by *-($L_1$)$_{a1}$-*' in Formula 1 is denoted as "c5", and the sum of c1 to c5 in Formula 1 may be an integer selected from 1 to 5, i) when $Ar_1$ in Formula 1 is a group represented by Formula 12, $Ar_2$ in Formula 1 is a group represented by Formula 14, and $Y_1$ in Formula 12 is N($R_{21}$), $Y_2$ in Formula 14 may be O or S, ii) when $Ar_1$ in Formula 1 is a group represented by Formula 12, $Ar_2$ in Formula 1 is a group represented by Formula 14, and $Y_2$ in Formula 14 is N($R_{22}$), $Y_1$ in Formula 12 may be O or S, $Ar_{11}$ in Formula 2 may be a group represented by Formula 21 or 22, $Ar_{12}$ in Formula 2 may be selected from:

a group represented by Formula 23 or 24, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group not including a double bond between N and C, a $C_6$-$C_{60}$ aryl group, a biphenyl group, a terphenyl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group not including a double bond between N and C, a $C_1$-$C_{60}$ heteroaryloxy group not including a double bond between N and C, a $C_1$-$C_{60}$ heteroarylthio group not including a double bond between N and C, a $C_2$-$C_{60}$ heteroarylalkyl group not including a double bond between N and C, a monovalent non-aromatic condensed polycyclic group, and a monovalent non-aromatic condensed heteropolycyclic group not including a double bond between N and C; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group not including a double bond between N and C, a $C_6$-$C_{60}$ aryl group, a biphenyl group, a terphenyl group, a $C_1$-$C_{60}$ heteroaryl group not including a double bond between N and C, a monovalent non-aromatic condensed polycyclic group, and a monovalent non-aromatic condensed heteropolycyclic group not including a double bond between N and C, each substituted with at least one selected from deuterium, a hydroxyl group, an amino group, an amidino group, a hydrazine group, a hydrazone group, a carboxylic acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a biphenyl group, a terphenyl group, a $C_1$-$C_{60}$ heteroaryl group, a monovalent non-aromatic condensed polycyclic group, a monovalent non-aromatic condensed heteropolycyclic group not including a double bond between N and C, and —Si($Q_{11}$)($Q_{12}$)($Q_{13}$), $A_1$ and $A_2$ in Formulae 21 to 24 may each independently be selected from:

a single bond, a $C_1$-$C_4$ alkylene group, and a $C_2$-$C_4$ alkenylene group; and a $C_1$-$C_4$ alkylene group and a $C_2$-$C_4$ alkenylene group, each substituted with at least one selected from deuterium, a $C_1$-$C_{10}$ alkyl group, a $C_1$-$C_{10}$ alkoxy group, a phenyl group, a biphenyl group, a terphenyl group, a naphthyl group, a fluorenyl group, a carbazolyl group, a dibenzofuranyl group, a dibenzothiophenyl group, and —Si($Q_{21}$)($Q_{22}$)($Q_{23}$), $Y_{11}$ in Formula 22 may be O, S, or N($R_{41}$), $Y_{12}$ in Formula 24 may be O, S, or N($R_{42}$), $R_{11}$ to $R_{14}$, $R_{41}$, and $R_{42}$ in Formulae 21 to 24 may each independently be selected from:

hydrogen, deuterium, a hydroxyl group, an amino group, an amidino group, a hydrazine group, a hydrazone group, a carboxylic acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, a hydroxyl group, an amino group, an amidino group, a hydrazine group, a hydrazone group, and a carboxylic acid group or a salt thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group not including a double bond between N and C, a $C_6$-$C_{60}$ aryl group, a biphenyl group, a terphenyl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group not including a double bond between N and C, a $C_1$-$C_{60}$ heteroaryloxy group not including a double bond between N and C, a $C_1$-$C_{60}$ heteroarylthio group not including a double bond between N and C, a $C_2$-$C_{60}$ heteroarylalkyl group not including a double bond between N and C, a monovalent non-aromatic condensed polycyclic group, and a monovalent non-aromatic condensed heteropolycyclic group not including a double bond between N and C;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group not including a double bond between N and C, a $C_6$-$C_{60}$ aryl group, a biphenyl group, a terphenyl group, a $C_1$-$C_{60}$ heteroaryl group not including a double bond between N and C, a monovalent non-aromatic condensed polycyclic group, and a monovalent non-aromatic condensed heteropolycyclic group not including a double bond between N and C, each substituted with at least one selected from deuterium, a hydroxyl group, an amino group, an amidino group, a hydrazine group, a hydrazone group, a carboxylic acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a biphenyl group, a terphenyl group, a $C_1$-$C_{60}$ heteroaryl group, a monovalent non-aromatic condensed polycyclic group, a monovalent non-aromatic condensed heteropolycyclic group not including a double bond between N and C, and —Si($Q_{41}$)($Q_{42}$)($Q_{43}$), and
—Si($Q_{51}$)($Q_{52}$)($Q_{53}$), b11 to b14 in Formulae 21 to 24 may each independently be an integer selected from 0 to 4, $L_{11}$ in Formula 2 may be selected from:

a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group not including a double bond between N and C, a $C_6$-$C_{60}$ arylene group, a $C_1$-$C_{60}$ heteroarylene group not including a double bond between N and C, a divalent non-aromatic condensed polycyclic group, and a divalent non-aromatic condensed heteropolycyclic group not including a double bond between N and C; and a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group not including a double bond between N and C, a $C_6$-$C_{60}$ arylene group, a $C_1$-$C_{60}$ heteroarylene group not including a double bond between N and C, a divalent non-aromatic condensed polycyclic group, and a divalent non-aromatic condensed heteropolycyclic group not including a double bond between N and C, each substituted with at least one selected from deuterium, a hydroxyl group, an amino group, an amidino group, a hydrazine group, a hydrazone group, a carboxylic acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a biphenyl group, a terphenyl group, a $C_1$-$C_{60}$ heteroaryl group, a monovalent non-aromatic condensed polycyclic group, a monovalent non-aromatic condensed heteropolycyclic group not including a double bond between N and C, and —Si($Q_{31}$)($Q_{32}$)($Q_{33}$), a11 in Formula 2 may be an integer selected from 0 to 5, wherein when a11 is two or more, two or more groups $L_{11}$ may be identical to or different from each other, the second compound may not include a cyano group, at least one of substituent(s) of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a biphenyl group, a terphenyl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, and —Si($Q_{61}$)($Q_{62}$)($Q_{63}$), and $Q_1$ to $Q_3$, $Q_{11}$ to $Q_{13}$, $Q_{21}$ to $Q_{23}$, $Q_{31}$ to $Q_{33}$, $Q_{41}$ to $Q_{43}$, $Q_{51}$ to $Q_{53}$, and $Q_{61}$ to $Q_{63}$ may each independently be selected from hydrogen, deuterium, a $C_1$-$C_{60}$ alkyl group, a $C_1$-$C_{60}$ alkoxy group, a phenyl group, a biphenyl group, a terphenyl group, a naphthyl group, and an anthracenyl group, and

* and *' in the group represented by *-($L_1$)$_{a1}$-*' each independently indicate a binding site to a neighboring atom.

According to an aspect of an embodiment, a thin film includes the composition.

According to an aspect of an embodiment, a thin film includes the composition and a phosphorescent dopant.

According to an aspect of an embodiment, an organic light-emitting device includes:

a first electrode;

a second electrode; and an organic layer disposed between the first electrode and the second electrode, wherein the organic layer includes the composition or the thin film.

Here, the thin film included in the organic light-emitting device may be an emission layer.

BRIEF DESCRIPTION OF THE DRAWING

These and/or other aspects will become apparent and more readily appreciated from the following description of the embodiments, taken in conjunction with FIG. 1 which is a schematic cross-sectional diagram of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

A composition according to an embodiment of the present disclosure may include a first compound represented by Formula 1 and a second compound represented by Formula 2. In an embodiment, the composition may consist of the first compound represented by Formula 1 and the second compound represented by Formula 2.

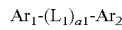  Formula 1

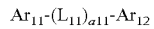  Formula 2 wherein $Ar_1$ in Formula 1 may be a group represented by Formula 11 or 12, and $Ar_2$ in Formula 1 may be a group represented by Formula 13 or 14:

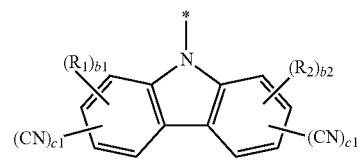  Formula 11

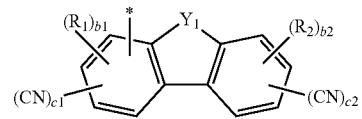  Formula 12

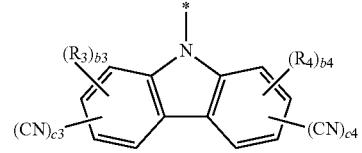  Formula 13

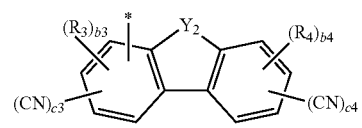  Formula 14 wherein $Y_1$ in Formula 12 may be oxygen (O), sulfur (S), or $N(R_{21})$, and $Y_2$ in Formula 14 may be O, S, or $N(R_{22})$.

Descriptions of Formulae 11 to 14 may each independently refer to the descriptions thereof in the present disclosure.

In Formula 1, $L_1$ may be a group represented by Formula 15, and a1 may be an integer selected from 1 to 5, wherein when a1 is two or more, two or more groups $L_1$ may be identical to or different from each other:

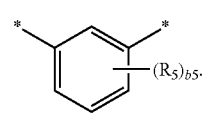  Formula 15

In Formula 1, a1 indicates the number of groups $L_1$, and may be 1, 2, 3, 4, or 5. For example, a1 in Formula 1 may be 2, 3, 4, or 5. For example, a1 in Formula 1 may be 2 or 3, but embodiments are not limited thereto.

In Formulae 11 to 15, $R_1$ to $R_5$, $R_{21}$, and $R_{22}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, and —Si($Q_1$)($Q_2$)($Q_3$).

For example, in Formulae 11 to 15, $R_1$ to $R_5$, $R_{21}$, and $R_{22}$ may each independently be selected from:

hydrogen, deuterium, a cyano group, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group;

a $C_1$-$C_{10}$ alkyl group and a $C_1$-$C_{10}$ alkoxy group, each substituted with at least one selected from deuterium and a cyano group; and a phenyl group, a biphenyl group, a terphenyl group, a fluorenyl group, a pyridinyl group, a carbazolyl group, a dibenzofuranyl group, and a dibenzothiophenyl group, each substituted with at least one selected from deuterium, a cyano group, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group.

In various embodiments, in Formulae 11 to 15, $R_1$ to $R_5$, $R_{21}$, and $R_{22}$ may each independently be selected from:

hydrogen, deuterium, a cyano group, a $C_1$-$C_{10}$ alkyl group, a phenyl group, a biphenyl group, and a terphenyl group;

a $C_1$-$C_{10}$ alkyl group substituted with at least one selected from deuterium and a cyano group; and a phenyl group, a biphenyl group, and a terphenyl group, each substituted with at least one selected from deuterium, a cyano group, a $C_1$-$C_{10}$ alkyl group, a phenyl group, a biphenyl group, and a terphenyl group, but embodiments are not limited thereto.

In Formulae 11 to 15, b1 to b5 may each independently be an integer selected from 0 to 4. For example, b1 to b5 in Formulae 11 to 15 may be 0, 1 or 2, and for example, may be 0 or 1, but embodiments are not limited thereto.

In an embodiment, $Ar_1$ in Formula 1 may be selected from groups represented by Formulae 11-1 to 11-3 and 12-1 to 12-14, and $Ar_2$ in Formula 1 may be selected from groups represented by Formulae 13-1 to 13-3 and 14-1 to 14-14:

Formula 11-1

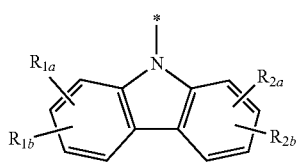

Formula 11-2

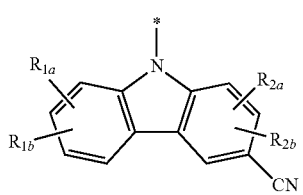

Formula 11-3

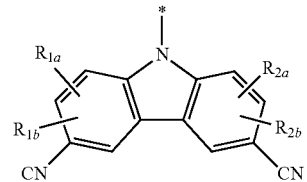

Formula 12-1

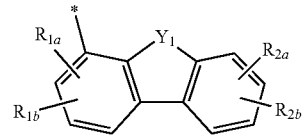

Formula 12-2

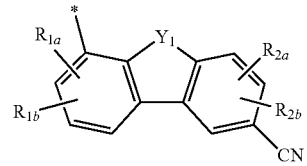

Formula 12-3

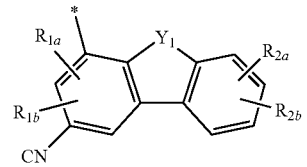

Formula 12-4

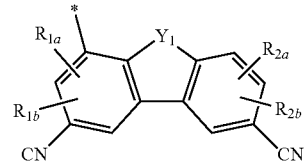

Formula 12-5

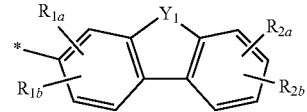

Formula 12-6

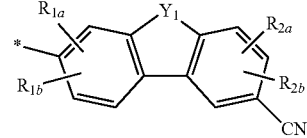

Formula 12-7

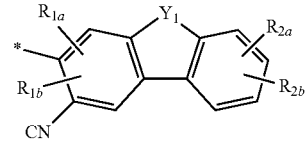

Formula 12-8

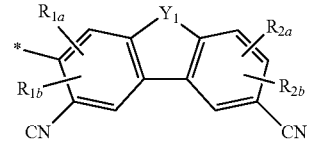

-continued
Formula 12-9
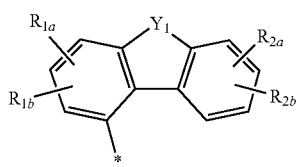
Formula 12-10
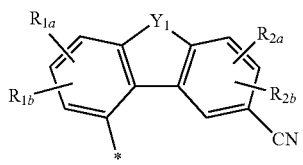
Formula 12-11
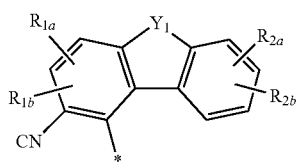
Formula 12-12
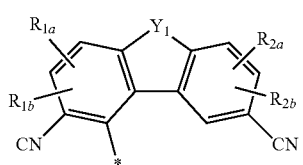
Formula 12-13
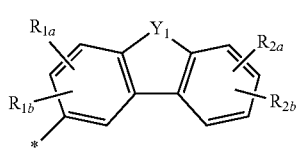
Formula 12-14
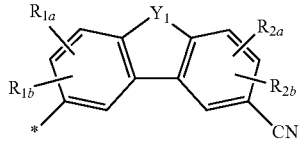
Formula 13-1
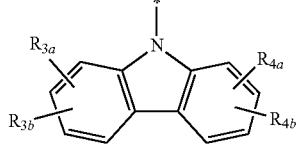
Formula 13-2
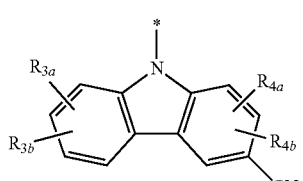
Formula 13-3
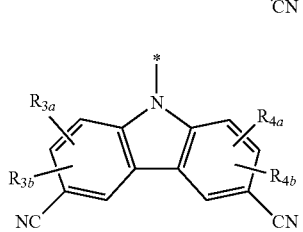
-continued
Formula 14-1
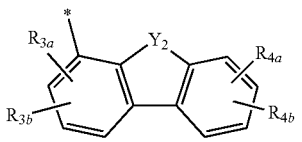
Formula 14-2
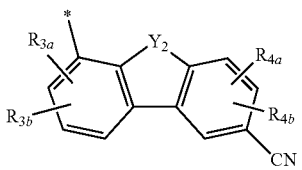
Formula 14-3
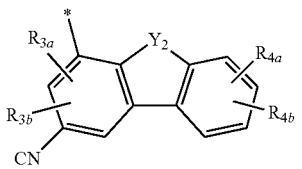
Formula 14-4
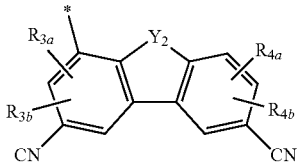
Formula 14-5
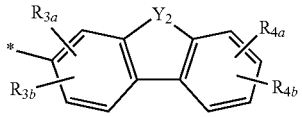
Formula 14-6
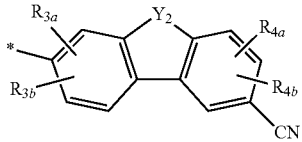
Formula 14-7
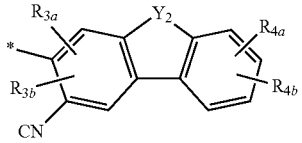
Formula 14-8
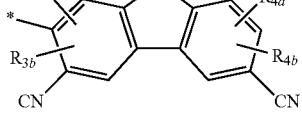
Formula 14-9
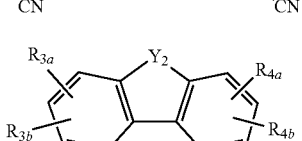
Formula 14-10
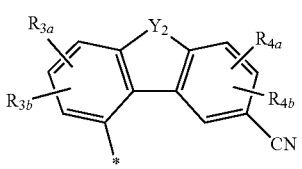

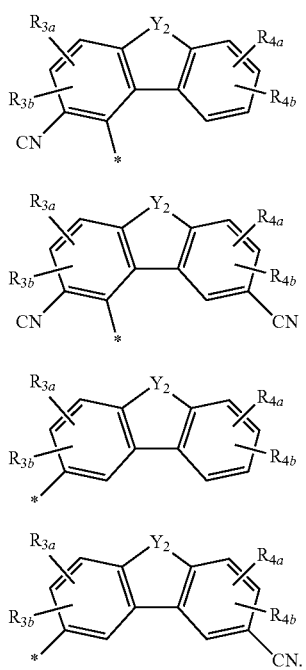

Formula 14-11

Formula 14-12

Formula 14-13

Formula 14-14

In Formulae 11-1 to 11-3, 12-1 to 12-14, 13-1 to 13-3, and 14-1 to 14-14, descriptions for $Y_1$ and $Y_2$ may each independently refer to the descriptions thereof in the present disclosure, descriptions of $R_{1a}$, $R_{1b}$, $R_{2a}$, $R_{2b}$, $R_{3a}$, $R_{3b}$, $R_{4a}$, and $R_{4b}$ may each independently refer to the description of $R_1$ in the present disclosure, and * indicates a binding site to a neighboring atom.

For example, in Formulae 11-1 to 11-3, 12-1 to 12-14, 13-1 to 13-3, and 14-1 to 14-14, $R_{1a}$, $R_{1b}$, $R_{2a}$, $R_{2b}$, $R_{3a}$, $R_{3b}$, $R_{4a}$, and $R_{4b}$ may each independently be selected from:

hydrogen, deuterium, a cyano group, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group;

a $C_1$-$C_{10}$ alkyl group and a $C_1$-$C_{10}$ alkoxy group, each substituted with at least one selected from deuterium and a cyano group; and a phenyl group, a biphenyl group, a terphenyl group, a fluorenyl group, a pyridinyl group, a carbazolyl group, a dibenzofuranyl group, and a dibenzothiophenyl group, each substituted with at least one selected from deuterium, a cyano group, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group.

In various embodiments, $L_1$ in Formula 1 may be selected from groups represented by Formulae 15(1) to 15(16):

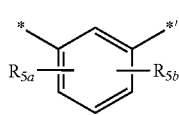

Formula 15(1)

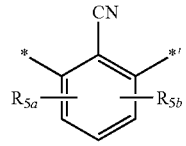

Formula 15(2)

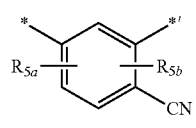

Formula 15(3)

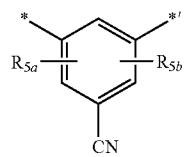

Formula 15(4)

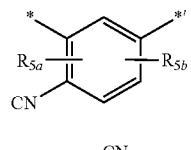

Formula 15(5)

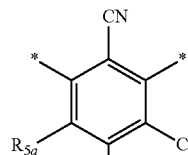

Formula 15(6)

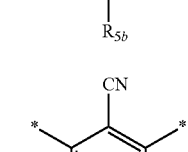

Formula 15(7)

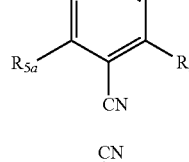

Formula 15(8)

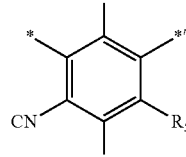

Formula 15(9)

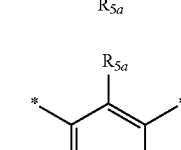

Formula 15(10)

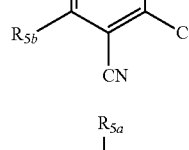

-continued

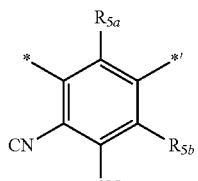
Formula 15(11)

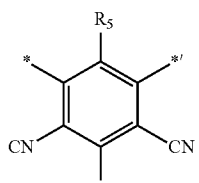
Formula 15(12)

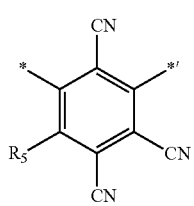
Formula 15(13)

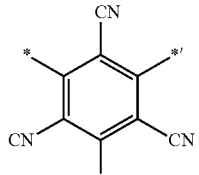
Formula 15(14)

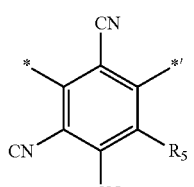
Formula 15(15)

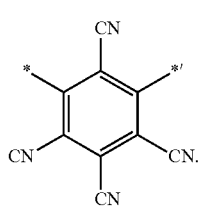
Formula 15(16)

In Formulae 15(1) to 15(16), a description for $R_5$ may refer to the description thereof in the present disclosure, descriptions of $R_{5a}$ and $R_{5b}$ may each independently refer to the description of $R_5$ in the present disclosure, and * and *' each indicate a binding site to a neighboring atom.

For example, in Formulae 15(1) to 15(16), $R_5$, $R_{5a}$, and $R_{5b}$ may each independently be selected from:

hydrogen, deuterium, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group;

a $C_1$-$C_{10}$ alkyl group and a $C_1$-$C_{10}$ alkoxy group, each substituted with at least one selected from deuterium and a cyano group; and a phenyl group, a biphenyl group, a terphenyl group, a fluorenyl group, a pyridinyl group, a carbazolyl group, a dibenzofuranyl group, and a dibenzothiophenyl group, each substituted with at least one selected from deuterium, a cyano group, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group.

In Formula 1, the number of cyano groups included in a group represented by *-$(L_1)_{a1}$-*' in Formula 1 is denoted as "c5", and the sum of c1 to c5 in Formula 1 may be an integer selected from 1 to 5 (for example, 2, 3, or 4). In this regard, the first compound represented by Formula 1 may have excellent heat-resistance, and accordingly, may have suitable electric characteristics to be used as a material for an electron device, such as an organic light-emitting device. * and *' in the group represented by *-$(L_1)_{a1}$-*' may each independently indicate a binding site to a neighboring atom.

In an embodiment, the total number of the cyano group included in the first compound represented by Formula 1 may be 1, 2, 3, 4, or 5, and for example, may be 2, 3, or 4, but embodiments are not limited thereto.

For example, the first compound represented by Formula 1 may be represented by one of Formulae 1-1 to 1-5:

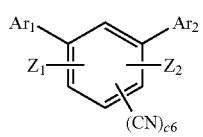
Formula 1-1

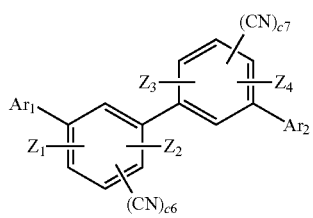
Formula 1-2

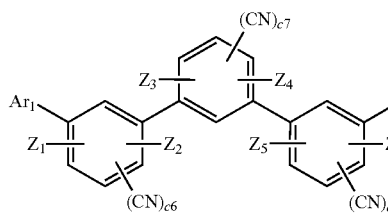
Formula 1-3

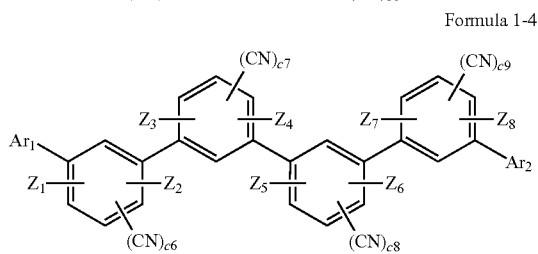
Formula 1-4

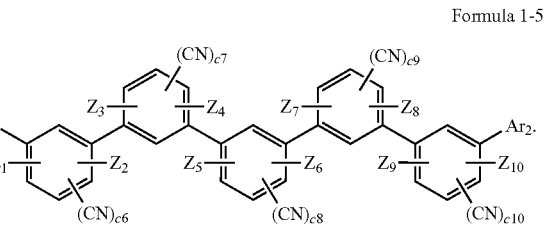
Formula 1-5

In Formulae 1-1 to 1-5, descriptions for $Ar_1$ and $Ar_2$ may each independently refer to the descriptions thereof in the present disclosure, descriptions of $Z_1$ to $Z_{10}$ may each independently refer to the description of $R_5$ in the present disclosure, and c6 to c10 may each independently be 0, 1, or 2.

In various embodiments, i) the sum of c1, c2, c3, c4, and c6 in Formula 1-1, ii) the sum of c1, c2, c3, c4, c6, and c7 in Formula 1-2, iii) the sum of c1, c2, c3, c4, c6, c7, and c8 in Formula 1-3, iv) the sum of c1, c2, c3, c4, c6, c7, c8, and c9 in Formula 1-4, and v) the sum of c1, c2, c3, c4, c6, c7, c8, c9, and c10 in Formula 1-5 may each independently be 1, 2, 3, 4, or 5, and for example, 2, 3, or 4.

In various embodiments, the sum of c1, c2, c3, and c4 in Formula 1-1 to 1-5 may be 1 or 2, and i) c6 in Formula 1-1, ii) the sum of c6 and c7 in Formula 1-2, iii) the sum of c6, c7, and c8 in Formula 1-3, iv) the sum of c6, c7, c8, and c9 in Formula 1-4, and v) the sum of c6, c7, c8, c9, and c10 in Formula 1-5 may each independently be 1 or 2, but embodiments are not limited thereto.

In various embodiments, the sum of c1, c2, c3, and c4 in Formulae 1-1 to 1-5 may be 1 or 2, i) c6 in Formula 1-1, ii) the sum of c6 and c7 in Formula 1-2, iii) the sum of c6, c7, and c8 in Formula 1-3, iv) the sum of c6, c7, c8, and c9 in Formula 1-4, and v) the sum of c6, c7, c8, c9, and c10 in Formula 1-5 may each independently be 1 or 2, and the total number of the cyano group included in the groups represented by Formulae 1-1 to 1-5 may be 2, 3, or 4, but embodiments are not limited thereto.

i) When $Ar_1$ in Formula 1 is the group represented by Formula 12, $Ar_2$ in Formula 1 is the group represented by Formula 14, and $Y_1$ in Formula 12 is $N(R_{21})$, $Y_2$ in Formula 14 may be O or S, and ii) when $Ar_1$ in Formula 1 is the group represented by Formula 12, $Ar_2$ in Formula 1 is the group represented by Formula 14, and $Y_2$ in Formula 14 is $N(R_{22})$, $Y_1$ in Formula 12 may be O or S.

In an embodiment, $Ar_{11}$ in Formula 2 may be a group represented by Formula 21 or 22, $Ar_{12}$ in Formula 2 may be selected from:

a group represented by Formula 23 or 24, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group not including a double bond between N and C, a $C_6$-$C_{60}$ aryl group, a biphenyl group, a terphenyl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group not including a double bond between N and C, a $C_1$-$C_{60}$ heteroaryloxy group not including a double bond between N and C, a $C_1$-$C_{60}$ heteroarylthio group not including a double bond between N and C, a $C_2$-$C_{60}$ heteroarylalkyl group not including a double bond between N and C, a monovalent non-aromatic condensed polycyclic group, and a monovalent non-aromatic condensed heteropolycyclic group not including a double bond between N and C; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group not including a double bond between N and C, a $C_6$-$C_{60}$ aryl group, a biphenyl group, a terphenyl group, a $C_1$-$C_{60}$ heteroaryl group not including a double bond between N and C, a monovalent non-aromatic condensed polycyclic group, and a monovalent non-aromatic condensed heteropolycyclic group not including a double bond between N and C, each substituted with at least one selected from deuterium, a hydroxyl group, an amino group, an amidino group, a hydrazine group, a hydrazone group, a carboxylic acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group not including a double bond between N and C, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a biphenyl group, a terphenyl group, a $C_1$-$C_{60}$ heteroaryl group, a monovalent non-aromatic condensed polycyclic group not including a double bond between N and C, a monovalent non-aromatic condensed heteropolycyclic group not including a double bond between N and C, and $-Si(Q_{11})(Q_{12})(Q_{13})$:

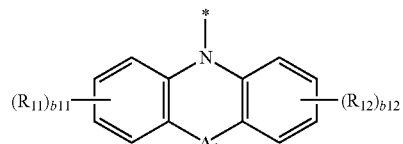

Formula 21

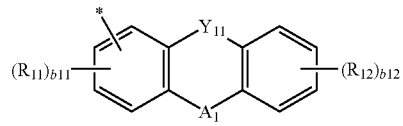

Formula 22

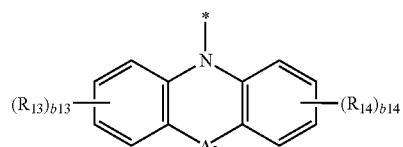

Formula 23

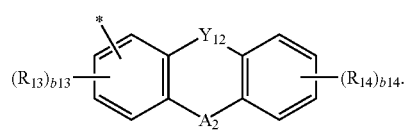

Formula 24

In Formulae 21 to 24, $A_1$ and $A_2$ may each independently be selected from:

a single bond, a $C_1$-$C_4$ alkylene group, and a $C_2$-$C_4$ alkenylene group; and a $C_1$-$C_4$ alkylene group and a $C_2$-$C_4$ alkenylene group, each substituted with at least one selected from deuterium, a $C_1$-$C_{10}$ alkyl group, a $C_1$-$C_{10}$ alkoxy group, a phenyl group, a biphenyl group, a terphenyl group, a naphthyl group, a fluorenyl group, a carbazolyl group, a dibenzofuranyl group, a dibenzothiophenyl group, and $-Si(Q_{21})(Q_{22})(Q_{23})$.

For example, in Formulae 21 to 24, $A_1$ and $A_2$ may each independently be selected from:

a single bond, a methylene group, and an ethenylene group; and a methylene group and an ethenylene group, each substituted with at least one selected from deuterium, a $C_1$-$C_{10}$ alkyl group, a $C_1$-$C_{10}$ alkoxy group, a phenyl group, a biphenyl group, a terphenyl group, a naphthyl group, a fluorenyl group, a carbazolyl group, a dibenzofuranyl group, and a dibenzothiophenyl group, but embodiments are not limited thereto.

In an embodiment, $Y_{11}$ in Formula 22 may be O, S, or $N(R_{41})$, and $Y_{12}$ in Formula 24 may be O, S, or $N(R_{42})$.

In an embodiment, in Formulae 21 to 24, $R_{11}$ to $R_{14}$, $R_{41}$, and $R_{42}$ may each independently be selected from:

hydrogen, deuterium, a hydroxyl group, an amino group, an amidino group, a hydrazine group, a hydrazone group, a carboxylic acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, a hydroxyl group, an amino group, an amidino group, a hydrazine group, a hydrazone group, and a carboxylic acid group or a salt thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group not including a double bond between N and C, a $C_6$-$C_{60}$ aryl group, a biphenyl group, a terphenyl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group not including a double bond between N and C, a $C_1$-$C_{60}$ heteroaryloxy group not including a double bond between N and C, a $C_1$-$C_{60}$ heteroarylthio group not including a double bond between N and C, a $C_2$-$C_{60}$ heteroarylalkyl group not including a double bond between N and C, a monovalent non-aromatic condensed polycyclic group, and a monovalent non-aromatic condensed heteropolycyclic group not including a double bond between N and C;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group not including a double bond between N and C, a $C_6$-$C_{60}$ aryl group, a biphenyl group, a terphenyl group, a $C_1$-$C_{60}$ heteroaryl group not including a double bond between N and C, a monovalent non-aromatic condensed polycyclic group, and a monovalent non-aromatic condensed heteropolycyclic group not including a double bond between N and C, each substituted with at least one selected from deuterium, a hydroxyl group, an amino group, an amidino group, a hydrazine group, a hydrazone group, a carboxylic acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a biphenyl group, a terphenyl group, a $C_1$-$C_{60}$ heteroaryl group, a monovalent non-aromatic condensed polycyclic group, a monovalent non-aromatic condensed heteropolycyclic group not including a double bond between N and C, and —Si($Q_{41}$)($Q_{42}$)($Q_{43}$), and —Si($Q_{51}$)($Q_{52}$)($Q_{53}$).

For example, in Formulae 21 to 24, $R_{11}$ to $R_{14}$ may each independently be selected from:

hydrogen, deuterium, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group;

a $C_1$-$C_{10}$ alkyl group and a $C_1$-$C_{10}$ alkoxy group, each substituted with at least one deuterium; and a phenyl group, a biphenyl group, a terphenyl group, a fluorenyl group, a pyridinyl group, a carbazolyl group, a dibenzofuranyl group, and a dibenzothiophenyl group, each substituted with at least one selected from deuterium, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group, and $R_{41}$ to $R_{42}$ may each independently be selected from:

a phenyl group, a biphenyl group, a terphenyl group, a fluorenyl group, a pyridinyl group, a carbazolyl group, a dibenzofuranyl group, and a dibenzothiophenyl group; and a phenyl group, a biphenyl group, a terphenyl group, a fluorenyl group, a pyridinyl group, a carbazolyl group, a dibenzofuranyl group, and a dibenzothiophenyl group, each substituted with at least one selected from deuterium, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group, but embodiments are not limited thereto.

In Formulae 21 to 24, b11 to b14 may each independently be an integer selected from 0 to 4, wherein when b11 is two or more, two or more groups $R_{11}$ may be identical to or different from each other, when b12 is two or more, two or more groups $R_{12}$ may be identical to or different from each other, when b13 is two or more, two or more groups $R_{13}$ may be identical to or different from each other, and when b14 is two or more, two or more groups $R_{14}$ may be identical to or different from each other.

In an embodiment, b11 to b14 in Formulae 21 to 24 may each independently be 0, 1, or 2.

In Formula 2, $L_{11}$ may be selected from:

a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group not including a double bond between N and C, a $C_6$-$C_{60}$ arylene group, a $C_1$-$C_{60}$ heteroarylene group not including a double bond between N and C, a divalent non-aromatic condensed polycyclic group, and a divalent non-aromatic condensed heteropolycyclic group not including a double bond between N and C; and a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group not including a double bond between N and C, a $C_6$-$C_{60}$ arylene group, a $C_1$-$C_{60}$ heteroarylene group not including a double bond between N and C, a divalent non-aromatic condensed polycyclic group, and a divalent non-aromatic condensed heteropolycyclic group not including a double bond between N and C, each substituted with at least one selected from deuterium, a hydroxyl group, an amino group, an amidino group, a hydrazine group, a hydrazone group, a carboxylic acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a biphenyl group, a terphenyl group, a $C_1$-$C_{60}$ heteroaryl group, a monovalent non-aromatic condensed polycyclic group, a monovalent non-aromatic condensed heteropolycyclic group not including a double bond between N and C, and —Si($Q_{31}$)($Q_{32}$)($Q_{33}$).

For example, in Formula 2, $L_{11}$ may be selected from:

a phenylene group, a fluorenylene group, a carbazolylene group, a dibenzofuranylene group, and a dibenzothiophenylene group; and a phenylene group, a fluorenylene group, a carbazolylene group, a dibenzofuranylene group, and a dibenzothiophenylene group, each substituted with at least one selected from deuterium, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group, but embodiments are not limited thereto.

In Formula 2, a11 may be an integer selected from 0 to 5, wherein when a11 is two or more, two or more groups $L_{11}$ may be identical to or different from each other. When a11 in Formula 2 is 0, the group represented by *-($L_{11}$)$_{a11}$-*' in Formula 2 may be a single bond. In Formula 2, a11 may be 0, 1, or 2. * and *' in the group represented by *-(L$_{11}$)$_{a11}$-*' each independently indicate a binding site to a neighboring atom.

In an embodiment, Ar$_{11}$ in Formula 2 may be selected from groups represented by Formulae 21-1 to 21-3 and 22-1 to 22-12, Ar$_{12}$ in Formula 2 may be selected from:

groups represented by Formulae 23-1 to 23-3 and 24-1 to 24-12;

a phenyl group, a biphenyl group, a terphenyl group, a fluorenyl group, and a pyridinyl group; and a phenyl group, a biphenyl group, a terphenyl group, a fluorenyl group, and a pyridinyl group, each substituted with at least one selected from deuterium, a C$_1$-C$_{10}$ alkyl group, a C$_1$-C$_{10}$ alkoxy group, a phenyl group, a biphenyl group, a terphenyl group, a fluorenyl group, a pyridinyl group, a carbazolyl group, a dibenzofuranyl group, and a dibenzothiophenyl group:

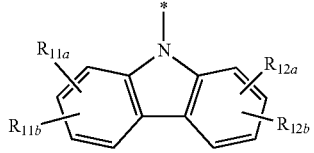

Formula 21-1

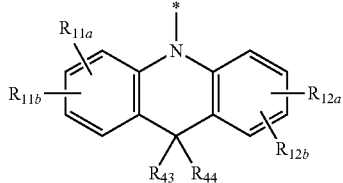

Formula 21-2

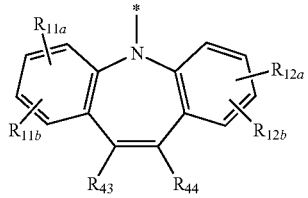

Formula 21-3

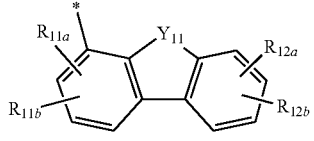

Formula 22-1

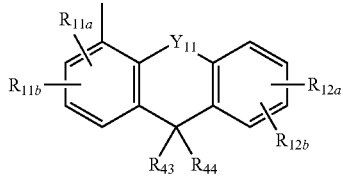

Formula 22-2

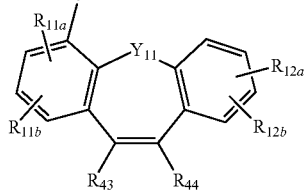

Formula 22-3

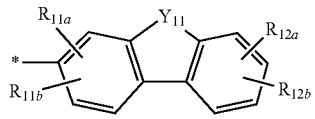

Formula 22-4

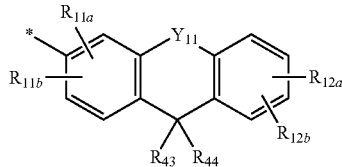

Formula 22-5

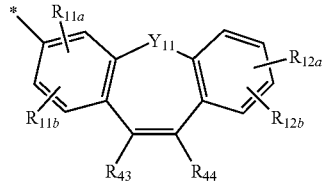

Formula 22-6

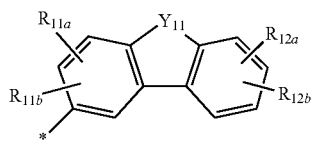

Formula 22-7

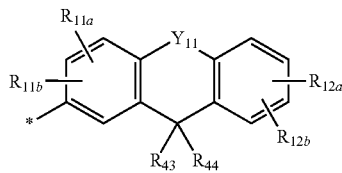

Formula 22-8

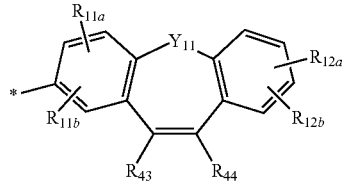

Formula 22-9

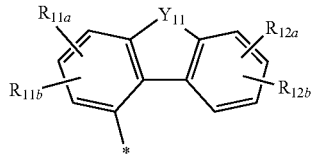

Formula 22-10

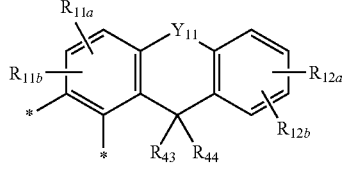

Formula 22-11

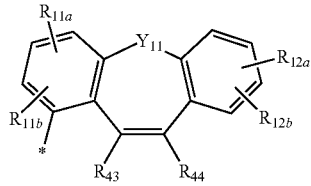

Formula 22-12

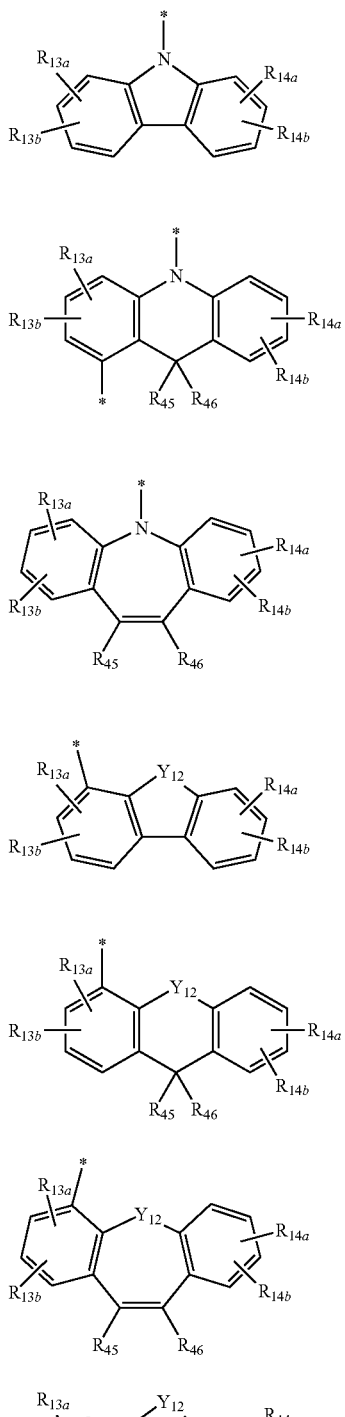
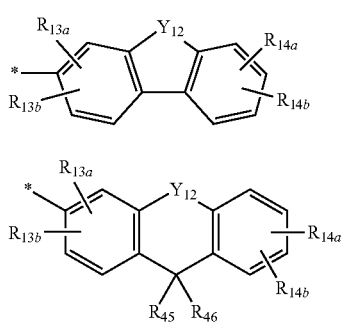
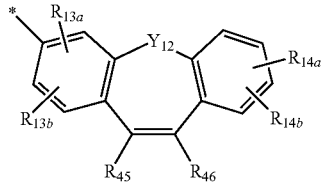
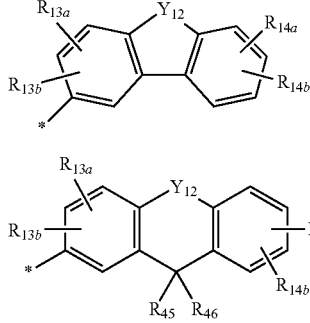
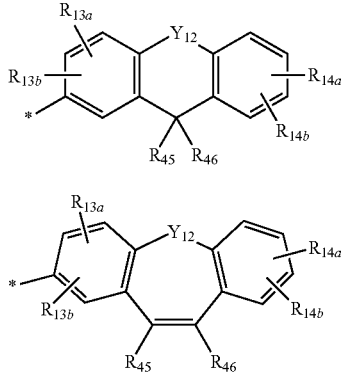
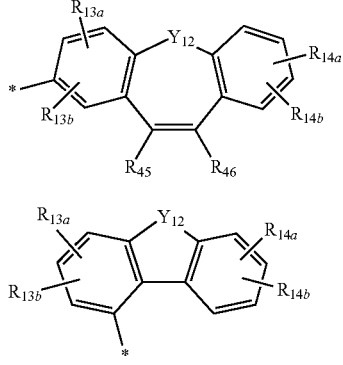
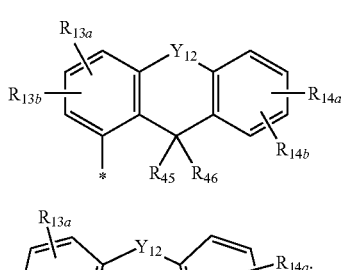
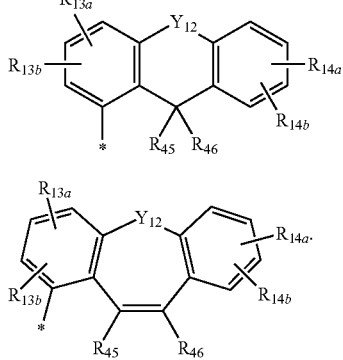

In Formulae 21-1 to 21-3, 22-1 to 22-12, 23-1 to 23-3, and 24-1 to 24-12, descriptions for $Y_{11}$ and $Y_{12}$ may each independently refer to the descriptions thereof in the present disclosure, descriptions of $R_{11a}$, $R_{11b}$, $R_{12a}$, $R_{12b}$, $R_{13a}$, $R_{13b}$, $R_{14a}$, and $R_{14b}$ may each independently refer to the description of $R_{11}$ in the present disclosure, $R_{43}$ to $R_{46}$ may each independently be selected from hydrogen, deuterium, a $C_1$-$C_{10}$ alkyl group, a $C_1$-$C_{10}$ alkoxy group, a phenyl group, a biphenyl group, a terphenyl group, a naphthyl group, a fluorenyl group, a carbazolyl group, a dibenzofuranyl group, and a dibenzothiophenyl group, and * indicates a binding site to a neighboring atom.

In Formulae 21-1 to 21-3, 22-1 to 22-12, 23-1 to 23-3, and 24-1 to 24-12, $R_{43}$ and $R_{44}$ may optionally linked to each other through a single bond; a $C_1$-$C_4$ alkylene group; or a $C_1$-$C_4$ alkylene group substituted with at least one selected from a $C_1$-$C_{10}$ alkyl group and a phenyl group, and $R_{45}$ and $R_{46}$ may optionally linked to each other through a single bond; a $C_1$-$C_4$ alkylene group; or a $C_1$-$C_4$ alkylene group substituted with at least one selected from a $C_1$-$C_{10}$ alkyl group and a phenyl group.

For example, in Formulae 21-1 to 21-3, 22-1 to 22-12, 23-1 to 23-3, and 24-1 to 24-12, $R_{11a}$, $R_{11b}$, $R_{12a}$, $R_{12b}$, $R_{13a}$, $R_{13b}$, $R_{14a}$, and $R_{14b}$ may each independently be selected from:

hydrogen, deuterium, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group;

a $C_1$-$C_{10}$ alkyl group and a $C_1$-$C_{10}$ alkoxy group, each substituted with at least one deuterium; and a phenyl group, a biphenyl group, a terphenyl group, a fluorenyl group, a pyridinyl group, a carbazolyl group, a dibenzofuranyl group, and a dibenzothiophenyl group, each substituted with at least one selected from deuterium, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group, but embodiments are not limited thereto.

In various embodiments, the second compound represented by Formula 2 may be represented by $Ar_{11}$-$Ar_{12}$, or may be represented by one of Formulae 2-1 to 2-95:

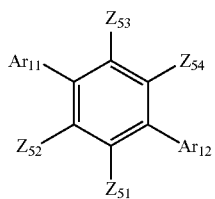

Formula 2-1

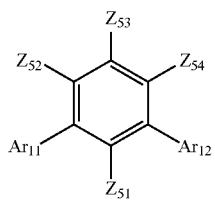

Formula 2-2

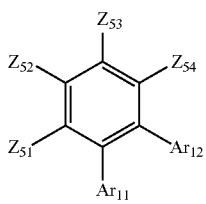

Formula 2-3

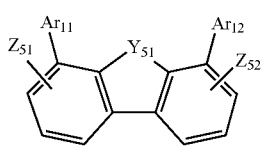

Formula 2-4

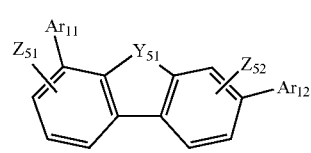

Formula 2-5

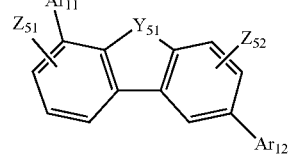

Formula 2-6

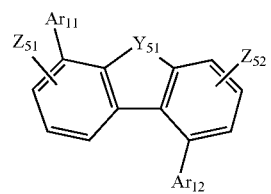

Formula 2-7

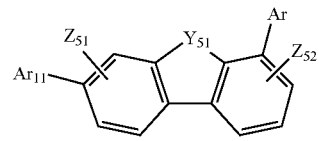

Formula 2-8

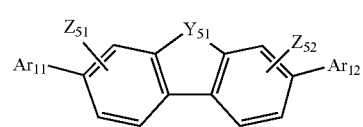

Formula 2-9

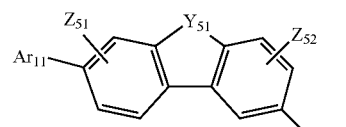

Formula 2-10

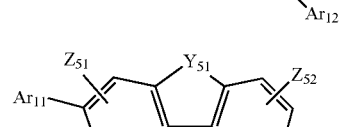

Formula 2-11

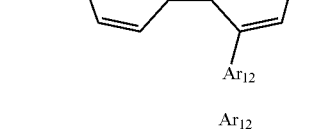

Formula 2-12

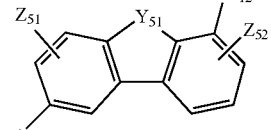

Formula 2-13

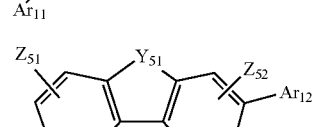

Formula 2-14

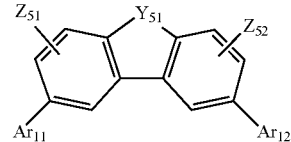

-continued
Formula 2-15
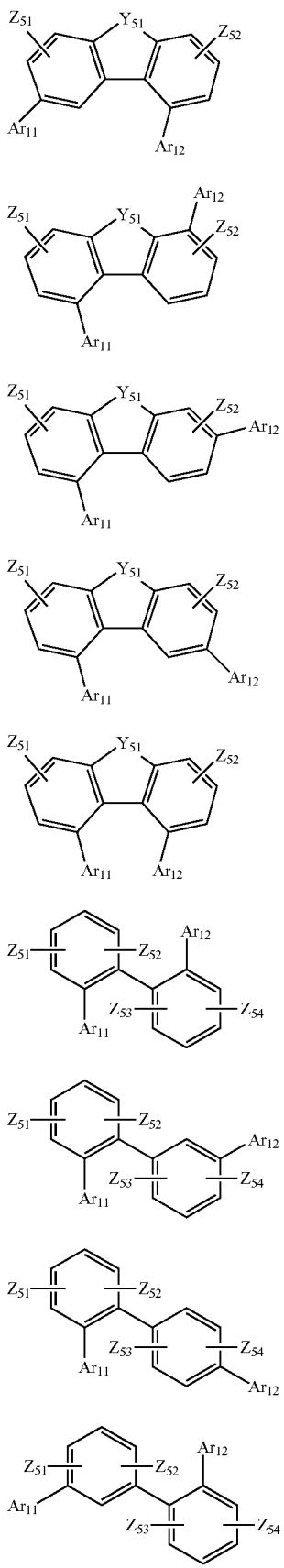
Formula 2-16
Formula 2-17
Formula 2-18
Formula 2-19
Formula 2-20
Formula 2-21
Formula 2-22
Formula 2-23
-continued
Formula 2-24
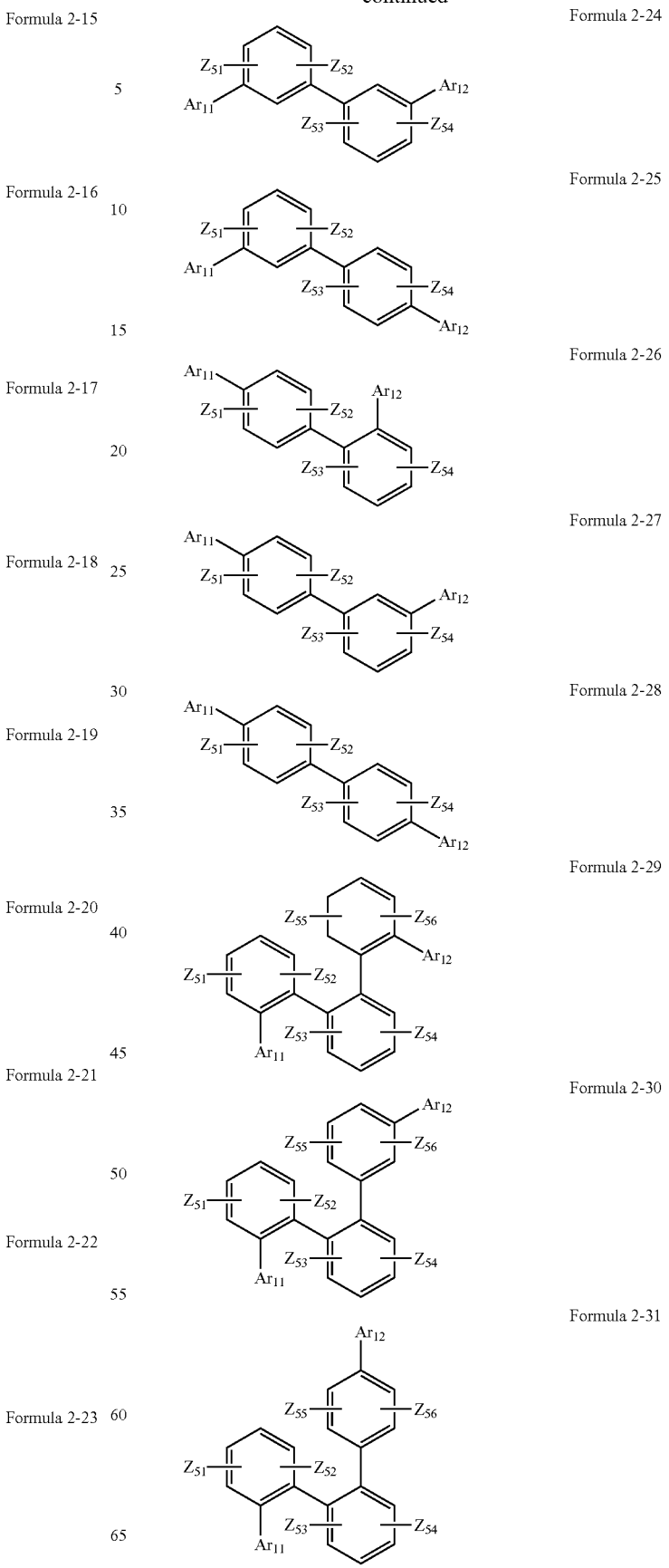
Formula 2-25
Formula 2-26
Formula 2-27
Formula 2-28
Formula 2-29
Formula 2-30
Formula 2-31

Formula 2-32
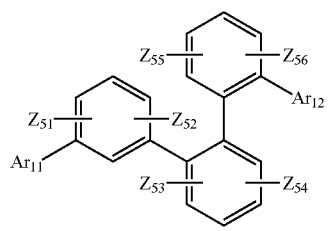
Formula 2-33
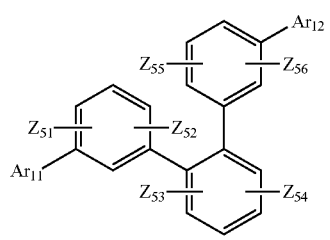
Formula 2-34
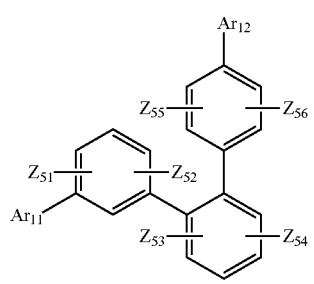
Formula 2-35
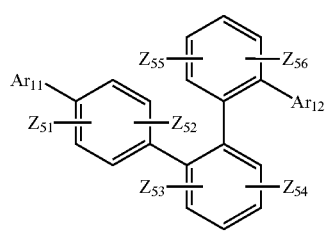
Formula 2-36
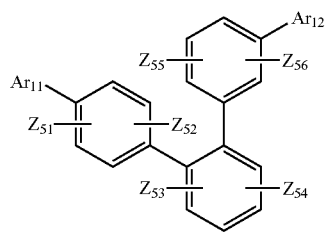
Formula 2-37
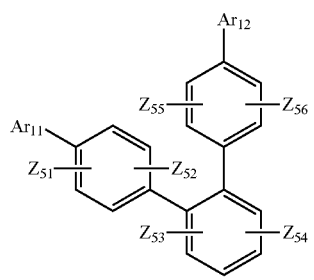
Formula 2-38
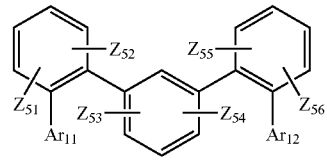
Formula 2-39
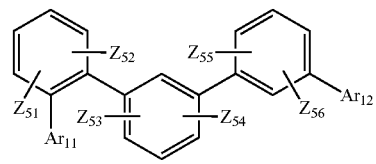
Formula 2-40
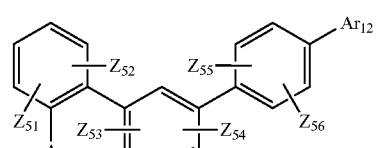
Formula 2-41
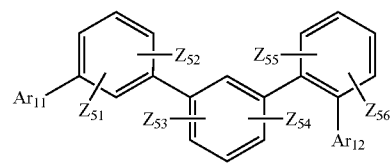
Formula 2-42
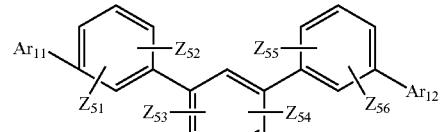
Formula 2-43
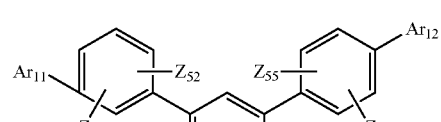
Formula 2-44
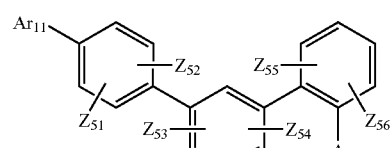
Formula 2-45
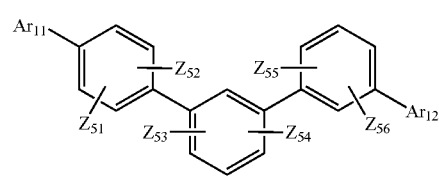

Formula 2-46
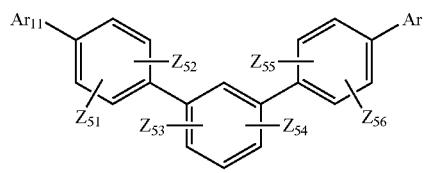
Formula 2-47
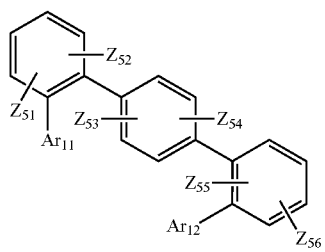
Formula 2-48
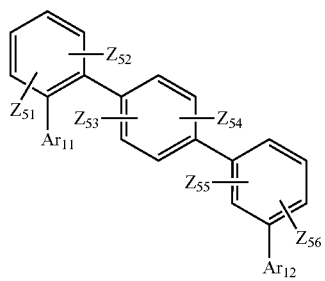
Formula 2-49
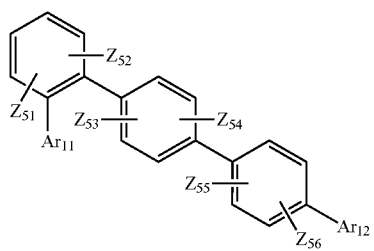
Formula 2-50
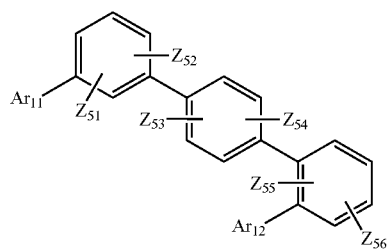
Formula 2-51
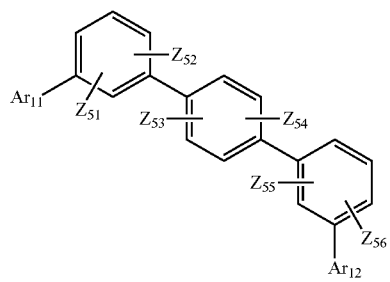
Formula 2-52
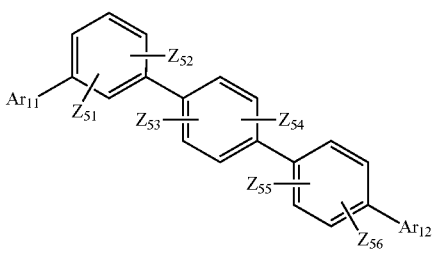
Formula 2-53
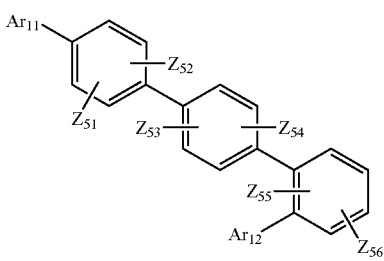
Formula 2-54
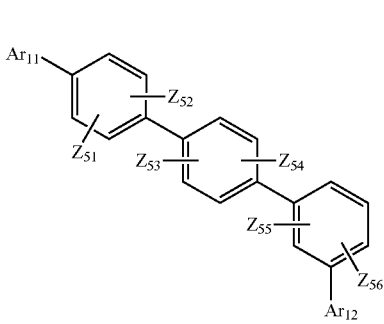
Formula 2-55
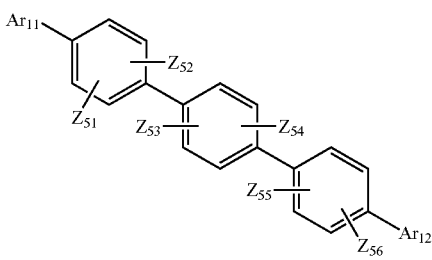
Formula 2-56
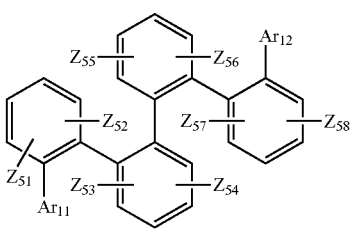
Formula 2-57
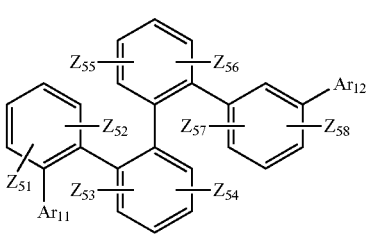

Formula 2-58
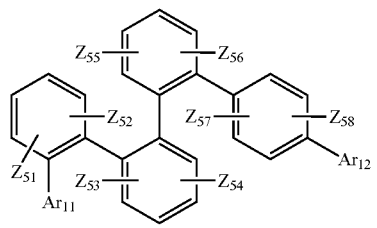
Formula 2-59
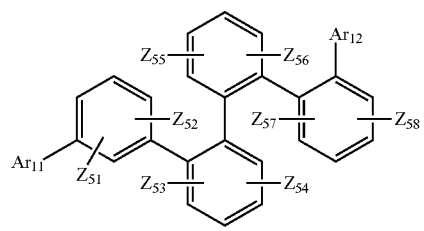
Formula 2-60
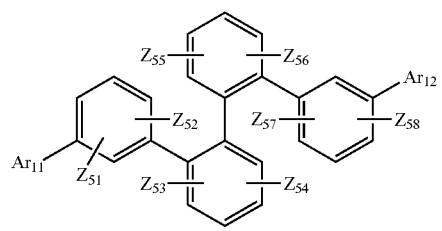
Formula 2-61
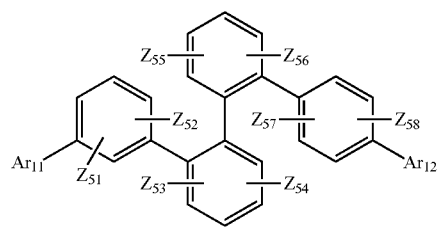
Formula 2-62
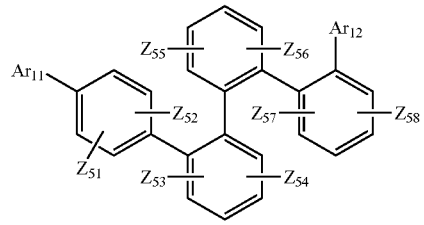
Formula 2-63
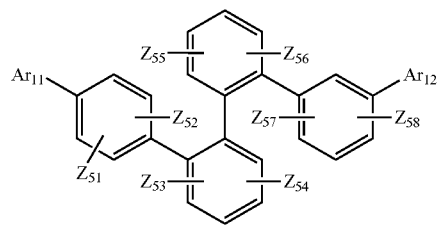
Formula 2-64
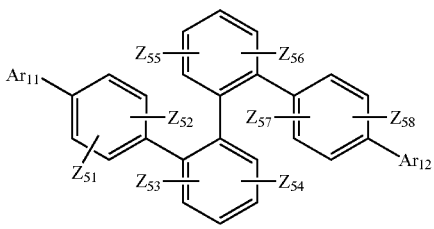
Formula 2-65
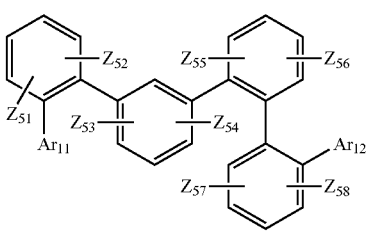
Formula 2-66
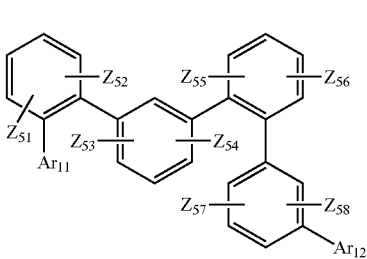
Formula 2-67
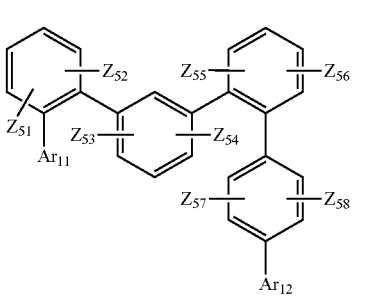
Formula 2-68
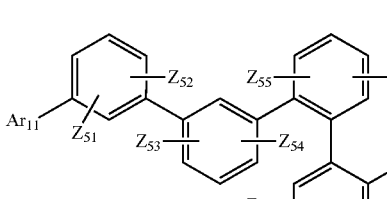
Formula 2-69
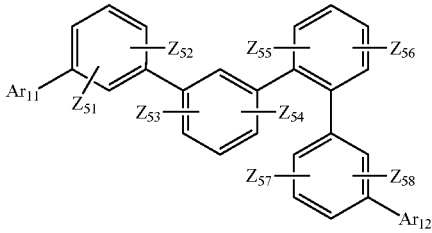

Formula 2-70
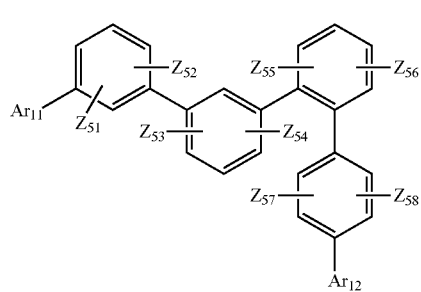
Formula 2-71
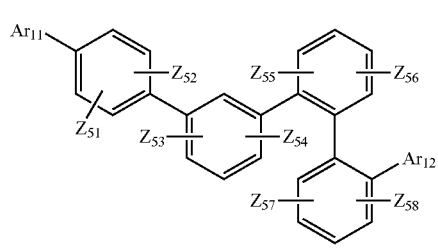
Formula 2-72
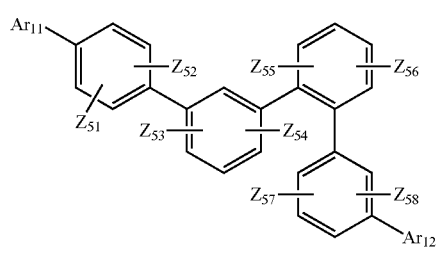
Formula 2-73
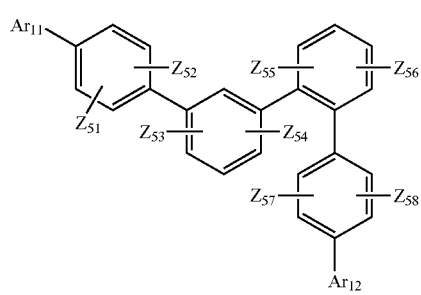
Formula 2-74
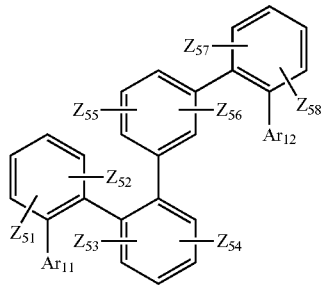
Formula 2-75
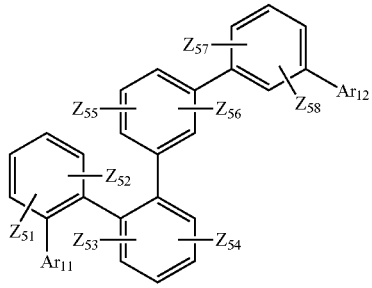
Formula 2-76
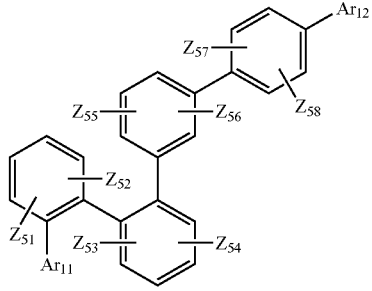
Formula 2-77
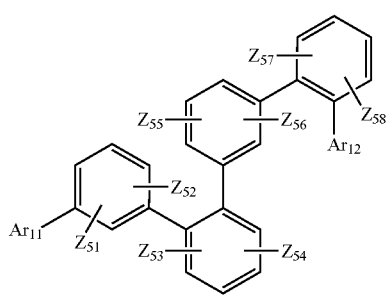
Formula 2-78
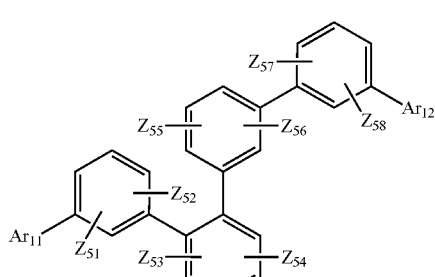
Formula 2-79
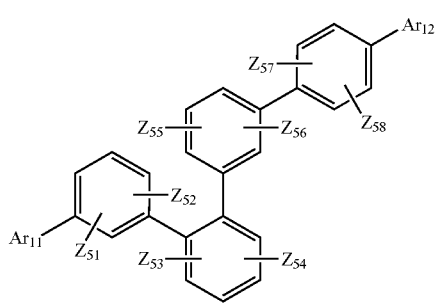

Formula 2-80
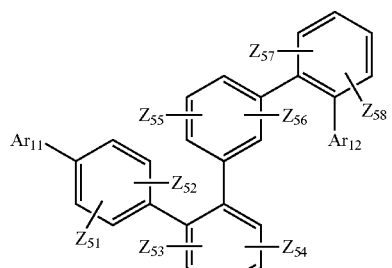
Formula 2-81
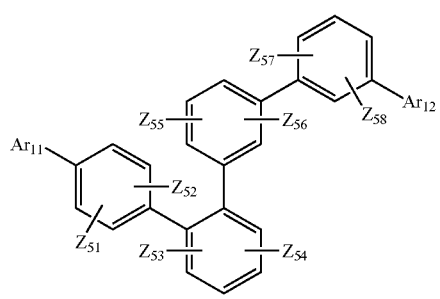
Formula 2-82
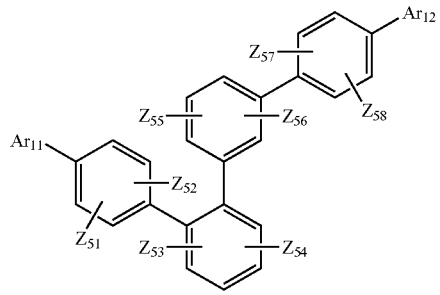
Formula 2-83
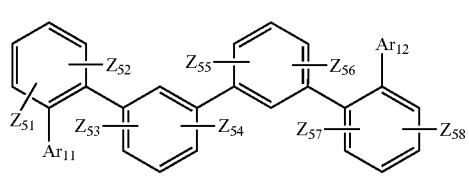
Formula 2-84
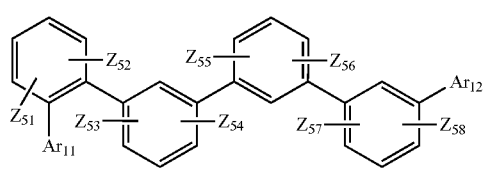
Formula 2-85
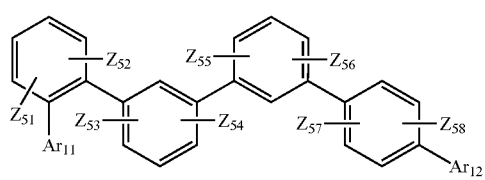
Formula 2-86
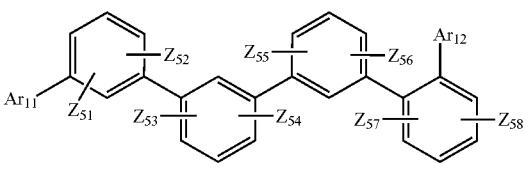
Formula 2-87
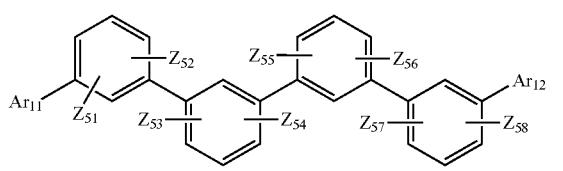
Formula 2-88
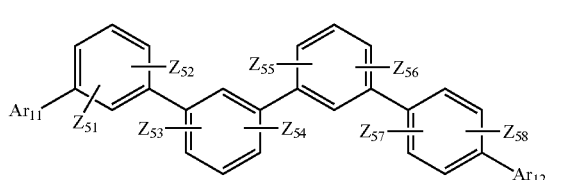
Formula 2-89
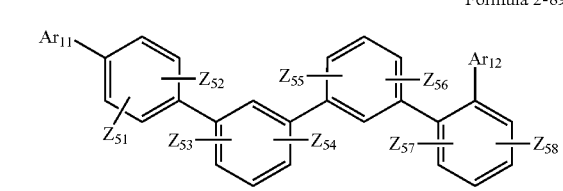
Formula 2-90
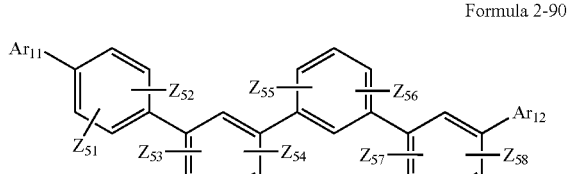
Formula 2-91
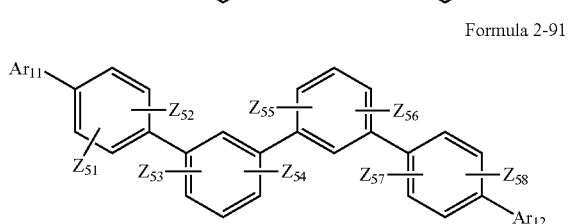
Formula 2-92
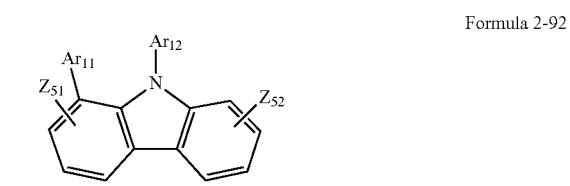
Formula 2-93
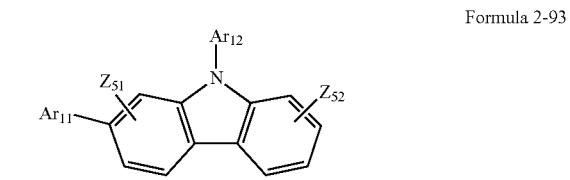

-continued

Formula 2-94

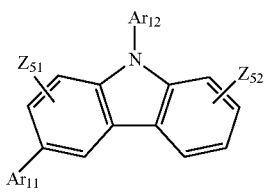

Formula 2-95

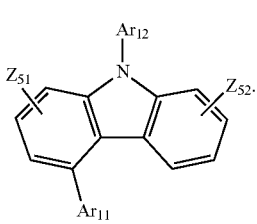

In Formulae 2-1 to 2-95,
descriptions of $Ar_{11}$ and $Ar_{12}$ may each independently refer to the descriptions thereof in the present disclosure,
$Y_{51}$ may be O, S, $C(Z_{61})(Z_{62})$, or $N(Z_{61})$, and
$Z_{51}$ to $Z_{58}$, $Z_{61}$, and $Z_{52}$ may each independently be selected from hydrogen, deuterium, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group.

In various embodiments, the second compound represented by Formula 2 may be represented by $Ar_{11}$-$Ar_{12}$, wherein $Ar_{11}$ may be a group represented by Formula 21 and $Ar_{12}$ may be a group represented by Formula 24, but embodiments are not limited thereto.

In various embodiments, the second compound represented by Formula 2 may be represented by $Ar_{11}$-$Ar_{12}$, wherein $Ar_{11}$ may be a group represented by Formula 21-1 and $Ar_{12}$ may be a group represented by Formula 24-1, 24-4, 24-7, or 24-10, but embodiments are not limited thereto.

In various embodiments, the second compound represented by Formula 2 may be represented by $Ar_{11}$-$Ar_{12}$, wherein $Ar_{11}$ may be a group represented by Formula 21-1 and $Ar_{12}$ may be a group represented by Formula 24-1, 24-4, 24-7, or 24-10, wherein in Formulae 24-1, 24-4, 24-7 and 24-10, $Y_{12}$ may be $N(R_{42})$ and $R_{42}$ may be a phenyl group, a biphenyl group, a terphenyl group, a fluorenyl group, a pyridinyl group, a carbazolyl group, dibenzofuranyl group, or a dibenzothiophenyl group, but embodiments are not limited thereto.

The first compound represented by Formula 1 and the second compound represented by Formula 2 may each have an actually measured triplet ($T_1$) energy value of 2.75 electron volts (eV) or greater. To measure the $T_1$ energy value of the compounds above, a mixture including 2-MeTHF and corresponding compounds (1 milligram (mg) of each of the corresponding compounds is dissolved in 3 cubic centimeters (cc) of 2-MeTHF) is added to a quartz cell, and liquid-nitrogen (at a temperature of 77 K) is added thereto. The photoluminescence spectrum of the compounds above is measured by using a photoluminescence measuring meter. The $T_1$ energy value is measured by calculating $T_1$ energy levels at a starting point on the short-wavelength side of the photoluminescence spectrum.

When the $T_1$ energy levels of the first compound represented by Formula 1 and the second compound represented by Formula 2 are within the range above, exciplexes formed by the first compound represented by Formula 1 and the second compound represented by Formula 2 may have a high $T_1$ energy level of at least 2.7 eV and a long emission dissipation time enough to fully deliver the energy to the dopant. Accordingly, the composition including the first compound represented by Formula 1 and the second compound represented by Formula 2 may contribute to the emission of blue light with high color purity.

In an embodiment, the first compound represented by Formula 1 may be one selected from Compounds E-1 to E-8, and the second compound represented by Formula 2 may be one selected from Compounds H-1 to H-42:

E-1

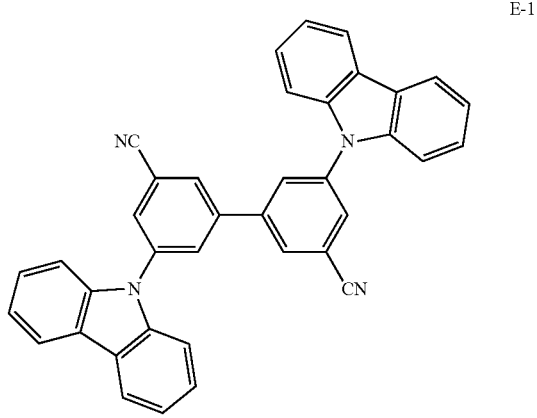

E-2

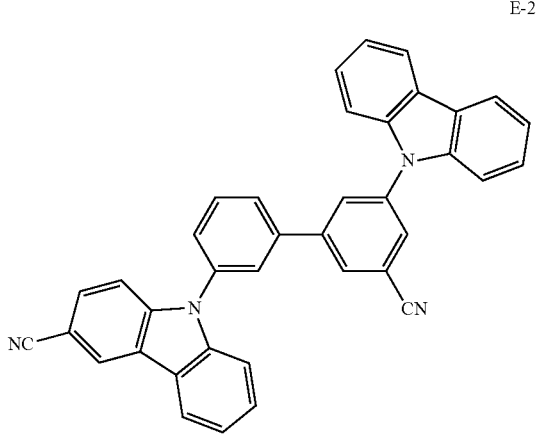

E-3

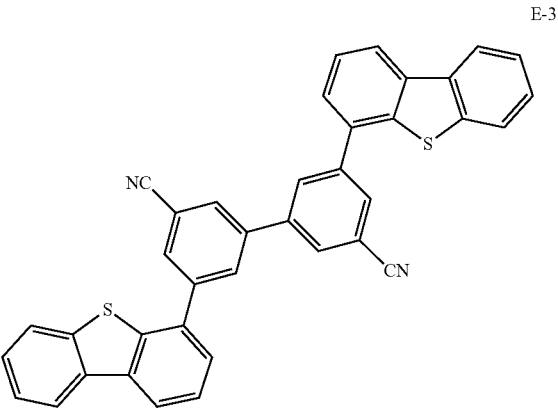

E-4
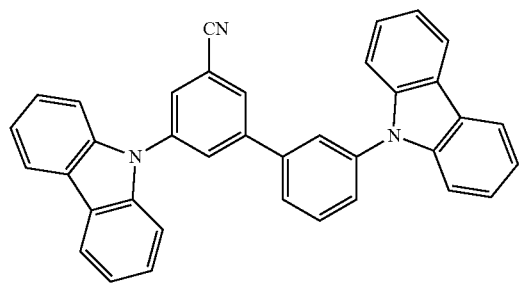
E-5
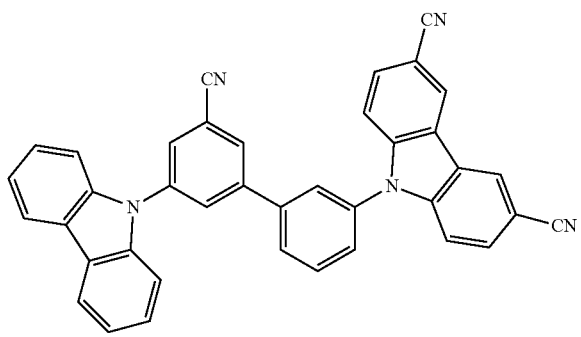
E-8
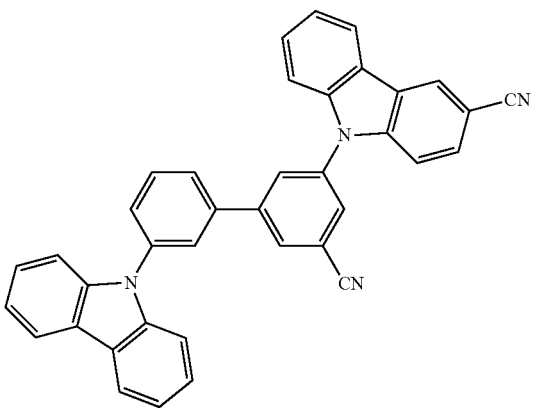
H-1
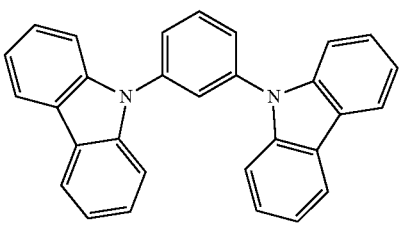
E-6
H-2
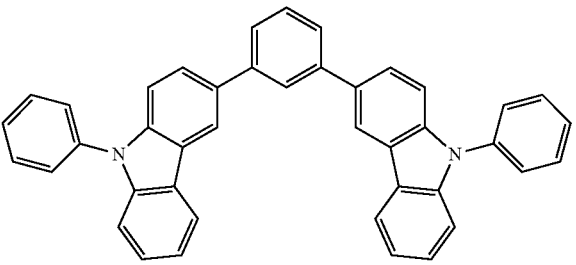
E-7
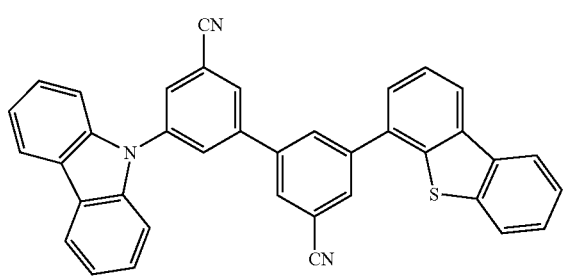
H-3
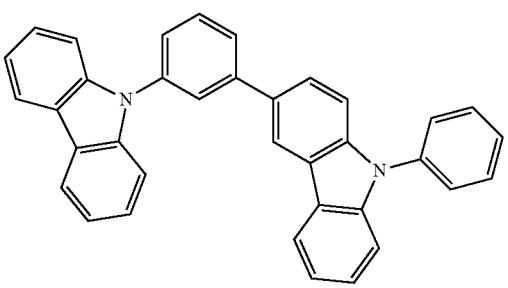
H-4
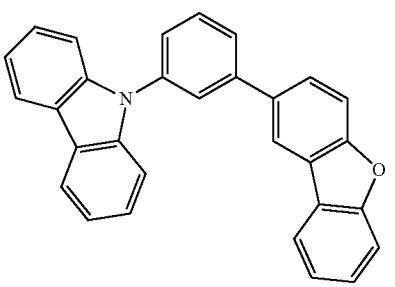

H-5
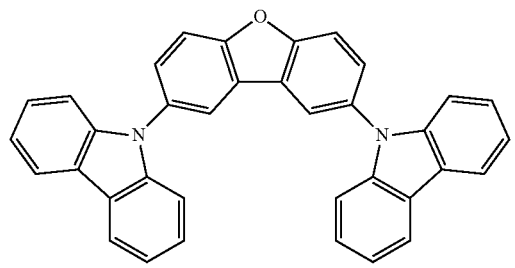
H-6
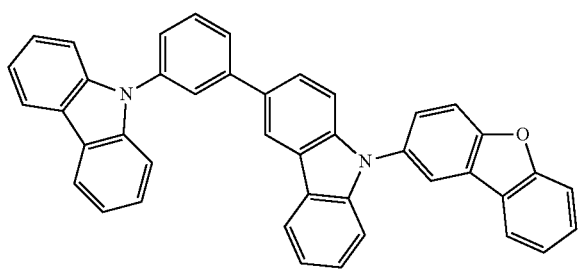
H-7
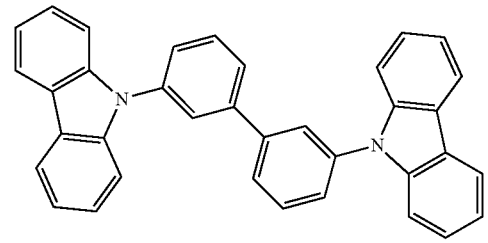
H-8
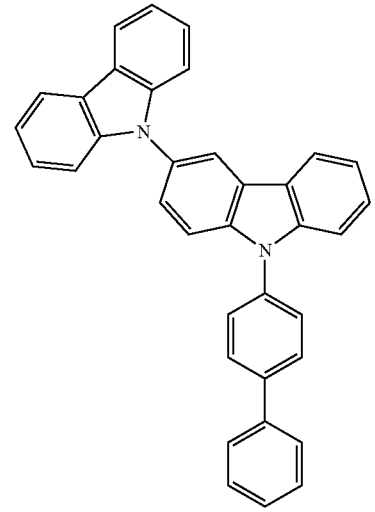
H-9
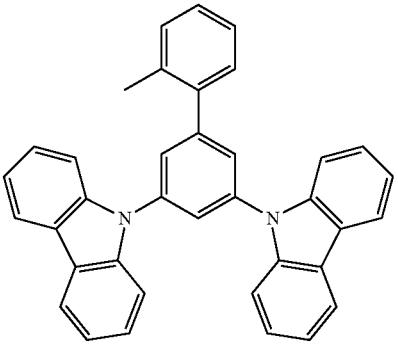
H-10
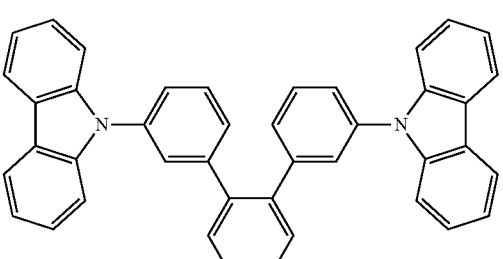
H-11
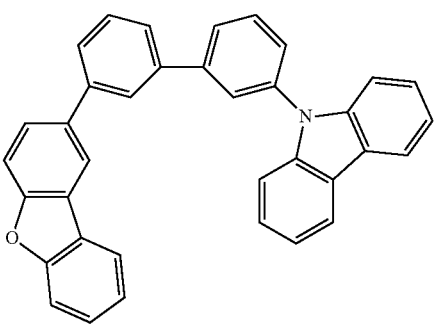
H-12
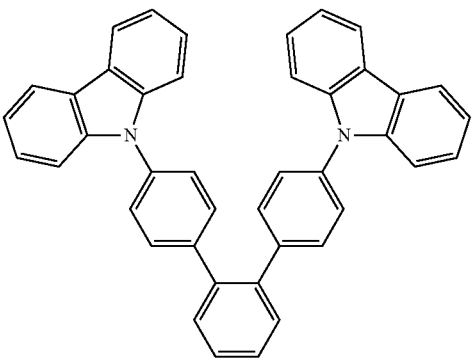
H-13
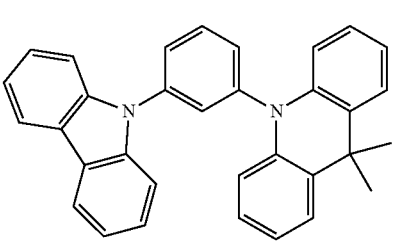

H-14
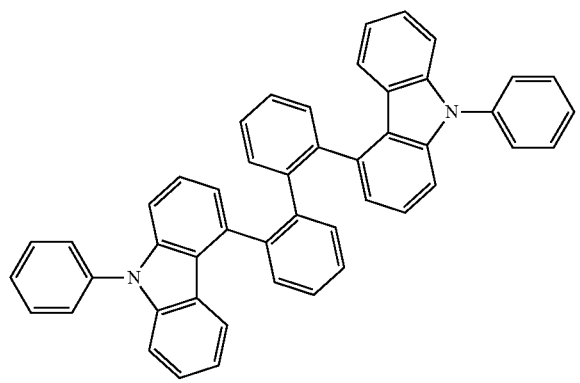
H-15
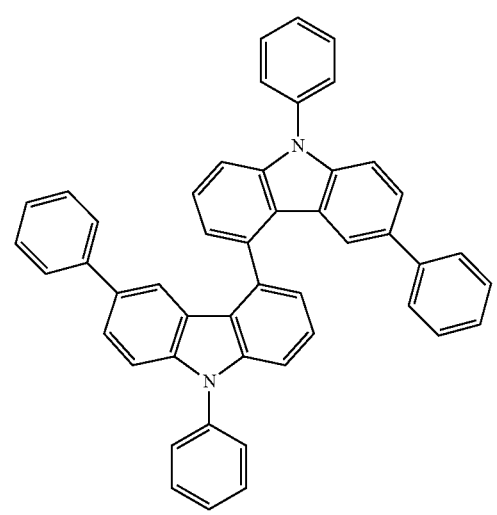
H-16
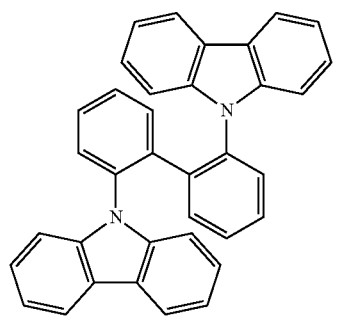
H-17
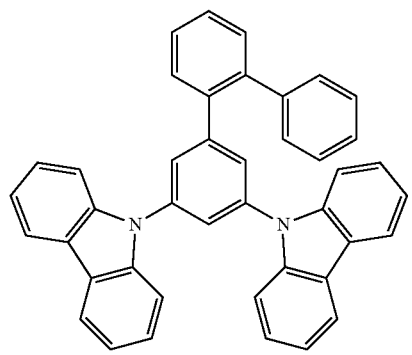
H-18
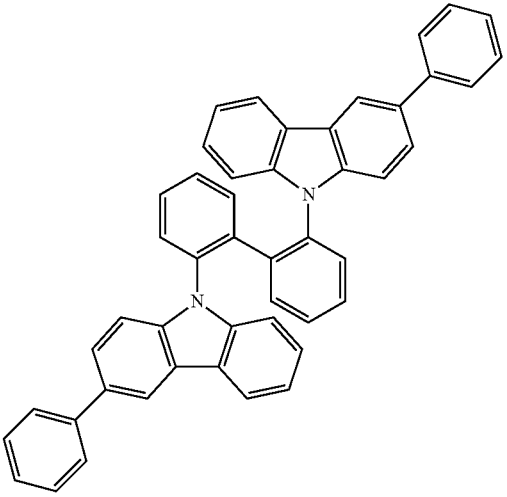
H-19
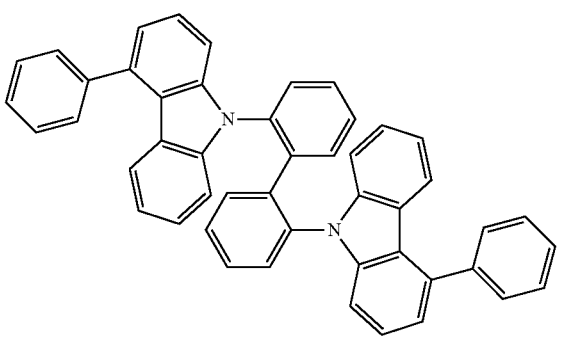
H-20
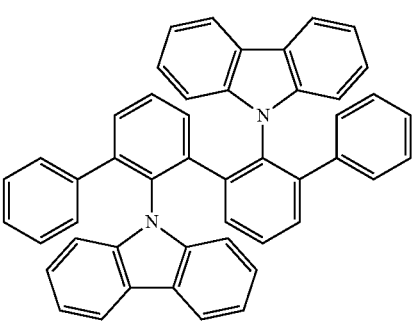
H-21
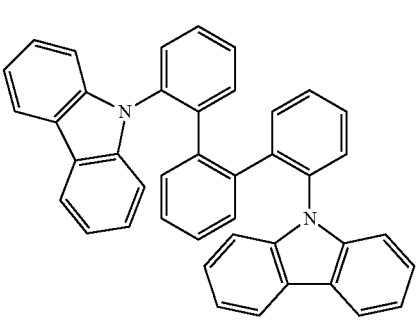

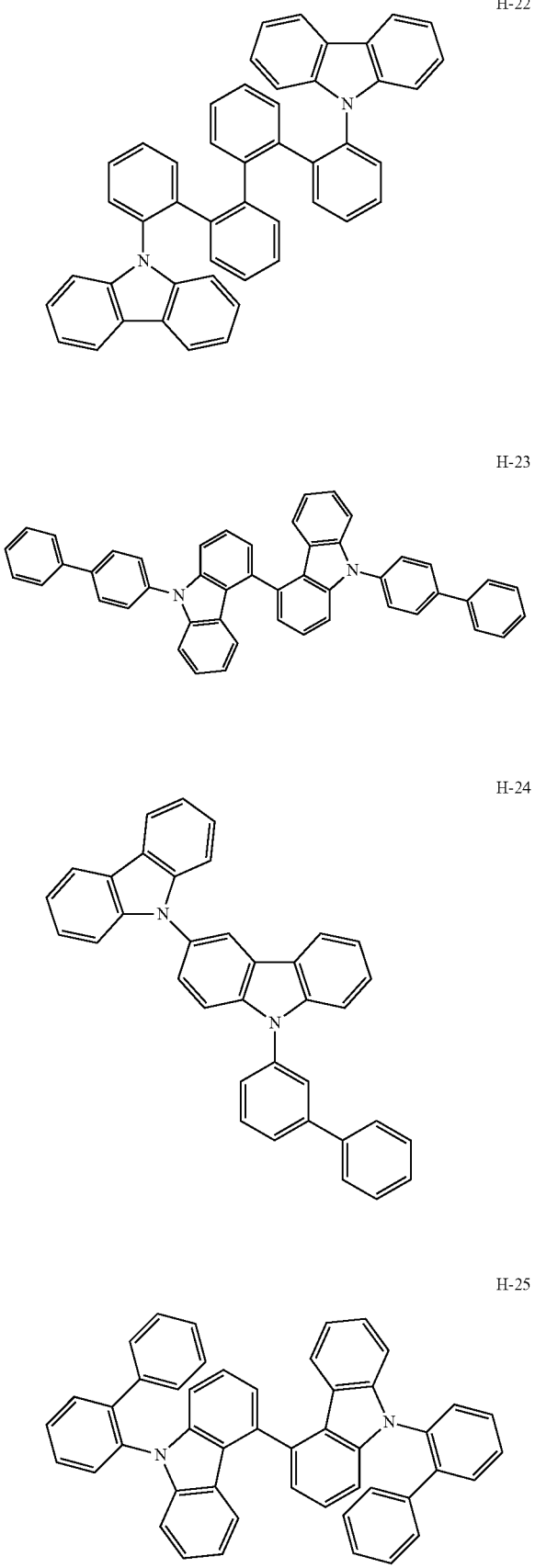
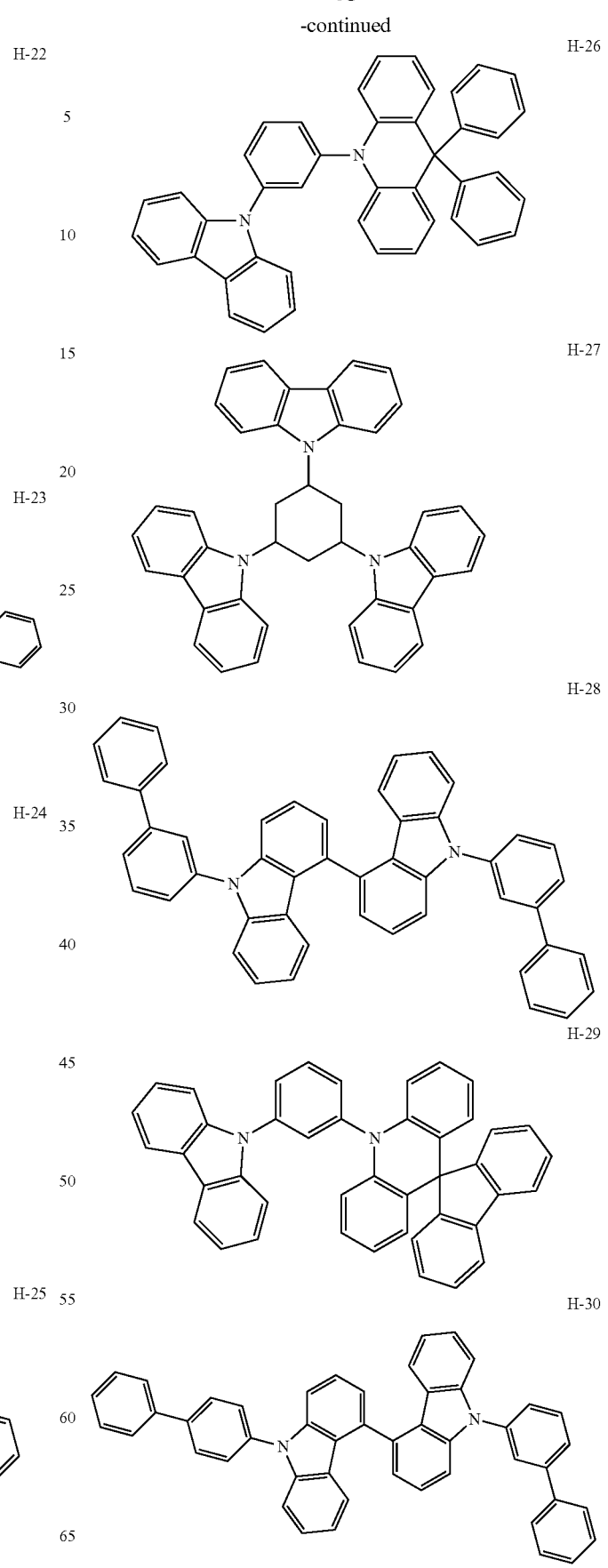

H-31
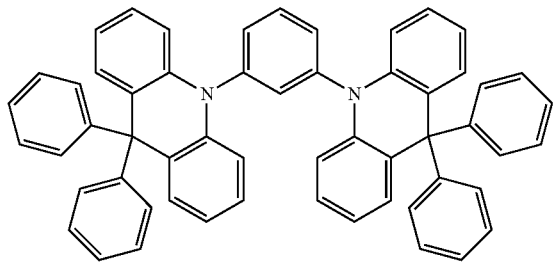
H-32
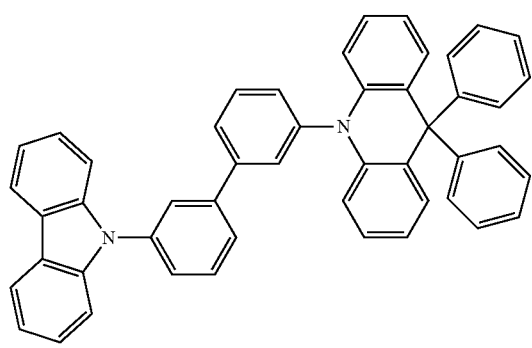
H-33
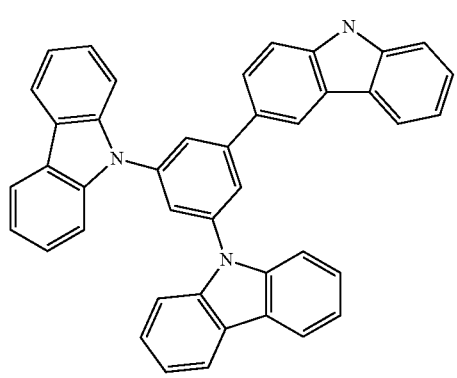
H-34
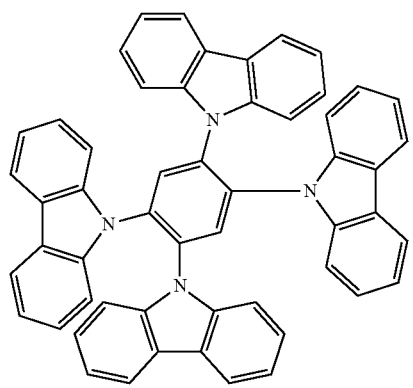
H-35
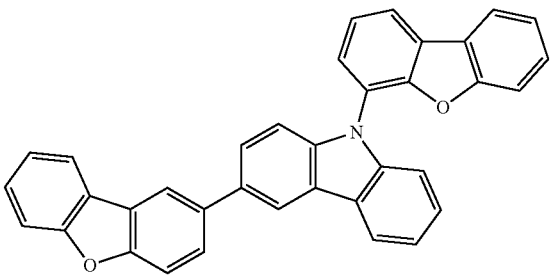
H-36
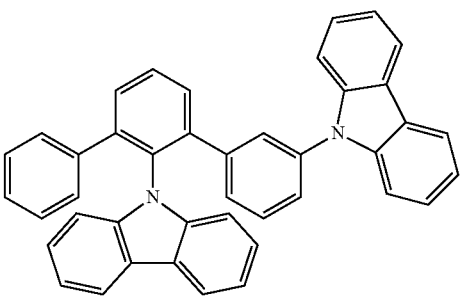
H-37
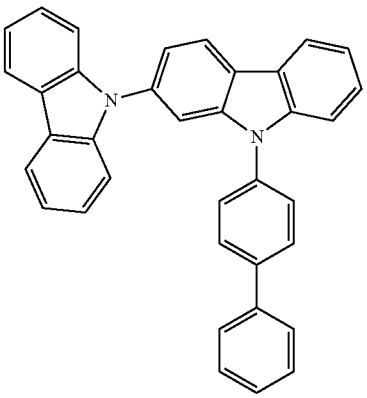
H-38
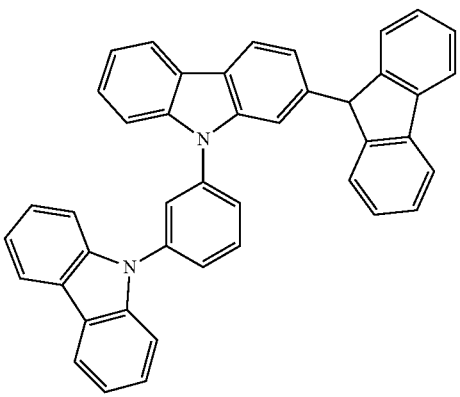

H-39
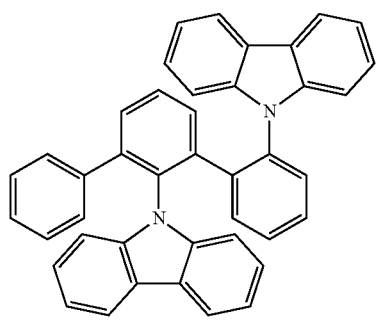

H-40
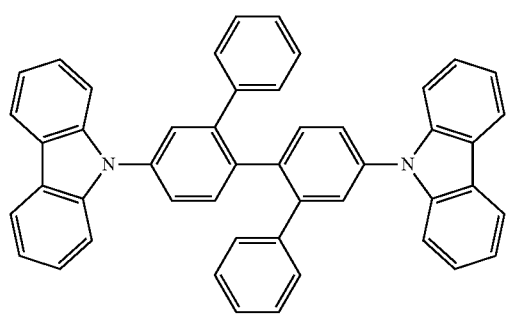

H-41
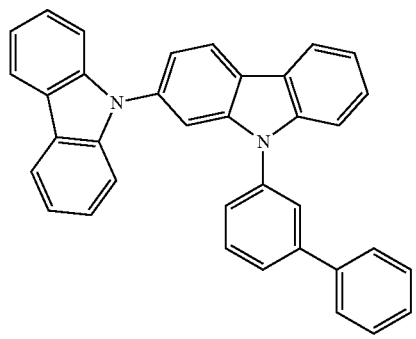

H-42
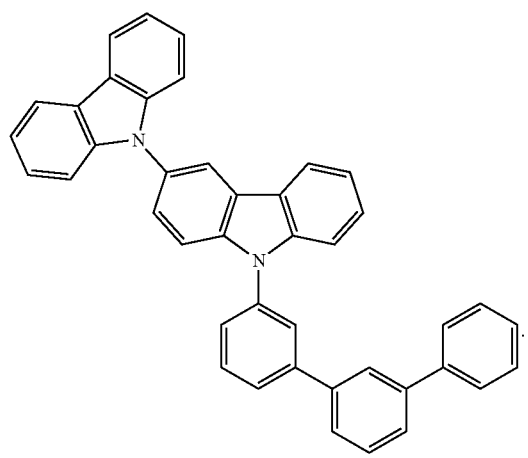

The composition may include the first compound represented by Formula 1 and the second compound represented by Formula 2, thereby having improved mobility of electrons and holes. Thus, an electron device, for example, an organic light-emitting device, including the composition may have high emission efficiency.

In addition, $Ar_1$ in Formula 1 may be a group represented by Formula 11 or 12, and $Ar_2$ in Formula 1 may be a group represented by Formula 13 or 14. That is, in Formula 1, a group represented by *-$(L_1)_{a1}$-*' may be between two carbazole cores each represented by one of Formulae 11 to 14. In this regard, an electronic device including the composition may have low driving voltage, high efficiency, high power efficiency, and long lifespan.

Furthermore, $L_1$ in Formula 1 may be a group represented by Formula 15. That is, $L_1$ in Formula 1 having a role as a linker may be selected from a phenylene group having a linking point at a meta-position and a derivative thereof. Therefore, the first compound represented by Formula 1 may have a relatively high $T_1$ energy level.

For example, $T_1$ energy levels of Compounds E-2, E-4, E-6 and E-8 and Compound A are evaluated by using structural optimization calculations using a DFT method of the Gaussian program at B3LYP/6-31G(d,p) level, and the results are shown in Table 1.

TABLE 1

|  | $T_1$ (eV) |
|---|---|
| Compound E-2 | 2.98 |
| Compound E-4 | 3.00 |
| Compound E-6 | 2.97 |
| Compound E-8 | 3.03 |
| Compound A | 2.95 |

Compound A

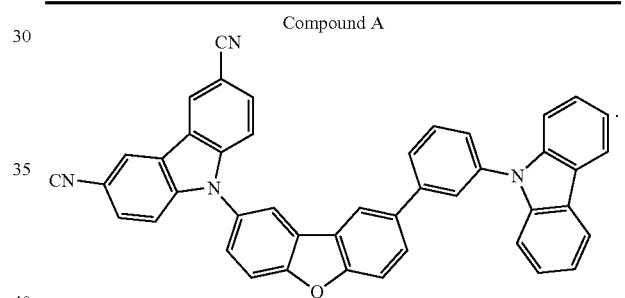

Referring to Table 1, it has been determined that Compounds E-2, E-4, E-6, and E-8 each have a higher $T_1$ energy level than that of Compound A including a dibenzofuranylene group between two carbazole rings.

In Formula 1, the number of cyano groups included in a group represented by *-$(L_1)_{a1}$-*' in Formula 1 is denoted as "c5", and the sum of c1 to c5 in Formula 1 may be an integer selected from 1 to 5. That is, the total number of cyano groups included in the structure of Formula 1 may be 1, 2, 3, 4, or 5. In this regard, the first compound 44 represented by Formula 1 may have excellent heat-resistance, and accordingly, an electron device, for example, an organic light-emitting device including the composition or a thin film including the first compound represented by Formula 1 and the second compound represented by Formula 2 may have high efficiency and long lifespan.

In the composition, a weight ratio of the first compound represented by Formula 1 to the second compound represented by Formula 2 may be selected from a range of about 0.1:99.9 to about 99.9:0.1, for example, about 1:9 to about 9:1. In an embodiment, a weight ratio of the first compound represented by Formula 1 to the second compound represented by Formula 2 may be selected from a range of about 3:7 to about 7:3. While not wishing to be bound by theory, it is understood that when the weight ratio of the first compound represented by Formula 1 to the second compound represented by Formula 2 in the composition is within the ranges above, an emission layer in an organic light-emitting device may have an efficient charge balance, thereby implementing the organic light-emitting device having high efficiency.

A thin film according to an embodiment of the present disclosure may include the composition. The thin film may be formed by utilizing various suitable methods, such as vacuum deposition, spin coating, casting, or Langmuir-Blodgett (LB) deposition.

When the thin film is formed by vacuum deposition, the deposition conditions may vary according to a compound used as a material to form the thin film, and the structure and thermal characteristics of the thin film. For example, the deposition conditions may include a deposition temperature of about 100 to about 500° C., a vacuum degree of about $10^{-8}$ to about $10^{-3}$ torr, and a deposition rate of about 0.01 to about 100 Angstroms per second (Å/sec). However, the deposition conditions are not limited thereto.

When the thin film is formed by spin coating, the spin coating conditions may vary according to a compound that is a material used to form the thin film, and the structure and thermal characteristics of the thin film. For example, the spin coating conditions may include a coating rate of about 2,000 revolutions per minute (rpm) to about 5,000 rpm, and a temperature at which a heat treatment is performed to remove a solvent after coating may be selected from a range of about 80° C. to about 200° C. However, the spin coating conditions are not limited thereto.

The thin film may further include, in addition to the composition described above, a phosphorescent dopant.

The phosphorescent dopant may be a dopant capable of conducting emission according to the phosphorescent emission mechanism.

The phosphorescent dopant may be selected from a red phosphorescent dopant, a green phosphorescent dopant, and a blue phosphorescent dopant.

In an embodiment, the phosphorescent dopant may be a green phosphorescent dopant or a blue phosphorescent dopant, but is not limited thereto.

For example, the phosphorescent dopant may include an organometallic compound represented by Formula 81:

$$M(L_{81})_{n81}(L_{82})_{n82}$$ Formula 81

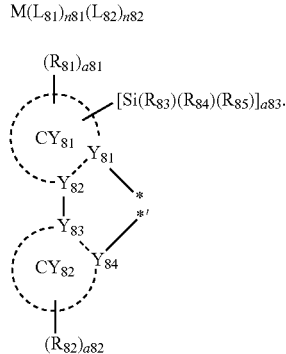

Formula 81A

In Formulae 81 and 81A,

M may be selected from iridium (Ir), platinum (Pt), osmium (Os), titanium (Ti), zirconium (Zr), hafnium (Hf), europium (Eu), terbium (Tb), thulium (Tm), and rhodium (Rh), $L_{81}$ may be a ligand represented by Formula 81A, and n81 may be an integer selected from 1 to 3, wherein when n81 is two or more, two or more ligands $L_{81}$ may be identical to or different from each other, $L_{82}$ may be an organic ligand, and n82 may be an integer selected from 0 to 4, wherein when n82 is two or more, two or more ligands $L_{82}$ may be identical to or different from each other, $Y_{81}$ to $Y_{84}$ may each independently be carbon (C) or nitrogen (N), $Y_{81}$ and $Y_{82}$ may be linked to each other through a single bond or a double bond, and $Y_{83}$ and $Y_{84}$ may be linked to each other through a single bond or a double bond, $CY_{81}$ and $CY_{82}$ may each independently be selected from a $C_5$-$C_{30}$ carbocyclic ring and a $C_2$-$C_{30}$ heterocyclic ring, $CY_{81}$ and $CY_{82}$ may be further optionally linked to each other through an organic linking group, $R_{81}$ to $R_{85}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —Si($Q_{81}$)($Q_{82}$)($Q_{83}$), —N($Q_{84}$)($Q_{85}$), —B($Q_{86}$)($Q_{87}$), and —P(=O)($Q_{88}$)($Q_{89}$), a81 to a83 may each independently be an integer selected from 0 to 5, wherein when a81 is two or more, two or more groups $R_{81}$ may be identical to or different from each other, when a82 is two or more, two or more groups $R_{82}$ may be identical to or different from each other, when a81 is two or more, two or more neighboring groups $R_{81}$ may be optionally linked to each other to form a saturated or unsaturated ring, and when a82 is two or more, neighboring groups $R_{82}$ may be optionally linked to each other to form a saturated or unsaturated ring,

* and *' in Formula 81A may each independently be a binding site to M of Formula 81, and at least one of substituent(s) of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, and —Si($Q_{91}$)($Q_{92}$)($Q_{93}$), wherein $Q_{81}$ to $Q_{89}$ and $Q_{91}$ to $Q_{93}$ may each independently be selected from hydrogen, deuterium, a $C_1$-$C_{60}$ alkyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one $C_1$-$C_{60}$ alkyl group, a $C_6$-$C_{60}$ aryl group substituted with at least one $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In an embodiment, in Formula 81A, a83 may be 1 or 2, $R_{83}$ to $R_{85}$ may each independently be selected from:
—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and -$CD_2CDH_2$, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments are not limited thereto.

In various embodiments, in Formula 81A, $Y_{81}$ may be N, $Y_{82}$ and $Y_{83}$ may be C, and $Y_{84}$ may be N or C, $CY_{81}$ and $CY_{82}$ may each independently be selected from a cyclopentadiene ring, a benzene ring, a heptalene ring, an indene ring, a naphthalene ring, an azulene ring, an indacene ring, acenaphthylene ring, a fluorene ring, a spiro-bifluorene ring, a benzofluorene ring, a dibenzofluorene ring, a phenalene ring, a phenanthrene ring, an anthracene ring, a fluoranthene ring, a triphenylene ring, a pyrene ring, a chrysene ring, a naphthacene ring, a picene ring, a perylene ring, a pentacene ring, a hexacene ring, a pentaphene ring, a rubicene ring, a corocene ring, an ovalene ring, a pyrrole ring, an isoindole ring, an indole ring, an indazole ring, a pyrazole ring, an imidazole ring, a triazole ring, an oxazole ring, an isoxazole ring, an oxadiazole ring, a thiazole ring, an isothiazole ring, a thiadiazole ring, a purine ring, a furan ring, a thiophene ring, a pyridine ring, a pyrimidine ring, a quinoline ring, an isoquinoline ring, a benzoquinoline ring, a phthalazine ring, a naphthyridine ring, a quinoxaline ring, a quinazoline ring, a cinnoline ring, a phenanthridine ring, an acridine ring, a phenanthroline ring, a phenazine ring, a benzimidazole ring, a benzofuran ring, a benzothiophene ring, an isobenzothiazole ring, a benzoxazole ring, an isobenzoxazole ring, a benzocarbazole ring, a dibenzocarbazole ring, an imidazopyridine ring, an imidazopyrimidine ring, a dibenzofuran ring, a dibenzothiophene ring, a dibenzothiophene sulfone ring, a carbazole ring, a dibenzosilole ring, and a 2,3-dihydro-1H-imidazole ring.

In various embodiments, in Formula 81A, $Y_{81}$ may be N, $Y_{82}$ to $Y_{84}$ may be C, $CY_{81}$ may be a 5-membered-ring including two nitrogens as ring-forming atoms, and $CY_{82}$ may be selected from a benzene ring, a naphthalene ring, a fluorene ring, a dibenzofuran ring, and a dibenzothiophene ring, but embodiments are not limited thereto.

In various embodiments, in Formula 81A, $Y_{81}$ may be N, $Y_{82}$ to $Y_{84}$ may be C, $CY_{81}$ may be an imidazole ring or a 2,3-dihydro-1H-imidazole ring, and $CY_{82}$ may be selected from a benzene ring, a naphthalene ring, a fluorene ring, a dibenzofuran ring, and a dibenzothiophene ring, but embodiments are not limited thereto.

In various embodiments, in Formula 81A, $Y_{81}$ may be N, $Y_{82}$ to $Y_{84}$ may each independently be C, $CY_{81}$ may be selected from a pyrrole ring, a pyrazole ring, an imidazole ring, a triazole ring, an oxazole ring, an isoxazole ring, an oxadiazole ring, a thiazole ring, an isothiazole ring, a thiadiazole ring, a pyridine ring, a pyrimidine ring, a quinoline ring, an isoquinoline ring, a benzoquinoline ring, a phthalazine ring, a naphthyridine ring, a quinoxaline ring, a quinazoline ring, a cinnoline ring, a benzimidazole ring, an isobenzothiazole ring, a benzoxazole ring, and an isobenzoxazole ring, and $CY_{82}$ may be selected from a cyclopentadiene ring, a benzene ring, a naphthalene ring, a fluorene ring, a benzofluorene ring, a dibenzofluorene ring, a phenanthrene ring, an anthracene ring, a triphenylene ring, a pyrene ring, a chrysene ring, a perylene ring, a benzofuran ring, a benzothiophene ring, a benzocarbazole ring, a dibenzocarbazole ring, a dibenzofuran ring, a dibenzothiophene ring, a dibenzothiophene sulfone ring, a carbazole ring, and a dibenzosilole ring.

In various embodiments, in Formula 81A, $R_{81}$ and $R_{82}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl (adamantyl) group, a norbornanyl (norbornyl) group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —$B(Q_{86})(Q_{87})$ and —$P(=O)(Q_{88})(Q_{89})$, wherein $Q_{86}$ to $Q_{89}$ may each independently be selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and -$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

In various embodiments, in Formula 81A, $R_{81}$ and $R_{82}$ may each independently be selected from:

hydrogen, deuterium, —F, a cyano group, a nitro group, —$SF_5$, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group, each substituted with at least one selected from deuterium, —F, —$CD_3$, —$CD_2H$, —$CDH_2$, —$CF_3$, —$CF_2H$, —$CFH_2$, a cyano group, a nitro group, $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group; and —B(Q$_{85}$)(Q$_{87}$) and —P(=O)(Q$_{88}$)(Q$_{89}$), wherein Q$_{86}$ to Q$_{89}$ may each independently be selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and -CD$_2$CDH$_2$, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a C$_1$-C$_{10}$ alkyl group, and a phenyl group.

In various embodiments, in Formula 81A, R$_{81}$ and R$_{82}$ may each independently be selected from hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, and groups represented by Formulae 9-1 to 9-19 and Formulae 10-1 to 10-30, but embodiments are not limited thereto:

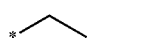

Formula 9-1

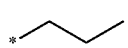

Formula 9-2

Formula 9-3

Formula 9-4

Formula 9-5

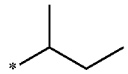

Formula 9-6

Formula 9-7

Formula 9-8

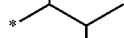

Formula 9-9

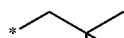

Formula 9-10

Formula 9-11

Formula 9-12

-continued

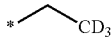

Formula 9-13

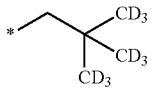

Formula 9-14

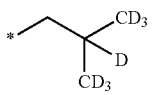

Formula 9-15

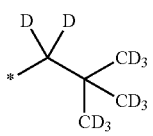

Formula 9-16

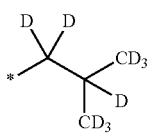

Formula 9-17

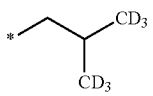

Formula 9-18

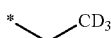

Formula 9-19

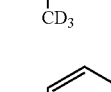

Formula 10-1

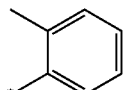

Formula 10-2

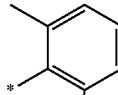

Formula 10-3

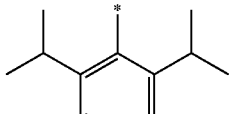

Formula 10-4

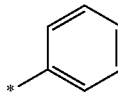

Formula 10-5

Formula 10-6

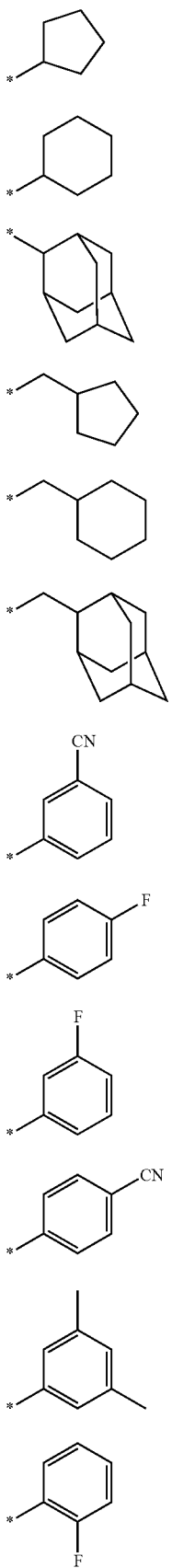
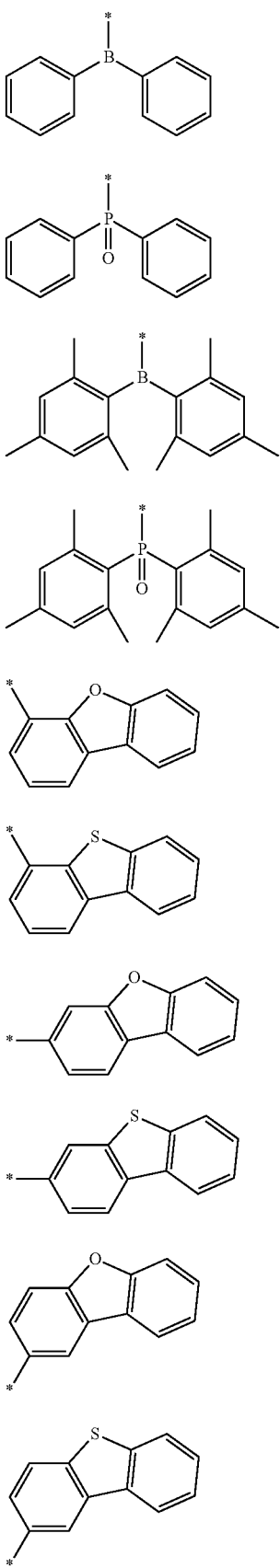
Formula 10-7
Formula 10-8
Formula 10-9
Formula 10-10
Formula 10-11
Formula 10-12
Formula 10-13
Formula 10-14
Formula 10-15
Formula 10-16
Formula 10-17
Formula 10-18
Formula 10-19
Formula 10-20
Formula 10-21
Formula 10-22
Formula 10-23
Formula 10-24
Formula 10-25
Formula 10-26
Formula 10-27
Formula 10-28

In Formulae 9-1 to 9-19 and 10-1 to 10-30, * indicates a binding site to a neighboring atom.

In various embodiments, in Formula 81A, at least one selected from $R_{81}$ in the number of a81 and $R_{82}$ in the number of a82 may be a cyano group.

In various embodiments, in Formula 81A, at least one selected from $R_{82}$ in the number of a82 may be a cyano group.

In various embodiments, in Formula 81A, at least one selected from $R_{81}$ in the number of a81 and $R_{82}$ in the number of a82 may be deuterium.

In various embodiments, in Formula 81, $L_{82}$ may be selected from ligands represented by Formulae 3-1(1) to 3-1(60), 3-1(61) to 3-1(69), 3-1(71) to 3-1(79), 3-1(81) to 3-1(88), 3-1(91) to 3-1(98), and 3-1(101) to 3-1(114):

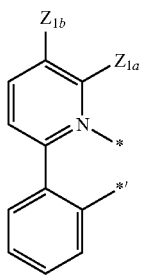
Formula 3-1(10)
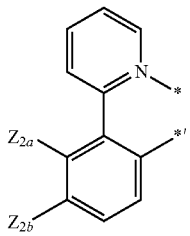
Formula 3-1(16)
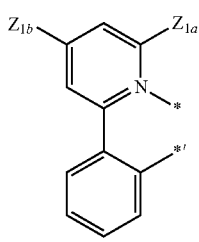
Formula 3-1(11)
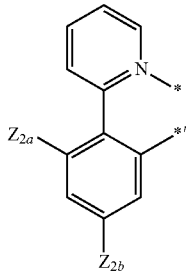
Formula 3-1(17)
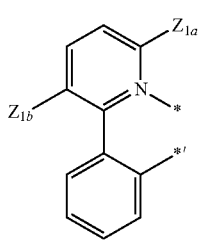
Formula 3-1(12)
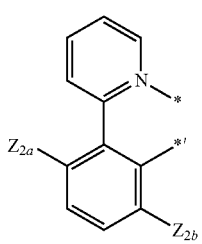
Formula 3-1(18)
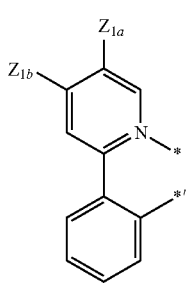
Formula 3-1(13)
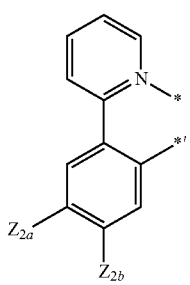
Formula 3-1(19)
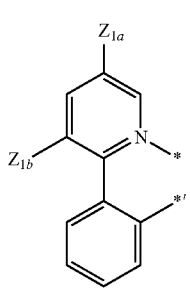
Formula 3-1(14)
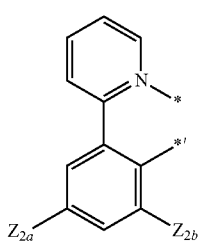
Formula 3-1(20)
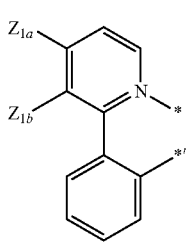
Formula 3-1(15)
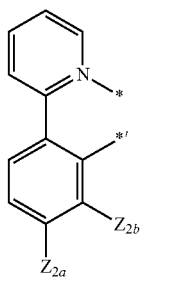
Formula 3-1(21)

Formula 3-1(22)
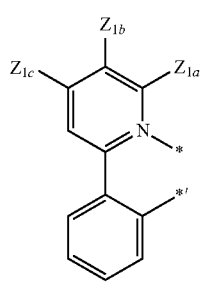
Formula 3-1(23)
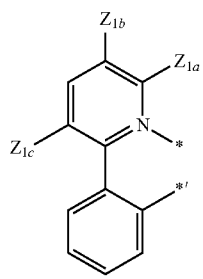
Formula 3-1(24)
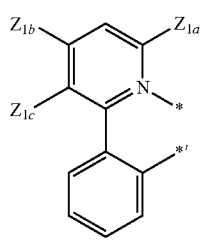
Formula 3-1(25)
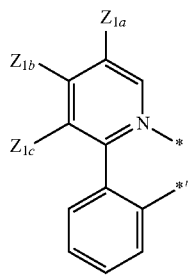
Formula 3-1(26)
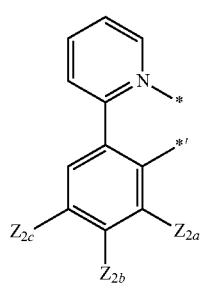
Formula 3-1(27)
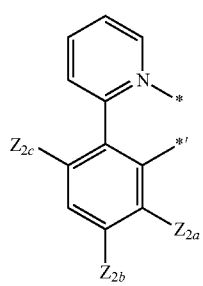
Formula 3-1(28)
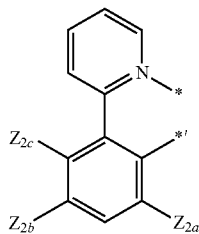
Formula 3-1(29)
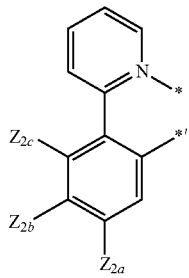
Formula 3-1(30)
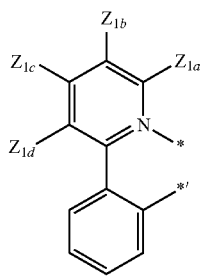
Formula 3-1(31)
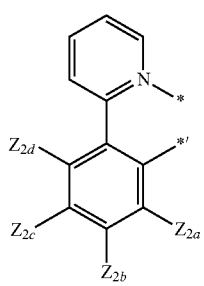
Formula 3-1(32)
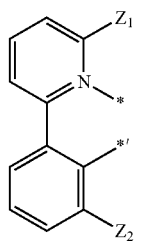
Formula 3-1(33)
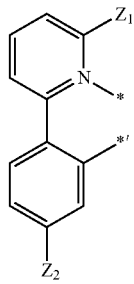

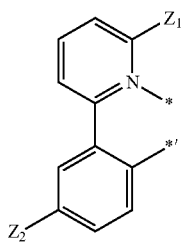
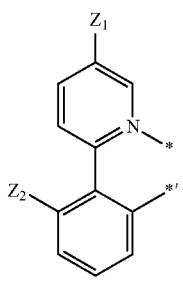

Formula 3-1(45) 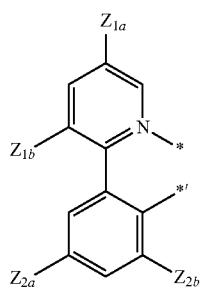
Formula 3-1(46) 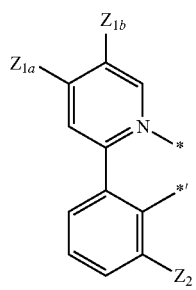
Formula 3-1(47) 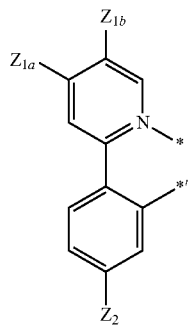
Formula 3-1(48) 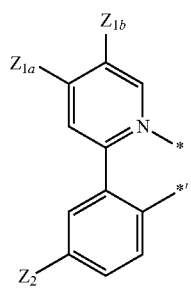
Formula 3-1(49) 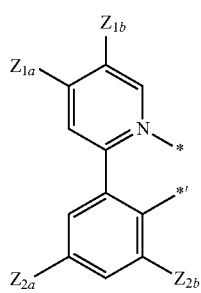
Formula 3-1(50) 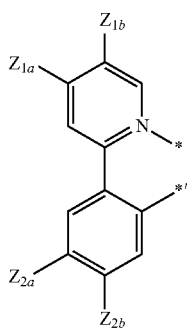
Formula 3-1(51) 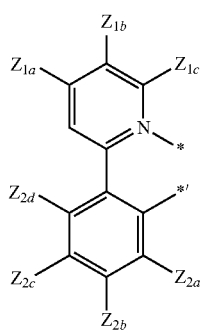
Formula 3-1(52) 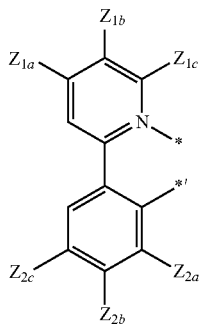
Formula 3-1(53) 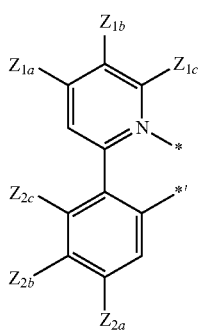
Formula 3-1(54) 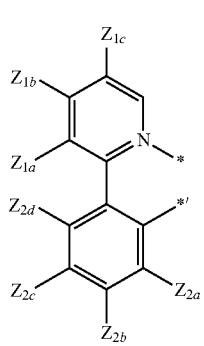

Formula 3-1(55)
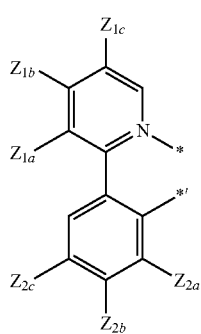
Formula 3-1(56)
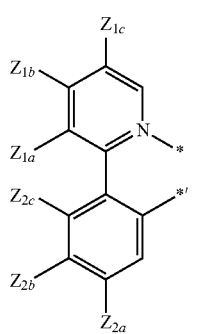
Formula 3-1(57)
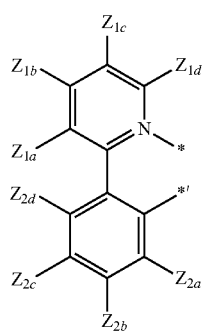
Formula 3-1(58)
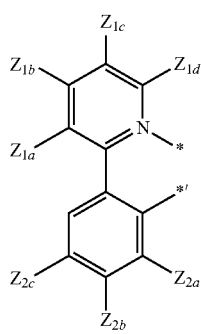
Formula 3-1(59)
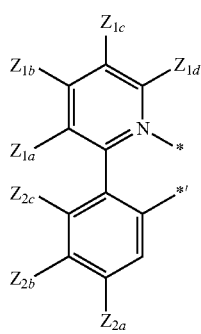
Formula 3-1(60)
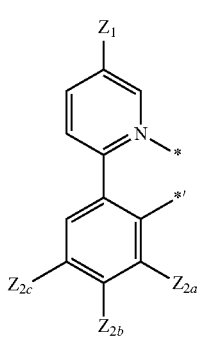
Formula 3-1(61)
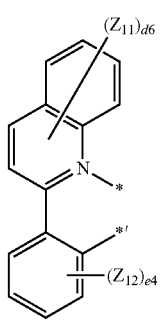
Formula 3-1(62)
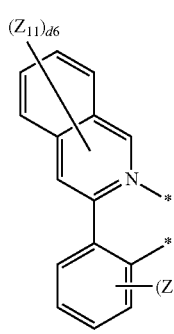
Formula 3-1(63)
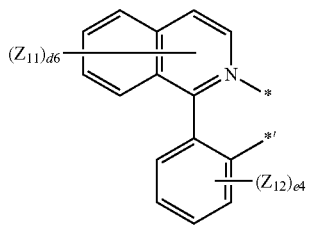
Formula 3-1(64)
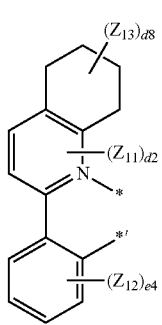

-continued
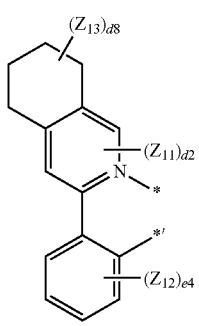
Formula 3-1(65)
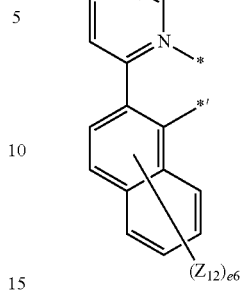
Formula 3-1(71)
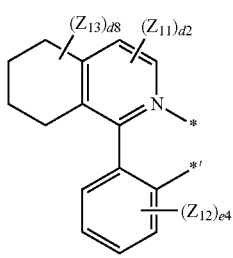
Formula 3-1(66)
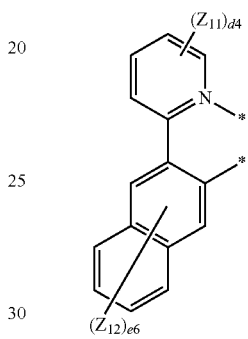
Formula 3-1(72)
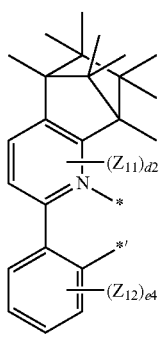
Formua 3-1(67)
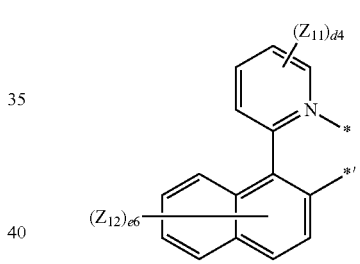
Formula 3-1(73)
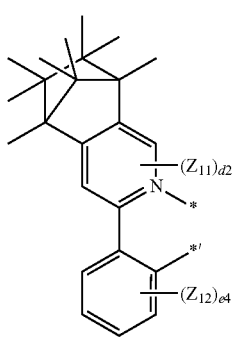
Formula 3-1(68)
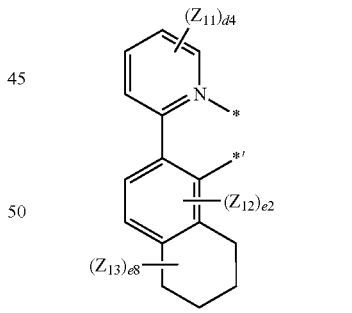
Formula 3-1(74)
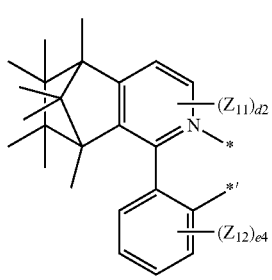
Formula 3-1(69)
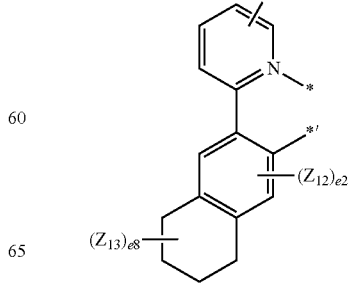
Formula 3-1(75)

Formula 3-1(76)
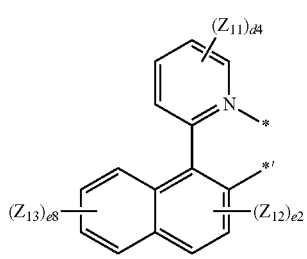
Formula 3-1(77)
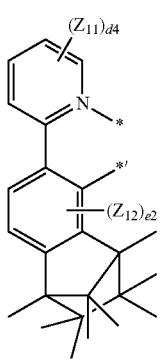
Formula 3-1(78)
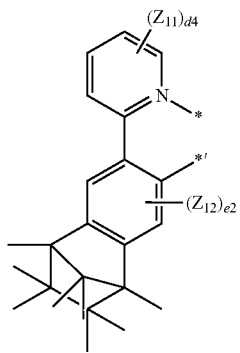
Formula 3-1(79)
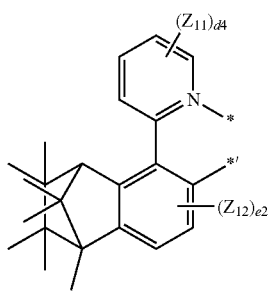
Formula 3-1(81)
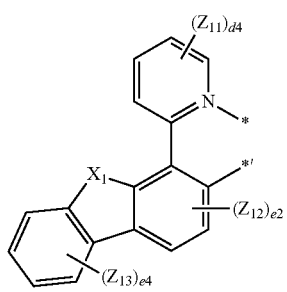
Formula 3-1(82)
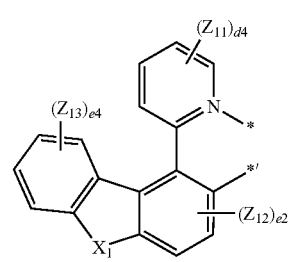
Formula 3-1(83)
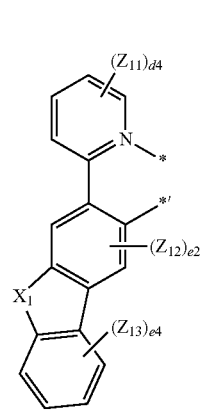
Formula 3-1(84)
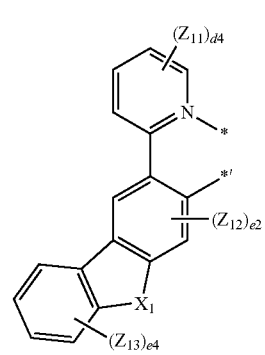
Formula 3-1(85)
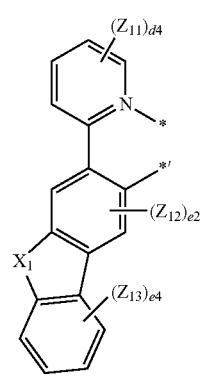

-continued
Formula 3-1(86)
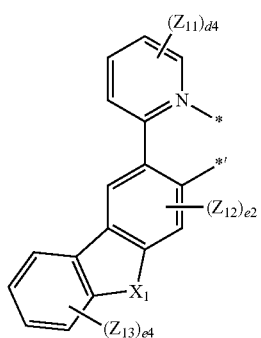
Formula 3-1(87)
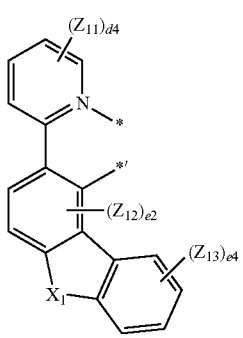
Formula 3-1(88)
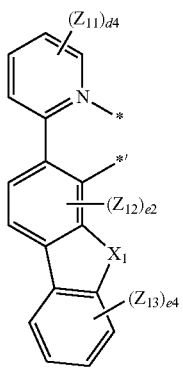
Formula 3-1(91)
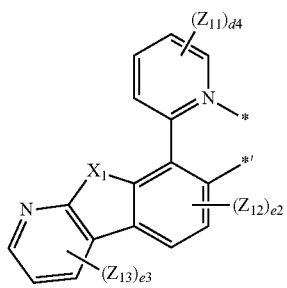
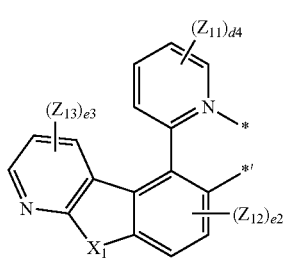
-continued
Formula 3-1(92)
Formula 3-1(93)
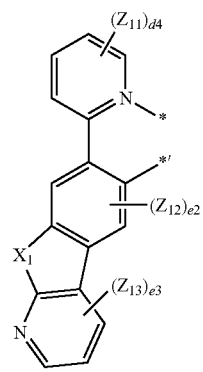
Formula 3-1(94)
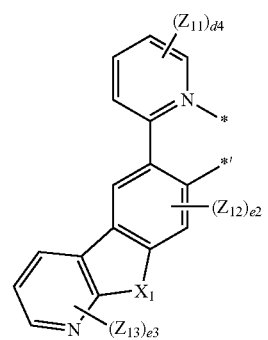
Formula 3-1(95)
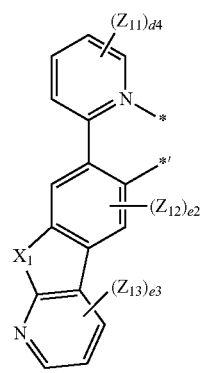
Formula 3-1(96)
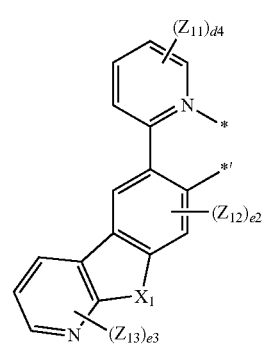

-continued
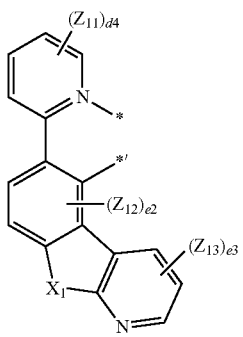
Formula 3-1(97)
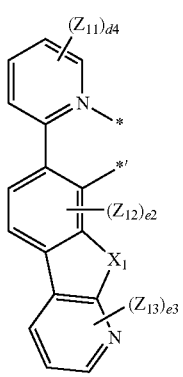
Formula 3-1(98)
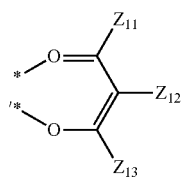
Formula 3-1(101)
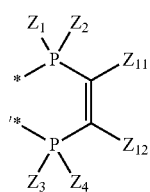
Formula 3-1(102)
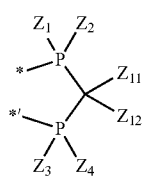
Formula 3-1(103)
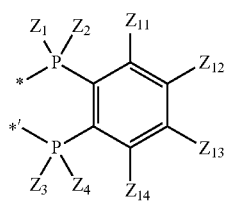
Formula 3-1(104)
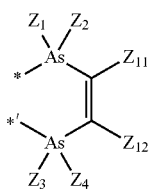
Formula 3-1(105)
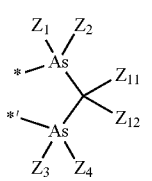
Formula 3-1(106)
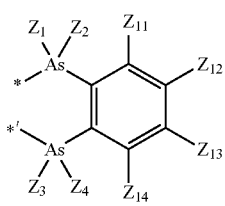
Formula 3-1(107)
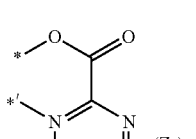
Formula 3-1(108)
Formula 3-1(109)
Formula 3-1(110)
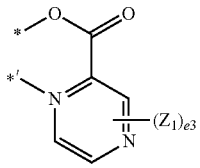
Formula 3-1(111)
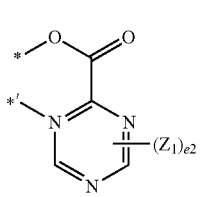
Formula 3-1(112)

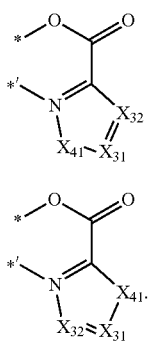

Formula 3-1(113)

Formula 3-1(114)

In Formulae 3-1(1) to 3-1(60), 3-1(61) to 3-1(69), 3-1(71) to 3-1(79), 3-1(81) to 3-1(88), 3-1(91) to 3-1(98), and 3-1(101) to 3-1(114), $X_1$ may be O, S, $C(Z_{21})(Z_{22})$, or $N(Z_{23})$, $X_{31}$ may be N or $C(Z_{1a})$, and $X_{32}$ may be N or $C(Z_{1b})$, $X_{41}$ may be O, S, $N(Z_{1a})$, or $C(Z_{1a})(Z_{1b})$, $Z_1$ to $Z_4$, $Z_{1a}$, $Z_{1b}$, $Z_{1c}$, $Z_{1d}$, $Z_{2a}$, $Z_{2b}$, $Z_{2c}$, $Z_{2d}$, $Z_{11}$ to $Z_{14}$, and $Z_{21}$ to $Z_{23}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a C$_1$-C$_{20}$ alkyl group, and a C$_1$-C$_{20}$ alkoxy group;

a C$_1$-C$_{20}$ alkyl group and a C$_1$-C$_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, sulfonic acid group or a salt thereof, a phosphoric acid group or a salt thereof, a C$_1$-C$_{20}$ alkyl group, a C$_1$-C$_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —B(Q$_{86}$)(Q$_{87}$) and —P(=O)(Q$_{88}$)(Q$_{89}$), wherein Q$_{86}$ to Q$_{89}$ may each independently be selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and -CD$_2$CDH$_2$, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, d2 and e2 may each independently be 0 or 2, e3 may be an integer selected from 0 to 3, d4 and e4 may each independently be an integer selected from 0 to 4, d6 and e6 may each independently be an integer selected from 0 to 6, d8 and e8 may each independently be an integer selected from 0 to 8, and

* and *' each indicate a binding site to M of Formula 1.

For example, $Z_1$ to $Z_4$, $Z_{1a}$, $Z_{1b}$, $Z_{1c}$, $Z_{1d}$, $Z_{2a}$, $Z_{2b}$, $Z_{2c}$, $Z_{2d}$, $Z_{11}$ to $Z_{14}$, and $Z_{21}$ to $Z_{23}$ may each independently be selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, and groups represented by Formulae 9-1 to 9-19 and 10-1 to 10-30, but embodiments are not limited thereto.

In various embodiments, in Formula 81,

M may be Ir, and the sum of n81 and n82 may be 3; or

M may be Pt, and the sum of n81 and n82 may be 2.

In various embodiments, the organometallic compound represented by Formula 81 may not be a compound consisting of a pair of a cation and an anion, but be an electrically neutral, non-ionic compound.

In various embodiments, the phosphorescent dopant in the film may include at least one selected from Compounds PD1 to PD78 and $FIr_6$, but embodiments are not limited thereto:

PD1

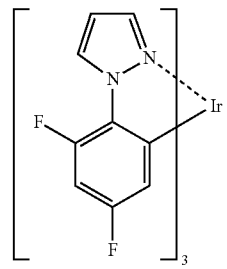

PD2

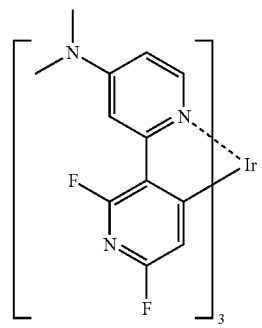

PD3

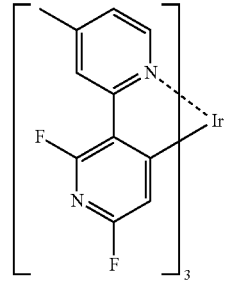

PD4

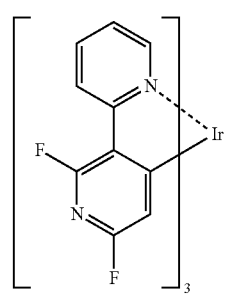

PD5

PD6

PD7

PD8

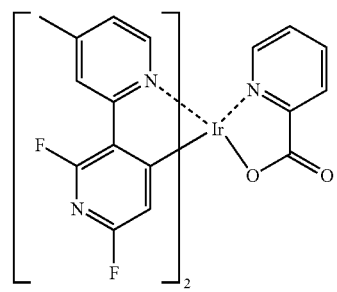

-continued
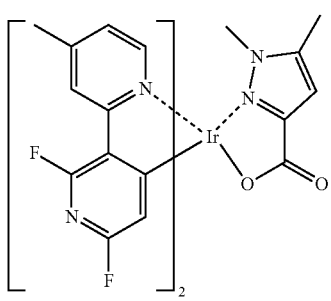
PD9
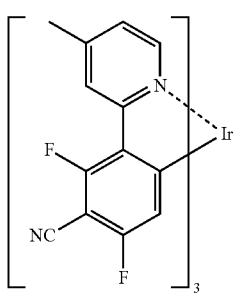
PD10
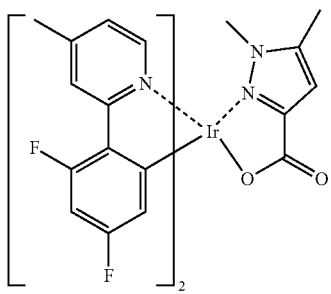
PD11
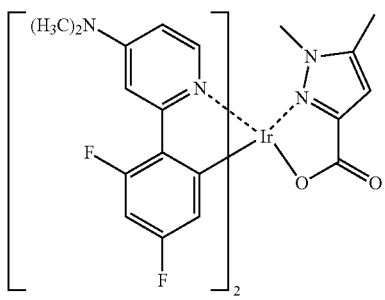
PD12
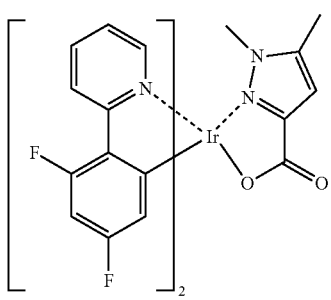
PD13
-continued
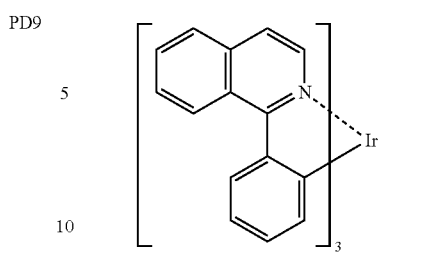
PD14
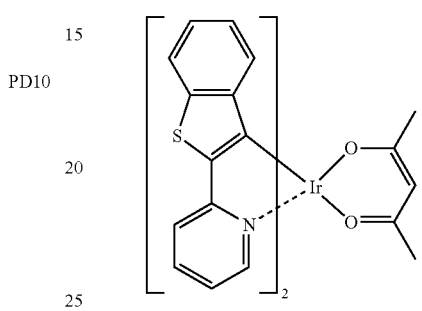
PD15
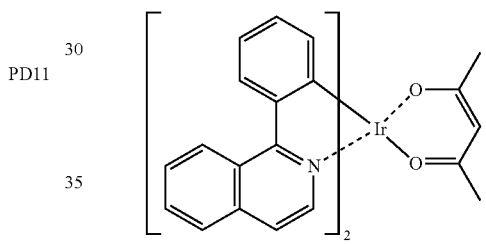
PD16
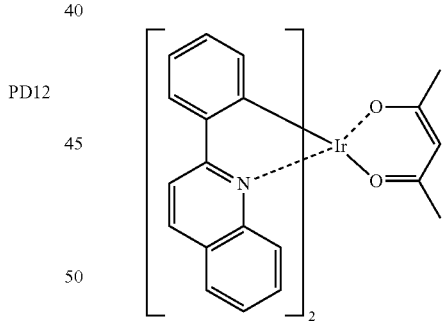
PD17
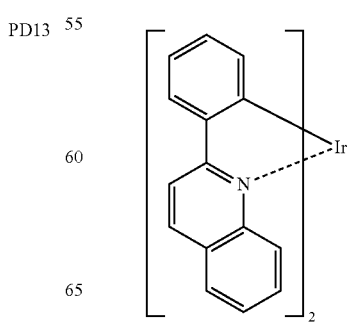
PD18

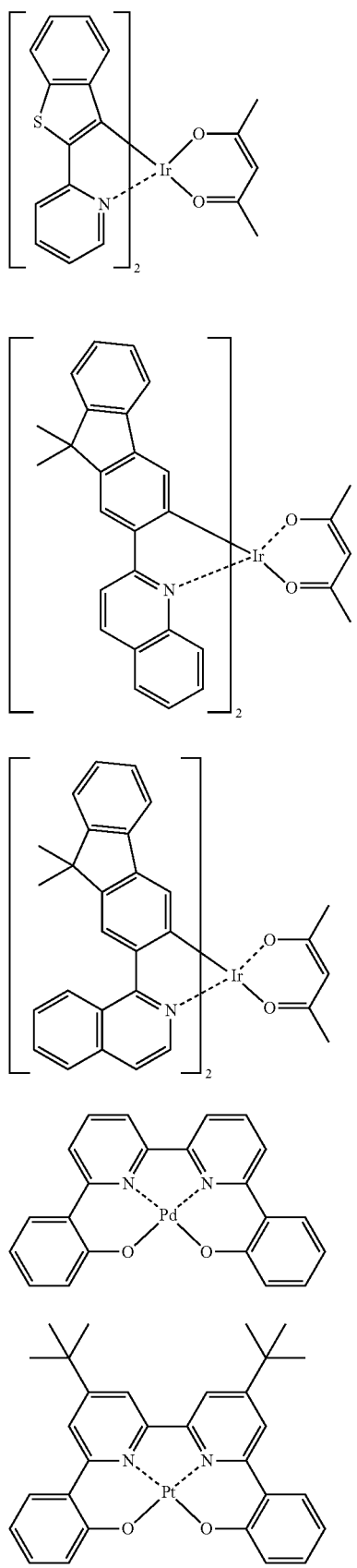
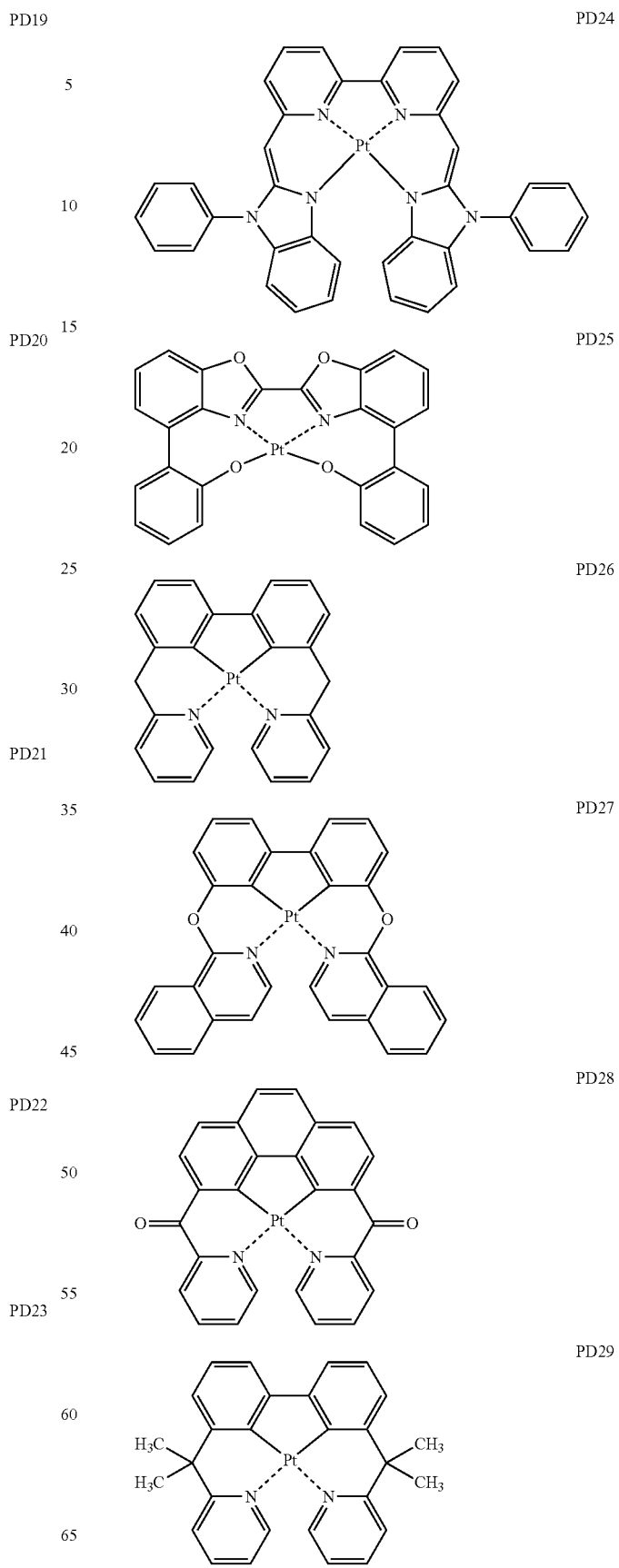

-continued
PD30 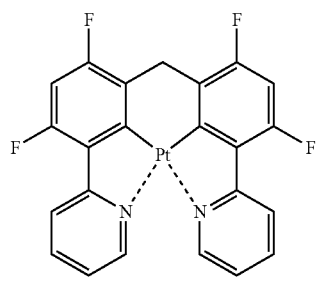
PD31 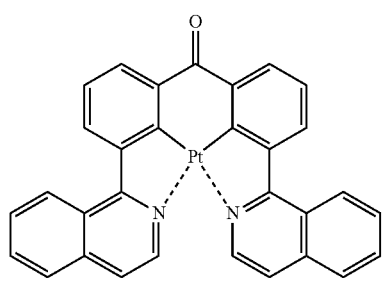
PD32 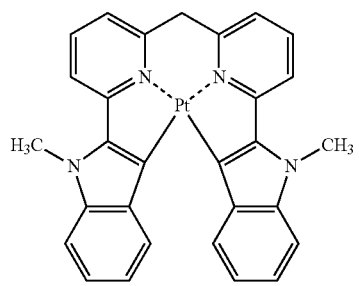
PD33 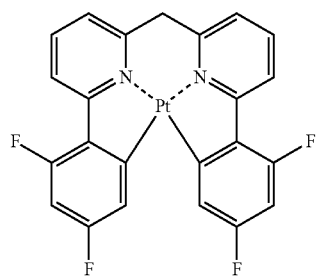
PD34 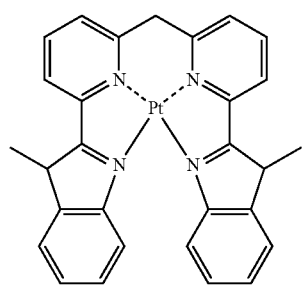
-continued
PD35 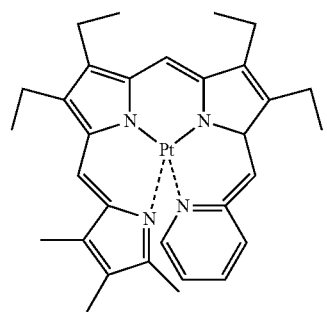
PD36 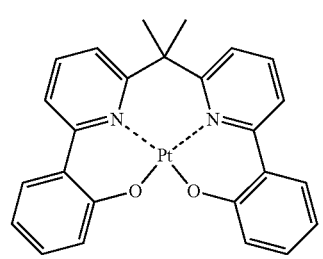
PD37 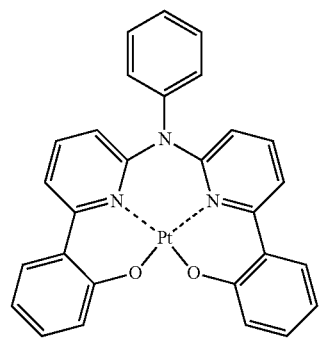
PD38 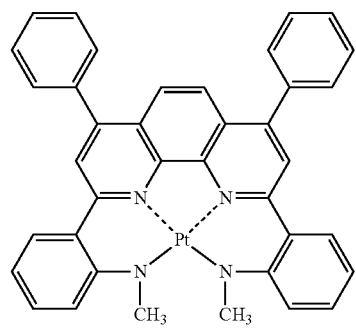
PD39 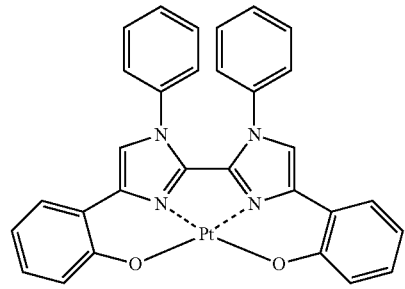

-continued
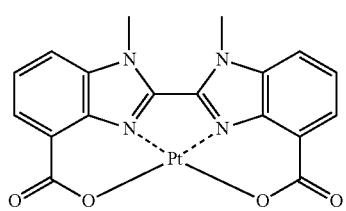
PD40
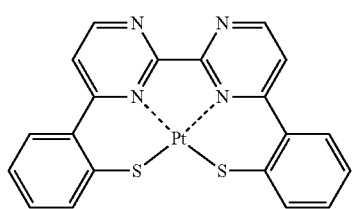
PD41
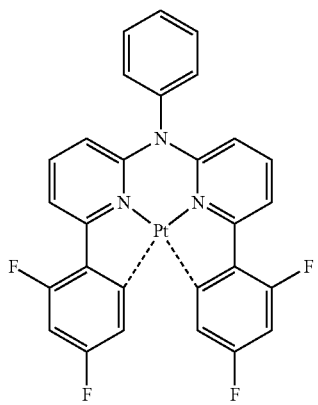
PD42
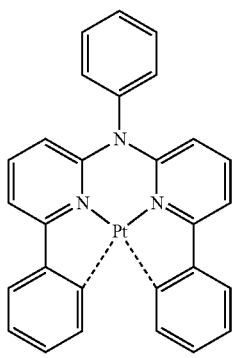
PD43
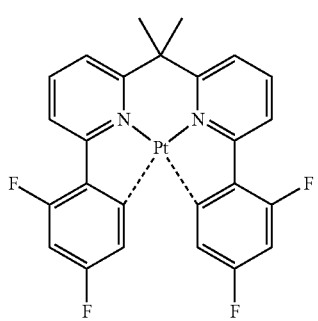
PD44
-continued
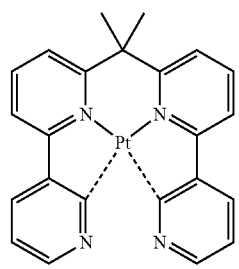
PD45
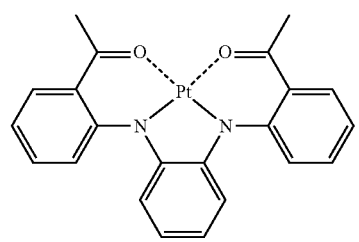
PD46
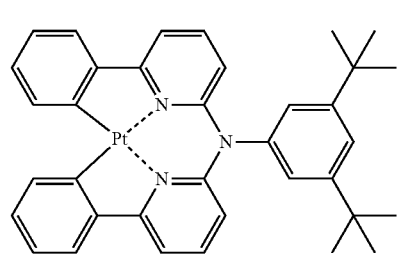
PD47
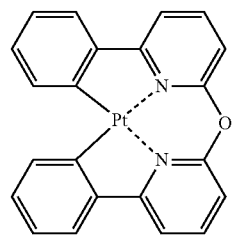
PD48
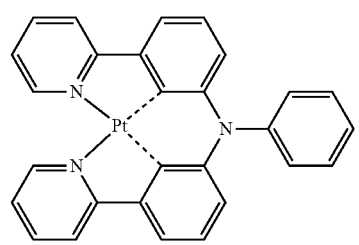
PD49
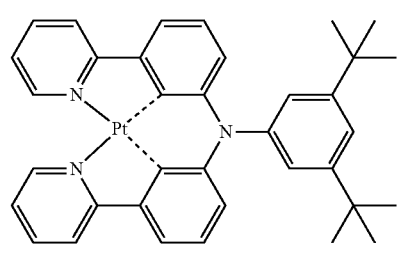
PD50

-continued
PD51 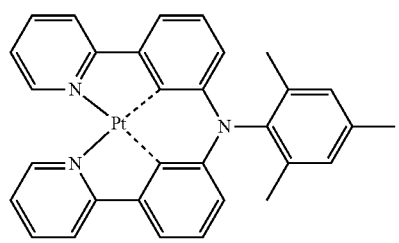
PD57 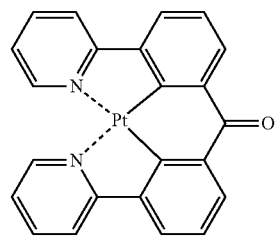
PD52 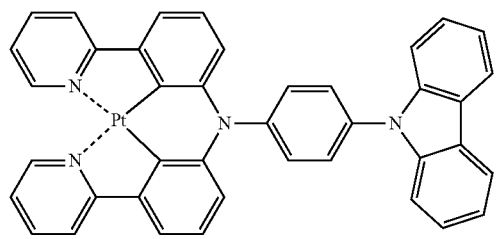
PD58 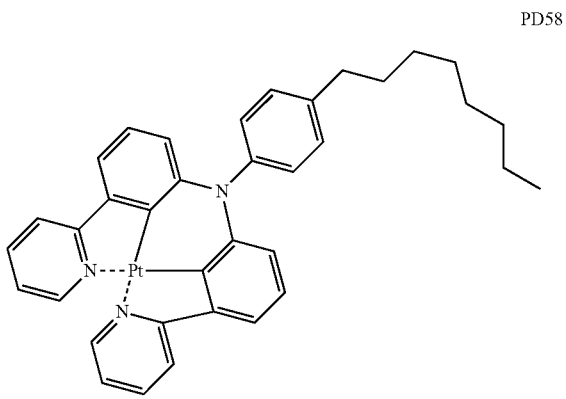
PD53 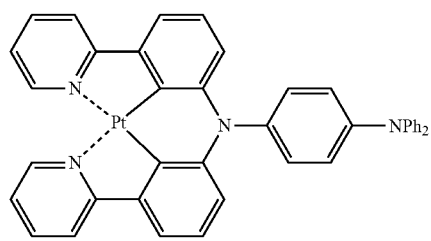
PD54 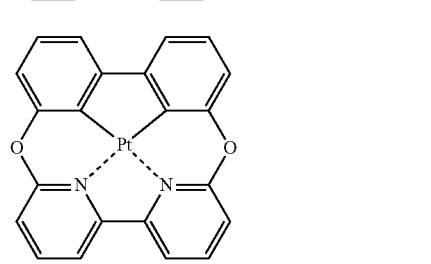
PD59 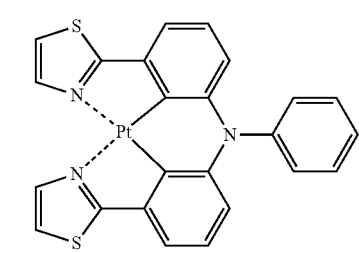
PD55 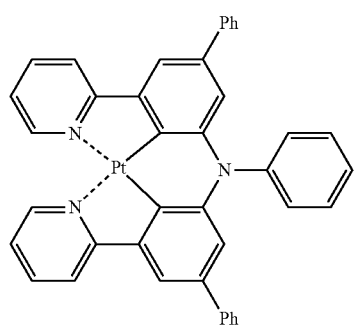
PD60 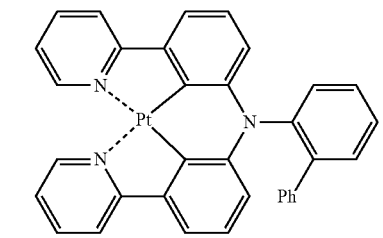
PD56 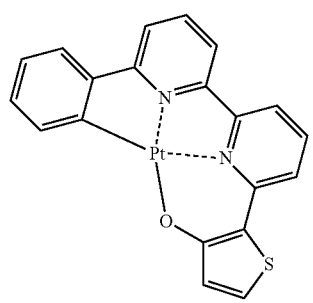
PD61 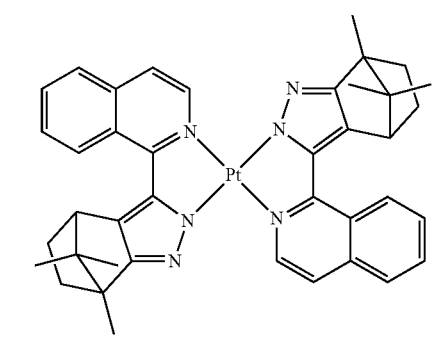

-continued
PD62 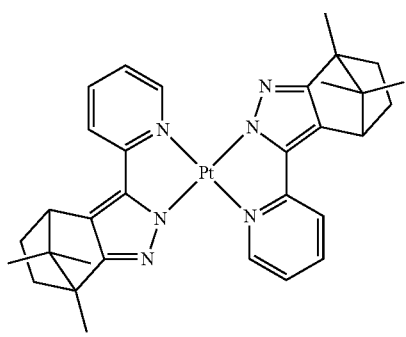
PD63 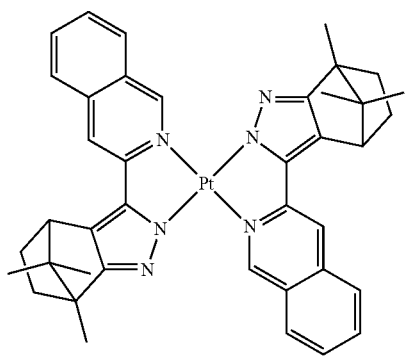
PD64 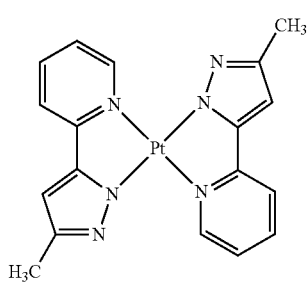
PD65 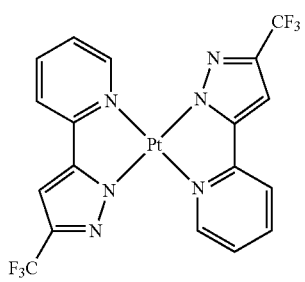
PD66 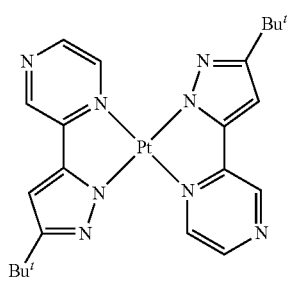
-continued
PD67 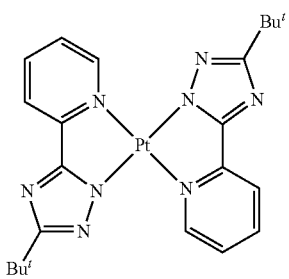
PD68 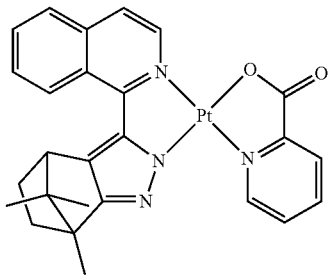
PD69 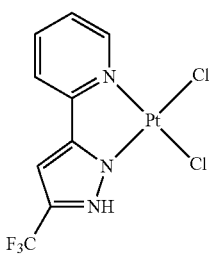
PD70 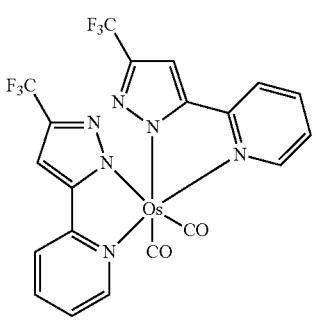
PD71 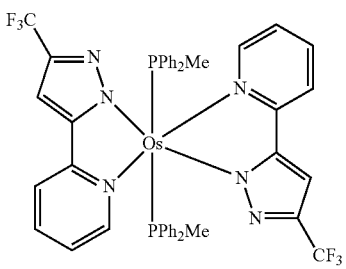

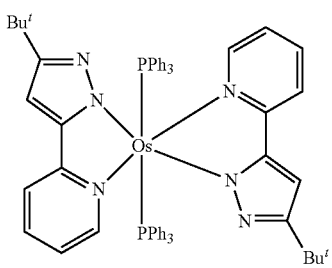

PD72

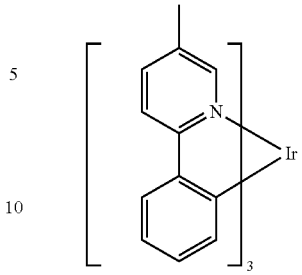
PD78

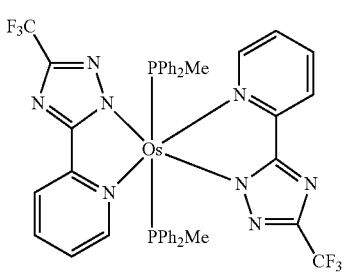

PD73

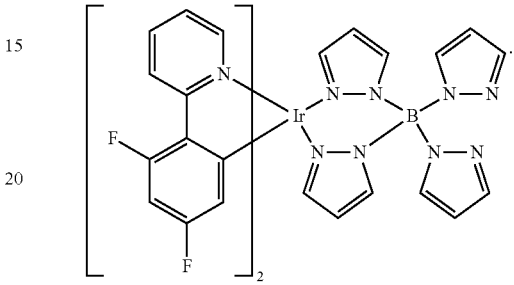
FIr6

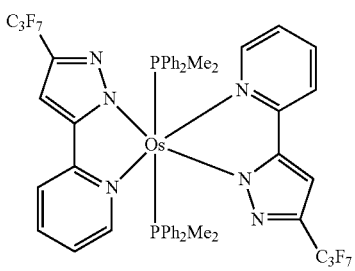

PD74

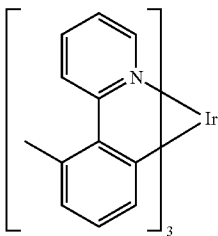

PD75

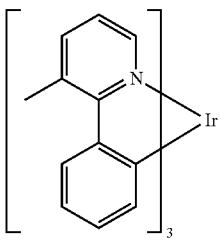

PD76

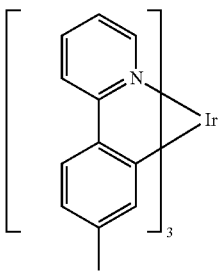

PD77

The amount of the phosphorescent dopant in the thin film may be in a range of about 0.01 parts by weight to about 20 parts by weight based on 100 parts by weight of the composition, but the amount of the phosphorescent dopant is not limited thereto. While not wishing to be bound by theory, it is understood that when the amount of the phosphorescent dopant is within the range above, light may be emitted without a quenching phenomenon.

The thin film may be applied to an electron device, for example, an organic layer of an organic light-emitting device. Therefore, according to another aspect of the present disclosure, provided is an organic light-emitting device including:

a first electrode;

a second electrode; and an organic layer disposed between the first electrode and the second electrode;

wherein the organic layer including the composition or the thin film.

In an embodiment, the thin film included in the organic layer may be an emission layer. Here, the composition included in the emission layer may serve as a host. The amount of the composition included in the emission layer may be less than that of the phosphorescent dopant.

When the thin film is an emission layer including the composition and the phosphorescent dopant, the first compound represented by Formula 1 and the second compound represented by Formula 2 in the emission layer may improve the mobility of electrons and holes in the organic light-emitting device, and the emission layer may control the charge balance, thereby implementing an organic light-emitting device having high efficiency and long lifespan.

The thin film may include the composition and a blue phosphorescent dopant, thereby implementing an organic light-emitting device emitting blue light with high color purity. For example, the organic light-emitting device including the thin film as the emission layer may emit blue light having a CIE y coordinate of 0.3 or less.

FIG. 1 is a schematic cross-sectional view of a structure of an organic light-emitting device 10 according to an embodiment. Hereinafter, a structure of an organic light-emitting device according to an embodiment and a method of manufacturing an organic light-emitting device, according to an embodiment, will be described in connection with FIG. 1. The organic light-emitting device 10 may have a structure in which a first electrode 11, an organic layer 15, and a second electrode 19 are sequentially stacked in the stated order.

A substrate may be additionally disposed under the first electrode 11 or above the second electrode 19. For use as the substrate, any substrate that is used in general organic light-emitting devices may be used, and the substrate may be a glass substrate or transparent plastic substrate, each with excellent mechanical strength, thermal stability, transparency, surface smoothness, ease of handling, and water-resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode 11 may be, for example, indium tin oxide (ITO), indium zinc oxide (IZO), tin oxide ($SnO_2$), and zinc oxide (ZnO). In various embodiments, metals, such as magnesium (Mg), aluminum (Al), aluminum-lithium (Al—Li), calcium (Ca), magnesium-indium (Mg—In), or magnesium-silver (Mg—Ag) may be used as the material for forming the first electrode 11.

The first electrode 11 may have a single-layer structure or a multi-layer structure including two or more layers. For example, the first electrode 11 may have a three-layered structure of ITO/Ag/ITO, but the structure of the first electrode 11 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In various embodiments, the hole transport region may have a structure of hole injection layer/hole transport layer or a structure of hole injection layer/hole transport layer/electron blocking layer, which are sequentially stacked in this stated order from the first electrode 11.

When the hole transport region includes a hole injection layer, the hole injection layer may be formed on the first electrode 11 utilizing various suitable methods, such as vacuum deposition, spin coating, casting, or LB deposition.

When a hole injection layer is formed by vacuum deposition, the deposition conditions may vary according to a compound that is a material used to form the hole injection layer, and the structure and thermal characteristics of the hole injection layer. For example, the deposition conditions may include a deposition temperature of about 100 to about 500° C., a vacuum degree of about $10^{-8}$ to about $10^{-3}$ torr, and a deposition rate of about 0.01 to about 100 Å/sec. However, the deposition conditions are not limited thereto.

When the hole injection layer is formed by spin coating, the coating conditions may vary according to a compound used as a material to form the hole injection layer, and the structure and thermal characteristics of the hole injection layer. For example, the spin coating conditions may include a coating rate of about 2,000 rpm to about 5,000 rpm, and a temperature at which a heat treatment is performed to remove a solvent after coating may be selected from a range of about 80° C. to about 200° C. However, the spin coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (Pani/DBSA), poly(3,4-ethylenedioxythiophene)/poly(4-styrene sulfonate) (PEDOT/PSS), polyaniline/camphor sulfonic acid (Pani/CSA), polyaniline/poly(4-styrene sulfonate) (Pani/PSS), a compound represented by Formula 201, and a compound represented by Formula 202:

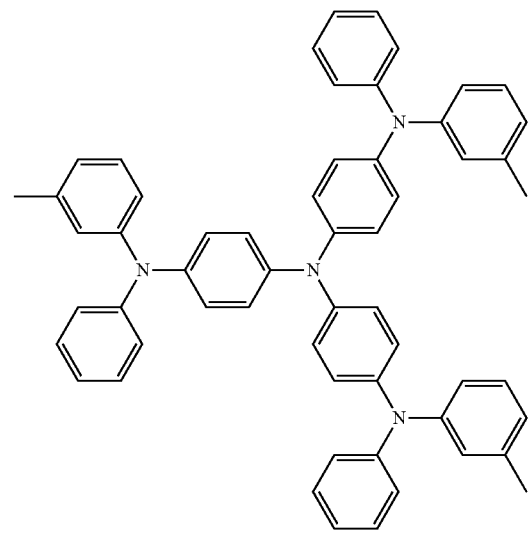

m-MTDATA

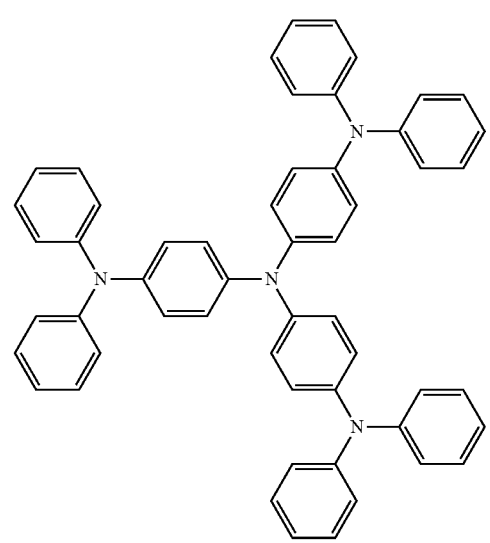

TDATA

-continued
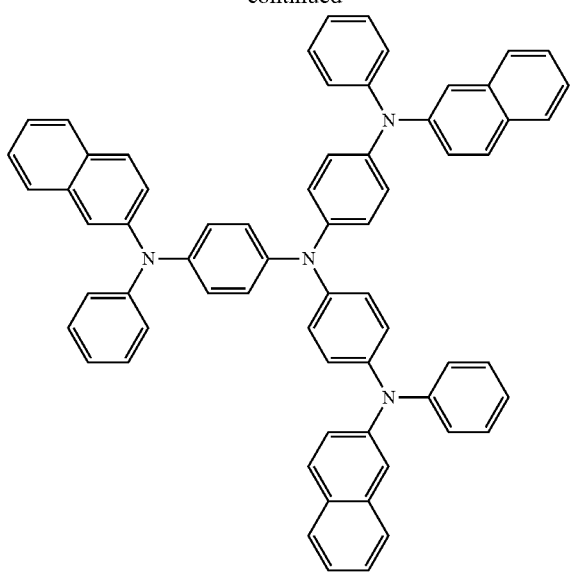
2-TNATA
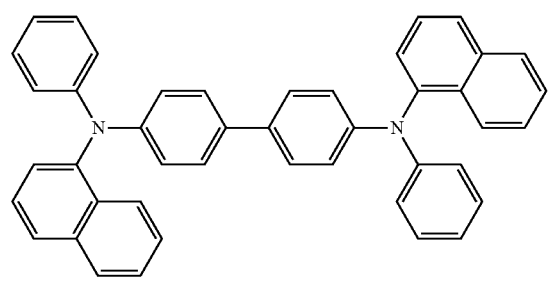
NPB
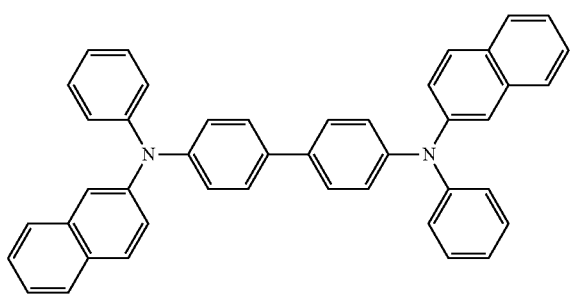
β-NPB
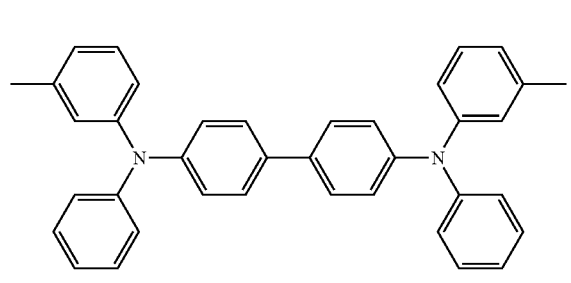
TPD
-continued
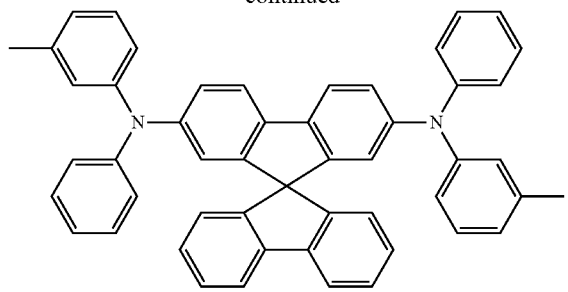
Spiro-TPD
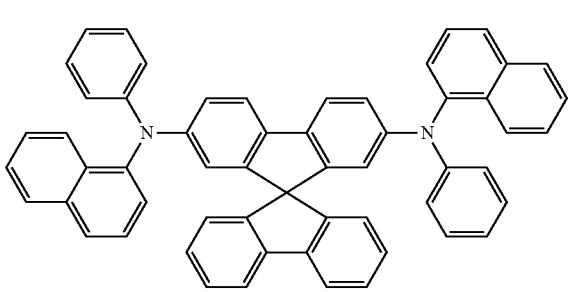
Spiro-NPB
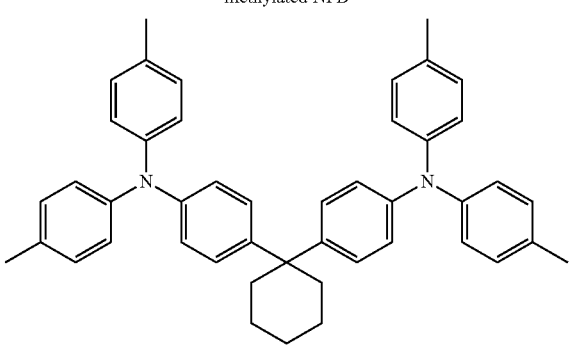
methylated NPB
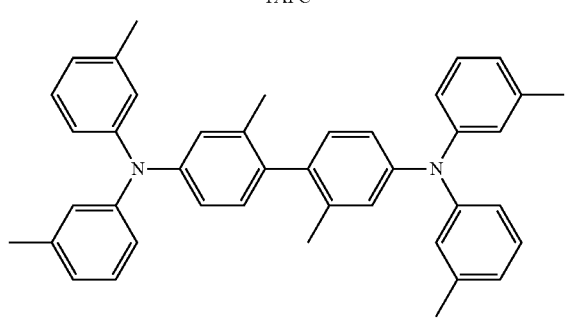
TAPC
HMTPD Formula 201

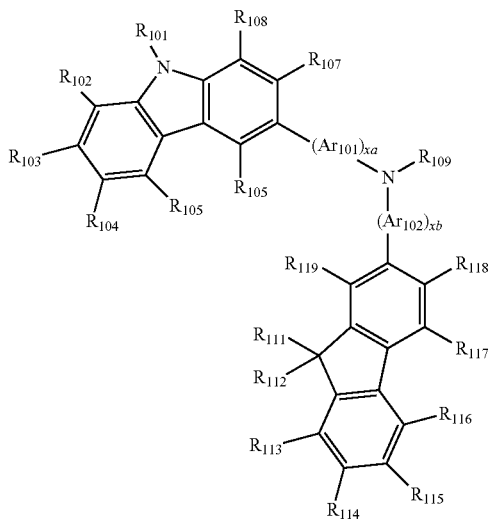

Formula 202

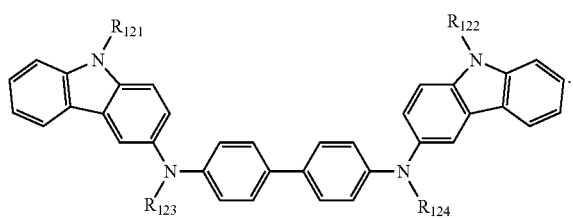

In Formula 201, $Ar_{101}$ and $Ar_{102}$ may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

In Formula 201, xa and xb may each independently be an integer selected from 0 to 5. For example, in Formula 201, xa may be 1, and xb may be 0, but xa and xb are not limited thereto.

In Formulae 201 and 202, $R_{101}$ to $R_{108}$, $R_{111}$ to $R_{119}$, and $R_{121}$ to $R_{124}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, or a hexyl group), and a $C_1$-$C_{10}$ alkoxy group (for example, a methoxy group, an ethoxy group, a propoxy group, butoxy group, or a pentoxy group);

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments are not limited thereto.

In Formula 201, $R_{109}$ may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In an embodiment, the compound represented by Formula 201 may be represented by Formula 201A, but is not limited thereto:

Formula 201A

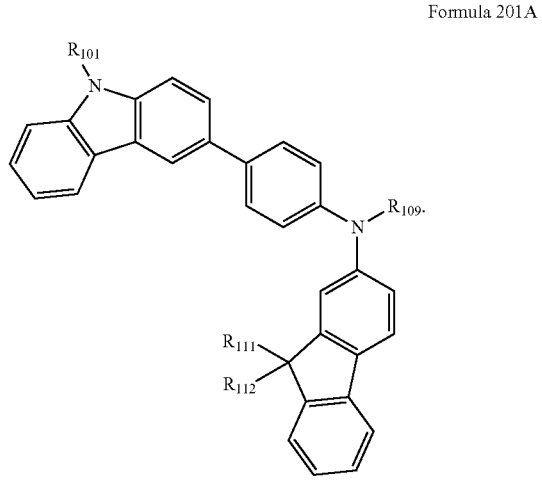

In Formula 201A, descriptions of $R_{101}$, $R_{111}$, $R_{112}$, and $R_{109}$ may each independently be understood by referring to the descriptions thereof in the present disclosure.
For example, the compound represented by Formula 201 and the compound represented by Formula 202 may each independently include Compounds HT1 to HT20, but are not limited thereto:
HT1
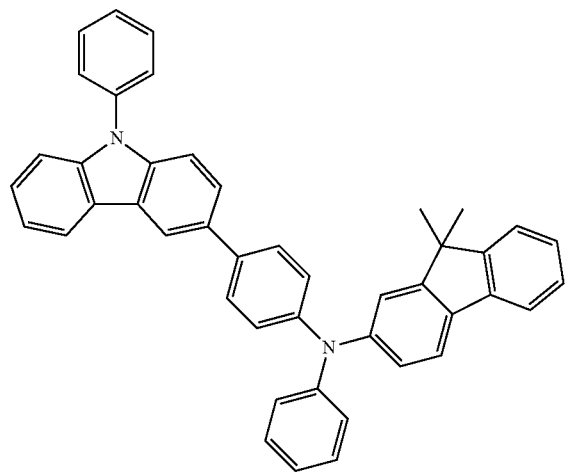
HT2
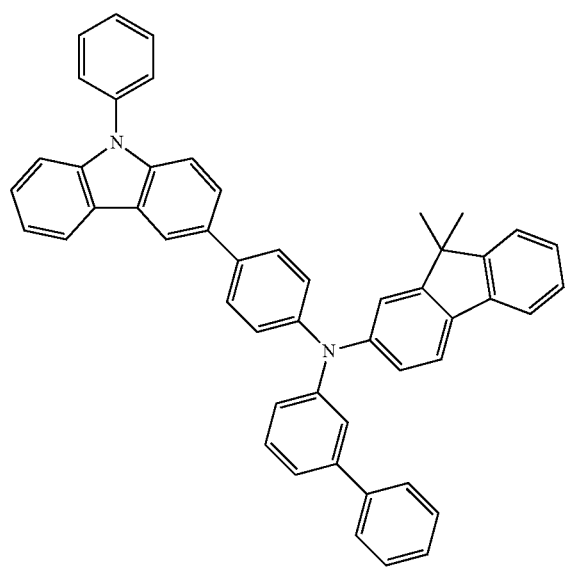
-continued
HT3
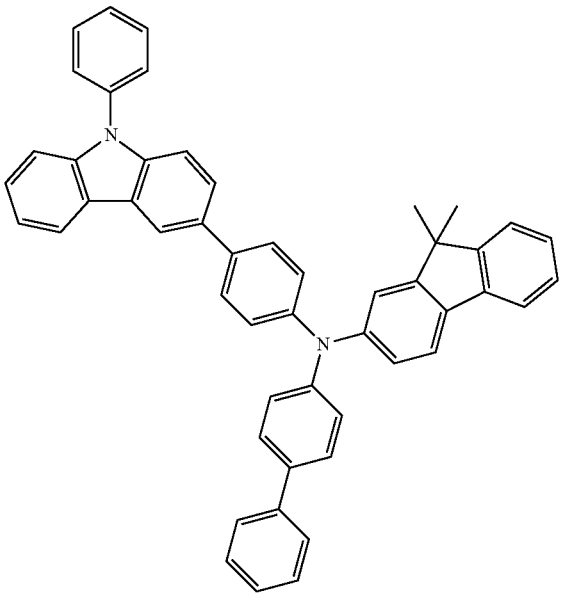
HT4

HT5
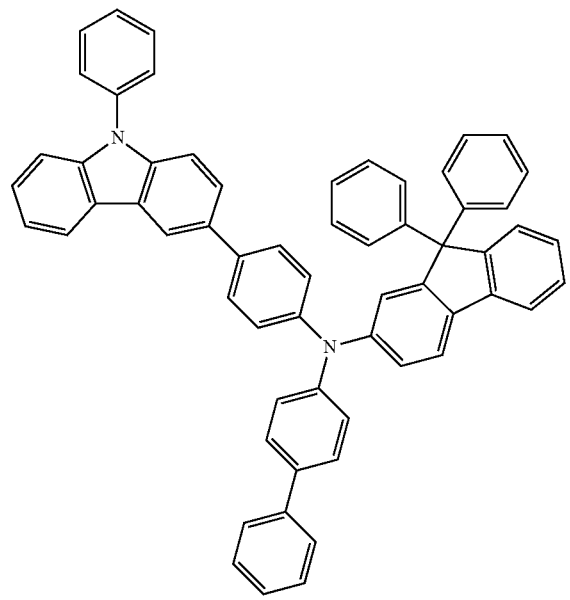
HT6
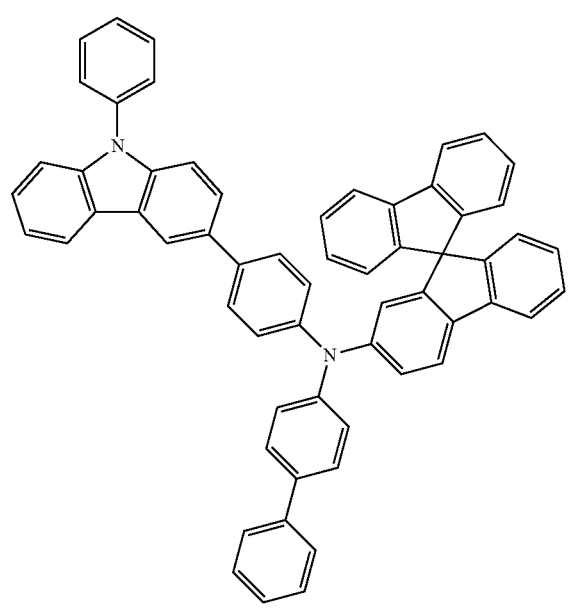
HT7
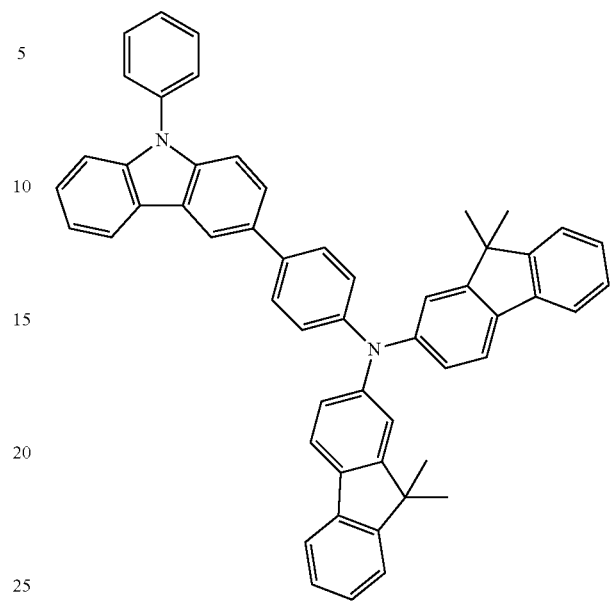
HT8
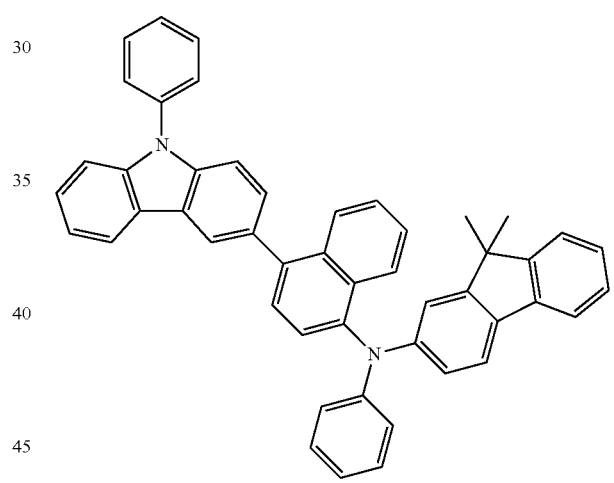
HT9
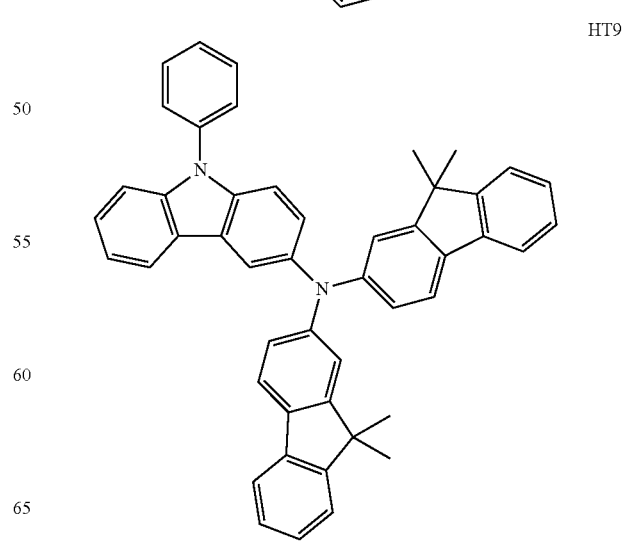

HT10
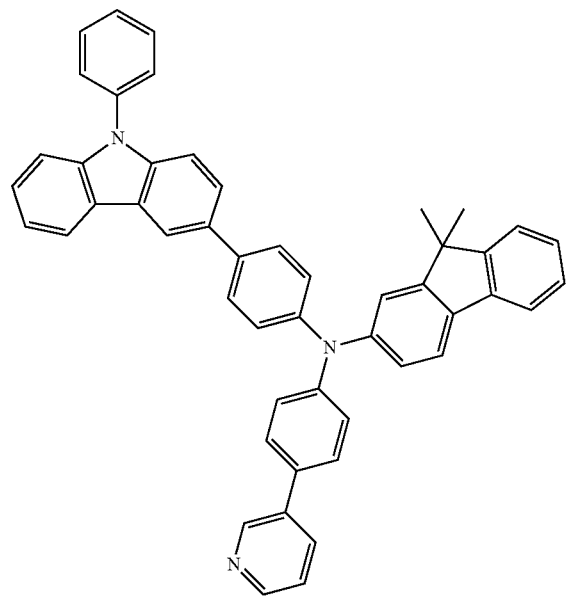
HT11
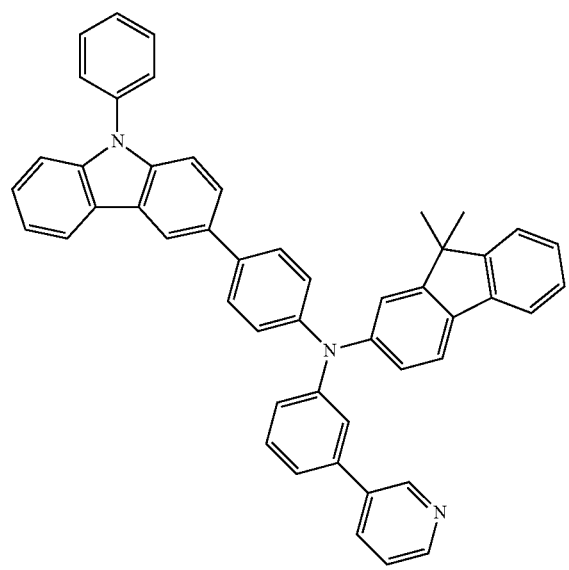
HT12
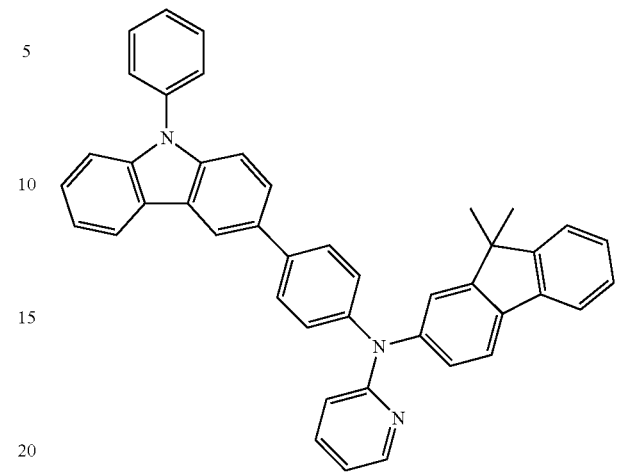
HT13
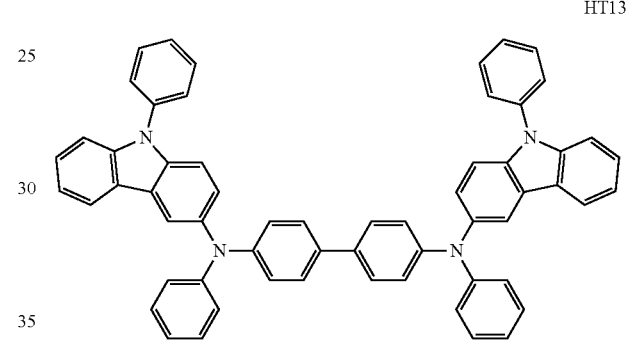
HT14
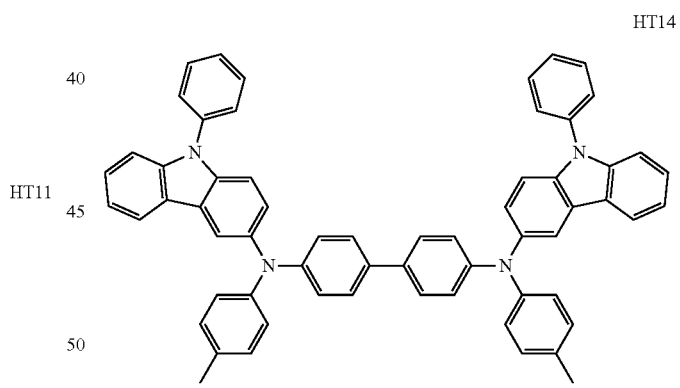
HT15
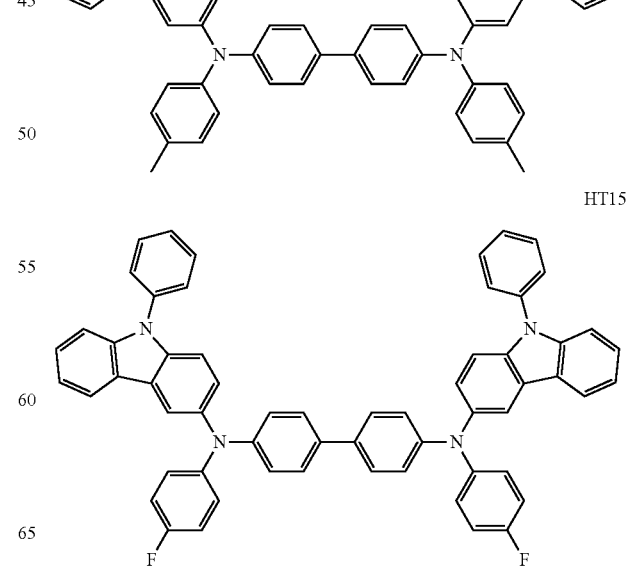

HT16

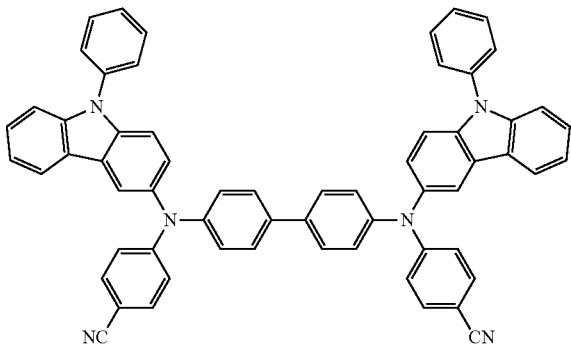

HT20

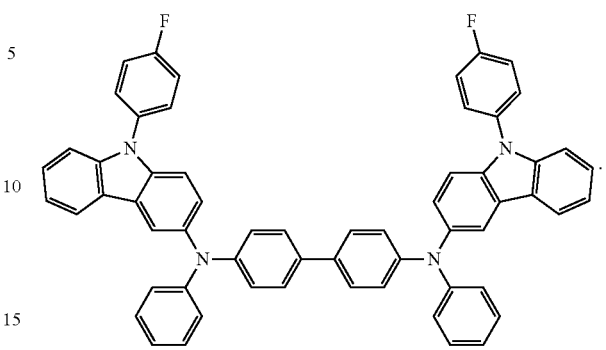

HT17

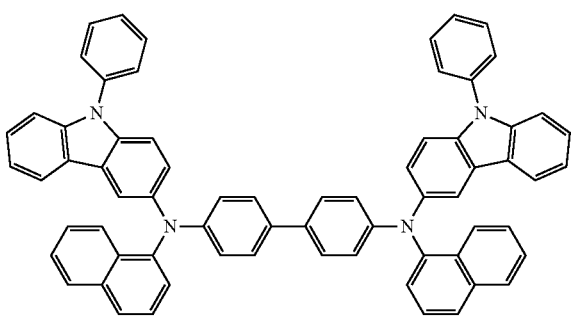

A thickness of the hole transport region may be in a range of about 100 Å to about 10,000 Å, for example, about 100 Å to about 1,000 Å. When the hole transport region includes at least one selected from a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within the ranges above, satisfactory hole transporting characteristics may be obtained without a substantial increase in driving voltage.

The hole transport region may further include, in addition to materials described above, a charge-generating material for the improvement of conductive properties. The charge-generating material may be homogeneously or non-homogeneously dispersed in the hole transport region.

The charge-generating material may be, for example, a p-dopant. The p-dopant may be selected from a quinone derivative, a metal oxide, and a cyano group-containing compound, but embodiments are not limited thereto. Examples of the p-dopant include quinone derivatives, such as tetracyanoquinonedimethane (TCNQ) and 2,3,5,6-tetrafluoro-tetracyano-1,4-benzoquinonedimethane (F4-TCNQ); metal oxides, such as tungsten oxide and molybdenum oxide; and cyano group-containing compounds, such as Compounds HT-D1 and HP-1, but embodiments are not limited thereto:

HT18

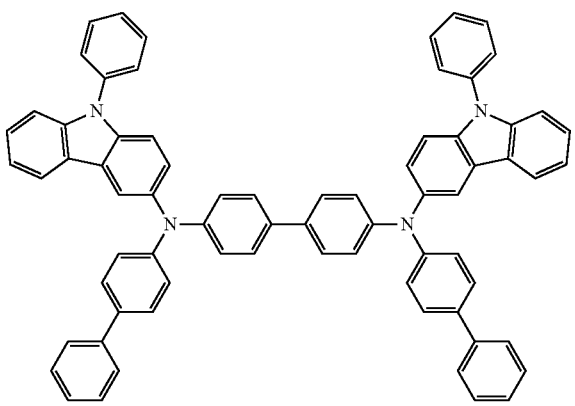

HT19

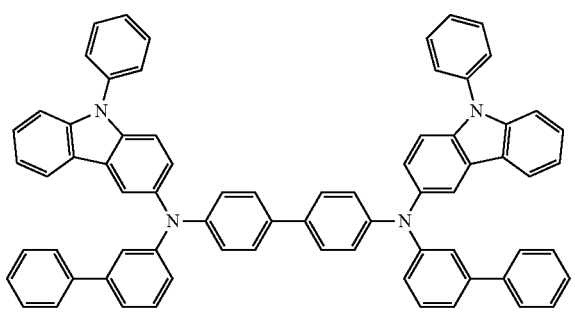

Compound HT-D1

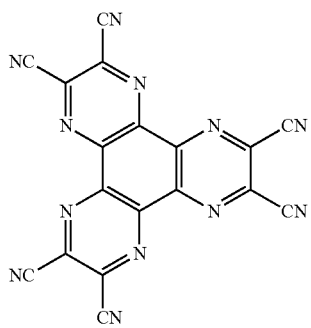

-continued

F4-TCNQ

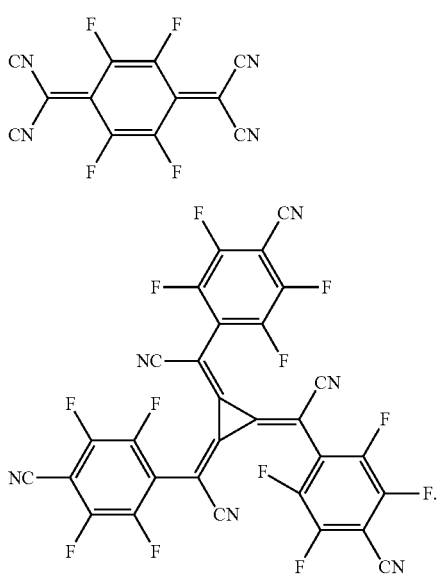

HP-1

The hole transport region may further include a buffer layer.

The buffer layer may compensate for an optical resonance distance according to a wavelength of light emitted from the emission layer, and thus a light-emission efficiency of the formed organic light-emitting device may be improved.

The hole transport region may further include an electron blocking layer. The electron blocking layer may include a material known in the art, for example, mCP, but embodiments are not limited thereto:

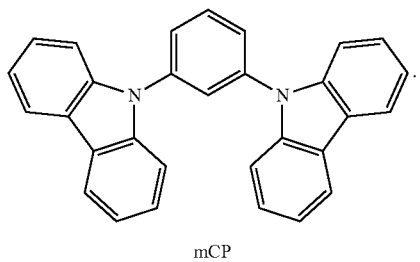 [SMILES: c1cc(-n2c3ccccc3c3ccccc32)cc(-n2c3ccccc3c3ccccc32)c1]

mCP

In various embodiments, the second compound represented by Formula 2 may be used as a material for the electron blocking layer.

The emission layer may be disposed on the hole transport region by utilizing various suitable methods, such as vacuum deposition, spin coating, casting, or LB deposition. When the emission layer is formed by vacuum deposition and spin coating, the deposition and coating conditions may vary according to a compound that is used to form the emission layer, but generally, may be determined by referring to the deposition and coating conditions for the hole injection layer.

When the organic light-emitting device 10 is a full-color organic light-emitting device, the emission layer may be patterned into a red emission layer, a green emission layer, and a blue emission layer. In various embodiments, the emission layer may have a structure in which a red emission layer, a green emission layer, and/or a blue emission layer are stacked on each other, to thereby emit white light.

The emission layer may include the thin film.

In an embodiment, the emission layer may include a host and a dopant. The host may include the composition including the first compound represented by Formula 1 and the second compound represented by Formula 2. The dopant may include a fluorescent dopant or a phosphorescent dopant. The amount of the composition included in the emission layer may be less than that of the fluorescent dopant the phosphorescent dopant. A description of the phosphorescent dopant may be understood by referring to the descriptions thereof in the present disclosure.

For example, the emission layer may have a single-layer structure including the thin film only, or a multi-layer structure including other additional emission layers known in the art.

A thickness of the emission layer may be in a range of about 100 Å to about 1,000 Å, for example, about 200 Å to about 600 Å. While not wishing to be bound by theory, it is understood that when the thickness of the emission layer is within the ranges above, the emission layer may have light-emitting characteristics without a substantial increase in driving voltage.

Next, the electron transport region may be disposed on the emission layer.

The electron transport region may include a hole blocking layer, an electron transport layer, an electron injection layer, or any combination thereof.

For example, the electron transport region may have a structure of hole blocking layer/electron transport layer/electron injection layer or a structure of electron transport layer/electron injection layer, but embodiments are not limited thereto. The electron transport layer may have a single-layer structure or a multi-layer structure including two or more layers that are different from each other.

Conditions for forming a hole blocking layer, an electron transport layer, and an electron injection layer in the electron transport region may be understood by referring to conditions for forming the hole injection layer.

When the electron transport region includes a hole blocking layer, the hole blocking layer may include, for example, at least one selected from BCP and Bphen, but embodiments are not limited thereto:

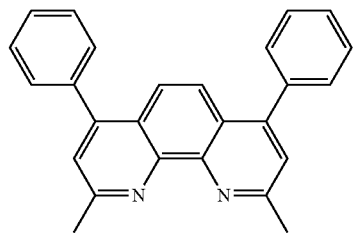

BCP

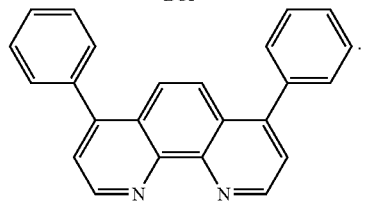

Bphen

In various embodiments, the first compound represented by Formula 1 may be used as a material for the hole blocking layer, but embodiments are not limited thereto.

A thickness of the hole blocking layer may be in a range of about 20 Å to about 1,000 Å, for example, about 30 Å to about 300 Å. When the thickness of the hole blocking layer is within the ranges above, satisfactory hole blocking characteristics may be obtained without a substantial increase in driving voltage.

The electron transport layer may further include at least one selected from BCP, Bphen, Alq$_3$, BAlq, TAZ, and NTAZ:

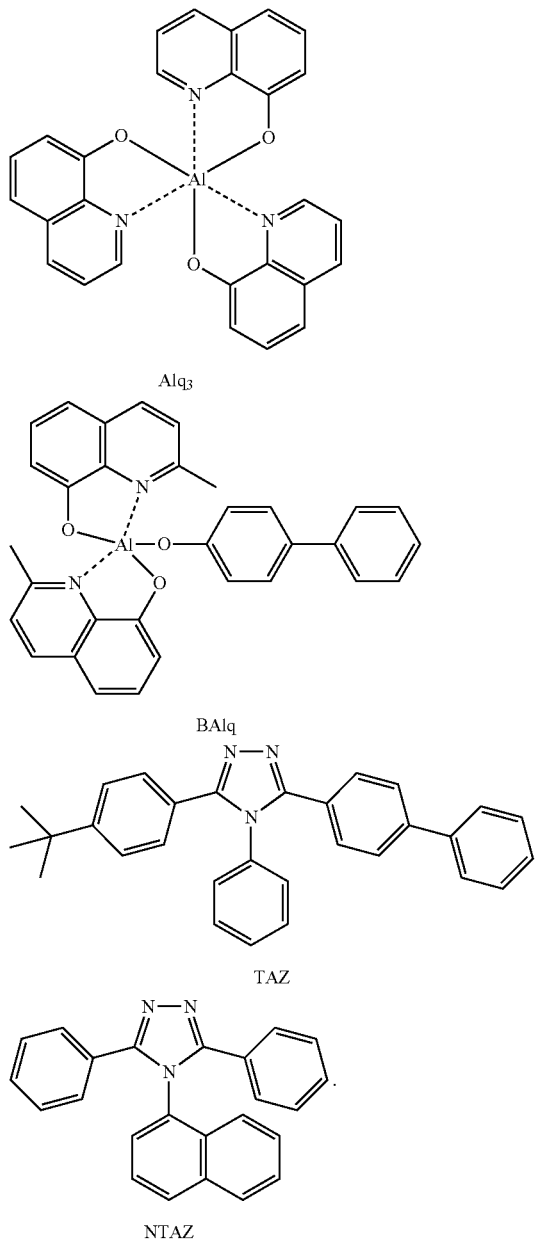

In various embodiments, a compound represented by Formula 40 or 41 may be used as an electron transporting material in the electron transport layer:

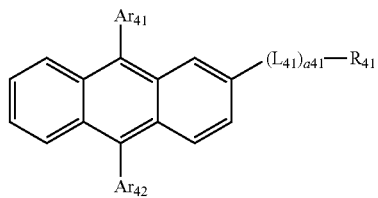

Formula 40

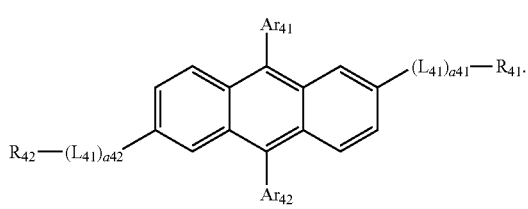

Formula 41

In Formulae 40 and 41, $L_{41}$ and $L_{42}$ may each independently be selected from:

a $C_6$-$C_{60}$ arylene group, a $C_2$-$C_{60}$ heteroarylene group, a divalent non-aromatic condensed polycyclic group, and a divalent non-aromatic condensed heteropolycyclic group; and a $C_6$-$C_{60}$ arylene group, a $C_2$-$C_{60}$ heteroarylene group, a divalent non-aromatic condensed polycyclic group, and a divalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, a41 and a42 may each independently be an integer selected from 0 to 5, $Ar_{41}$ and $Ar_{42}$ may each independently be selected from:

a $C_6$-$C_{60}$ aryl group, a $C_2$-$C_{60}$ heteroaryl group, a monovalent non-aromatic condensed polycyclic group, and a monovalent non-aromatic condensed heteropolycyclic group; and a $C_6$-$C_{60}$ aryl group, a $C_2$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, and $R_{41}$ and $R_{42}$ may each independently be selected from:

a benzimidazolyl group, a benzoxazolyl group, a benzothiazolyl group, a benzopyrimidinyl group, an imidazopyridinyl group, a quinolinyl group, an isoquinolinyl group, a quinazolinyl group, a pyridinyl group, a pyrimidinyl group, a pyrazinyl group, a phenyl group, a naphthyl group, a pyrenyl group, a chrysenyl group, a fluorenyl group, and a phenanthrenyl group; and a benzimidazolyl group, a benzoxazolyl group, a benzothiazolyl group, a benzopyrimidinyl group, an imidazopyridinyl group, a quinolinyl group, an isoquinolinyl group, a quinazolinyl group, a pyridinyl group, a pyrimidinyl group, a pyrazinyl group, a phenyl group, a naphthyl group, a pyrenyl group, a chrysenyl group, a fluorenyl group, and a phenanthrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a benzimidazolyl group, a benzoxazolyl group, a benzothiazolyl group, a benzopyrimidinyl group, an imidazopyridinyl group, a quinolinyl group, an isoquinolinyl group, a quinazolinyl group, a pyridinyl group, a pyrimidinyl group, a pyrazinyl group, a phenyl group, a naphthyl group, a pyrenyl group, a chrysenyl group, a fluorenyl group, and a phenanthrenyl group.

Descriptions of $L_{41}$ and $L_{42}$ in Formulae 40 and 41 may each independently refer to the description of $L_{11}$ in the present disclosure.

Alternatively, a compound represented by Formula 42 may be used as an electron transporting material in the electron transport layer:

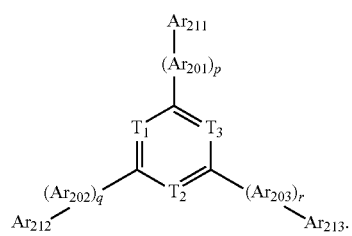

Formula 42

In Formula 42, $T_1$ may be N or $C(R_{201})$, $T_2$ may be N or $C(R_{202})$, and $T_3$ may be N or $C(R_{203})$, wherein at least one selected from $T_1$ to $T_3$ may be N, $R_{201}$ to $R_{203}$ may each independently be selected from: hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{60}$ aryl group, a $C_2$-$C_{60}$ heteroaryl group, a monovalent non-aromatic condensed polycyclic group, and a monovalent non-aromatic condensed heteropolycyclic group; and a $C_6$-$C_{60}$ aryl group, a $C_2$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, $Ar_{201}$ to $Ar_{203}$ may each independently be selected from:
a $C_6$-$C_{60}$ arylene group, a $C_2$-$C_{60}$ heteroarylene group, a divalent non-aromatic condensed polycyclic group, and a divalent non-aromatic condensed heteropolycyclic group; and a $C_6$-$C_{60}$ arylene group, a $C_2$-$C_{60}$ heteroarylene group, a divalent non-aromatic condensed polycyclic group, and a divalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, p, q, and r may each independently be 0, 1 or 2, and $Ar_{211}$ to $Ar_{213}$ may each independently be selected from:
a $C_6$-$C_{60}$ aryl group, a $C_2$-$C_{60}$ heteroaryl group, a monovalent non-aromatic condensed polycyclic group, and a monovalent non-aromatic condensed heteropolycyclic group; and a $C_6$-$C_{60}$ aryl group, a $C_2$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group.

In an embodiment, at least two selected from $T_1$ to $T_3$ in Formula 42 may be N.

In various embodiments, all of $T_1$ to $T_3$ in Formula 42 may be N.

In Formula 42, $Ar_{201}$ to $Ar_{203}$ may each independently be selected from:
a phenylene group, a naphthylene group, an anthrylene group, a pyrenylene group, a fluorenylene group, a triphenylenyl group, a pyridinylene group, and a pyrimidinylene group; and a phenylene group, a naphthylene group, an anthrylene group, a pyrenylene group, a fluorenylene group, a triphenylenyl group, a pyridinylene group, and a pyrimidinylene group, each substituted with at least one selected from a phenyl group, a naphthyl group, an anthryl group, a pyrenyl group, a fluorenyl group, a triphenylenyl group, a pyridinyl group, and a pyrimidinyl group, but embodiments are not limited thereto.

In Formula 42, p, q, and r may each independently be 0, 1, or 2. For example, in Formula 42, p, q, and r may each independently be 0 or 1, but embodiments are not limited thereto.

In Formula 42, $Ar_{211}$ to $Ar_{213}$ may each independently be selected from:
a phenyl group, a naphthyl group, a pyrenyl group, a chrysenyl group, a fluorenyl group, a phenanthrenyl group, a benzimidazolyl group, a benzoxazolyl group, a benzothiazolyl group, a benzopyrimidinyl group, an imidazopyrimidinyl group, a quinolinyl group, an isoquinolinyl group, a quinazolinyl group, a pyridinyl group, a pyrimidinyl group, a pyrazinyl group, and a triazinyl group; and a phenyl group, a naphthyl group, a pyrenyl group, a chrysenyl group, a fluorenyl group, a phenanthrenyl group, a benzimidazolyl group, a benzoxazolyl group, a benzothiazolyl group, a benzopyrimidinyl group, an imidazopyrimidinyl group, a quinolinyl group, an isoquinolinyl group, a quinazolinyl group, a pyridinyl group, a pyrimidinyl group, a pyrazinyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, but embodiments are not limited thereto.

In an embodiment, at least one selected from $Ar_{211}$ to $Ar_{213}$ in Formula 42 may be selected from:

a benzimidazolyl group, a benzoxazolyl group, a benzothiazolyl group, a benzopyrimidinyl group, an imidazopyrimidinyl group, a quinolinyl group, an isoquinolinyl group, a quinazolinyl group, a pyridinyl group, a pyrimidinyl group, a pyrazinyl group, and a triazinyl group; and a benzimidazolyl group, a benzoxazolyl group, a benzothiazolyl group, a benzopyrimidinyl group, an imidazopyrimidinyl group, a quinolinyl group, an isoquinolinyl group, a quinazolinyl group, a pyridinyl group, a pyrimidinyl group, a pyrazinyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, but embodiments are not limited thereto.

In various embodiments, at least one selected from $Ar_{21}$ to $Ar_{213}$ in Formula 42 may be a substituted or unsubstituted phenanthrenyl group.

For example, the electron transport layer may include at least one selected from Compounds ET1 to ET17, but embodiments are not limited thereto:

Compound ET1

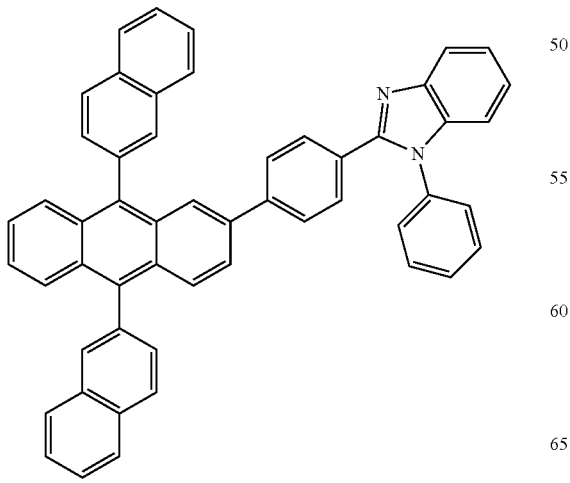

Compound ET2

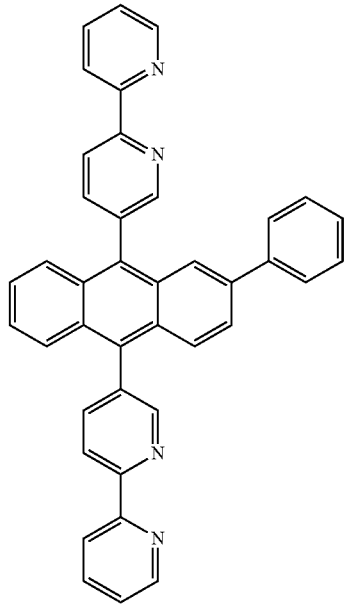

Compound ET3

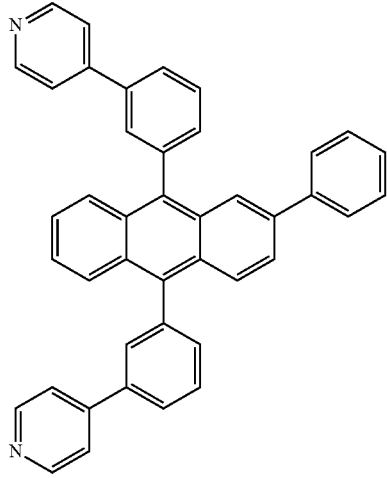

Compound ET4

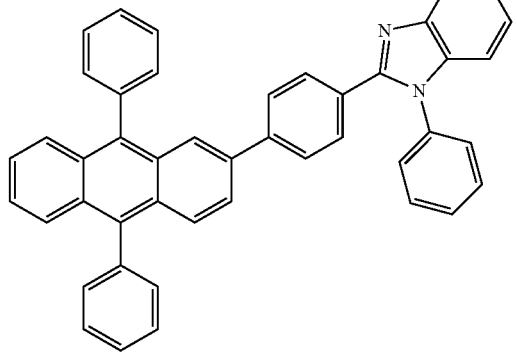

Compound ET5
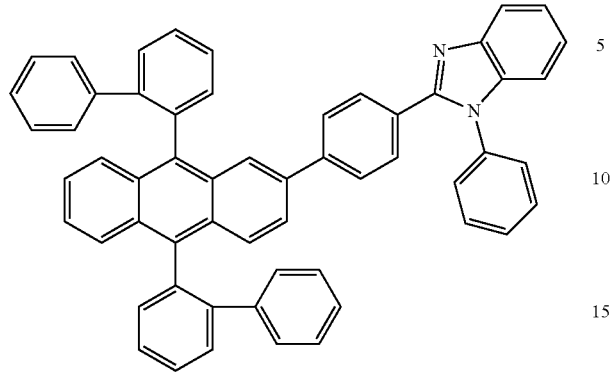
Compound ET6
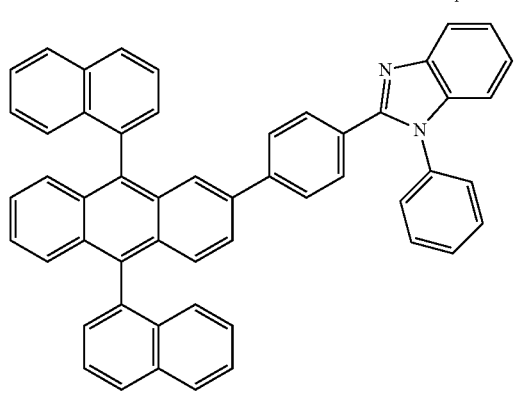
Compound ET7
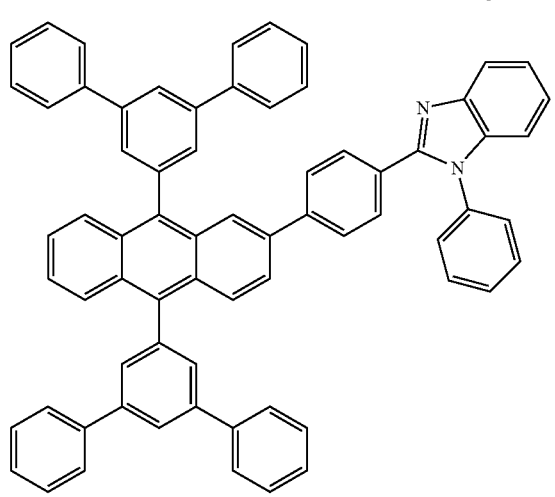
Compound ET8
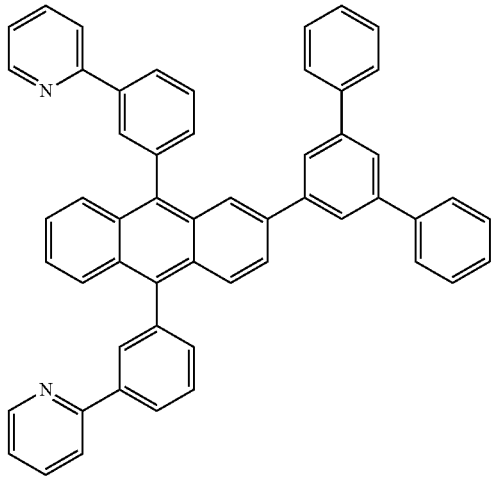
Compound ET8
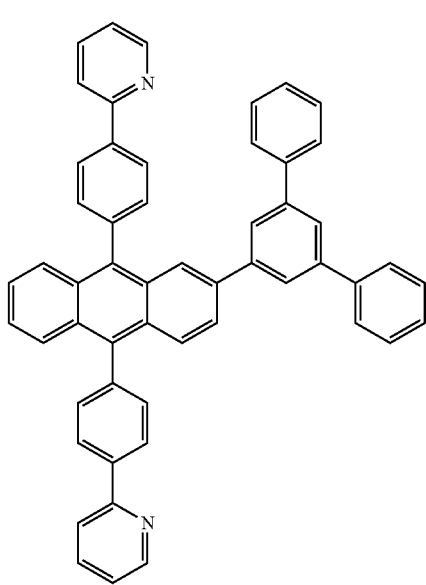

Compound ET10
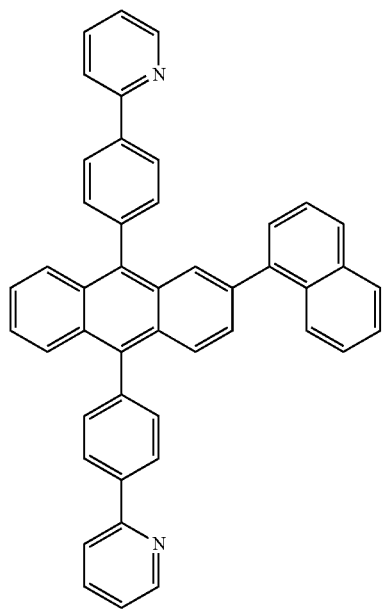
Compound ET13
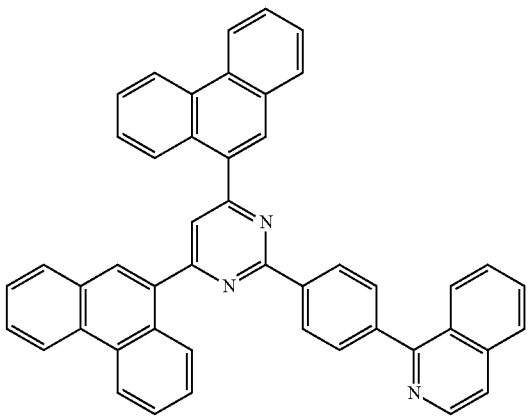
Compound ET11
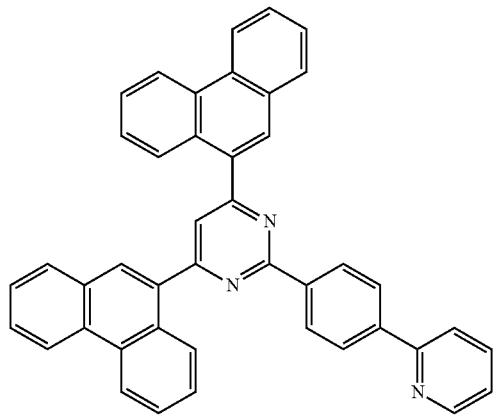
Compound ET14
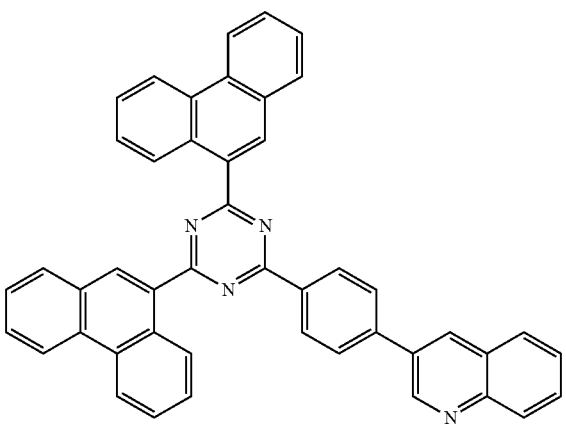
Compound ET12
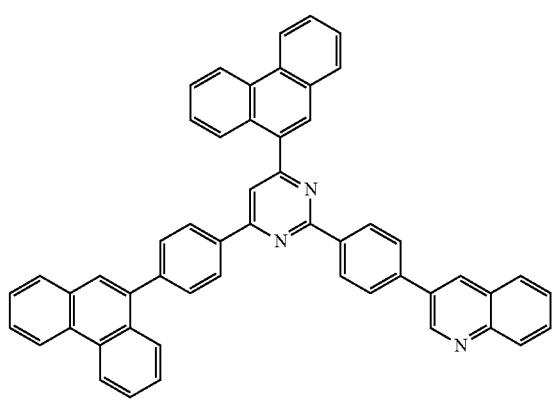
Compound ET15
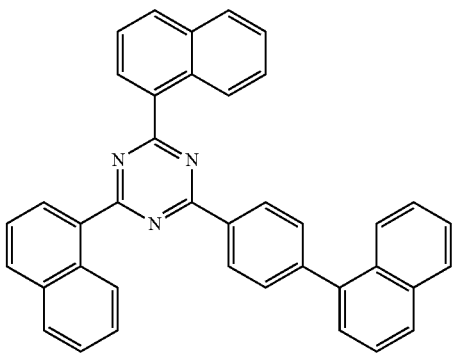

-continued

Compound ET16

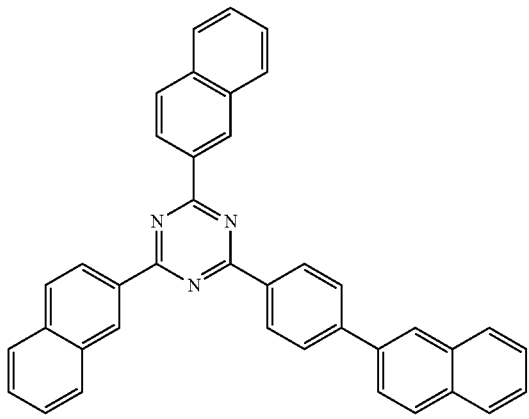

Compound ET17

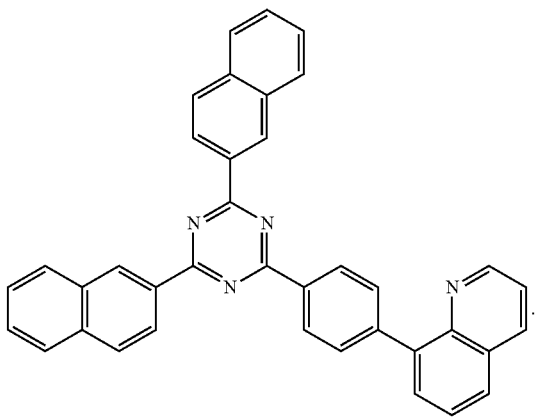

A thickness of the electron transport layer may be in a range of about 100 Å to about 1,000 Å, for example, about 150 Å to about 500 Å. While not wishing to be bound by theory, it is understood that when the thickness of the electron transport layer is within the ranges above, satisfactory electron transport characteristics may be obtained without a substantial increase in driving voltage.

The electron transport layer may further include, in addition to the materials described above, a metal-containing material.

The metal-containing material may include a Li complex. The Li complex may include, for example, Compound ET-D1 (lithium quinolinolate (LiQ)) or Compound ET-D2:

ET-D1

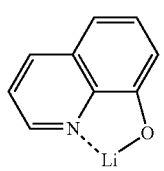

ET-D2

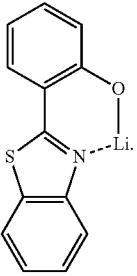

In addition, the electron transport region may include an electron injection layer that facilitates electron injection from the second electrode 19.

The electron injection layer may include at least one selected from LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the ranges above, satisfactory electron injection characteristics may be obtained without a substantial increase in driving voltage.

The second electrode 19 may be disposed on the organic layer 15. The second electrode 19 may be a cathode. A material for forming the second electrode 19 may be selected from metal, an alloy, an electrically conductive compound, and a combination thereof, which have a relatively low work function. For example, Li, Mg, Al, Al—Li, Ca, Mg—In, or Mg—Ag may be used as a material for forming the second electrode 19. In various embodiments, to manufacture a top emission-type light-emitting device, a transmissive electrode formed using ITO or IZO may be used as the second electrode 19.

Hereinbefore, the organic light-emitting device 10 has been described with reference to FIG. 1, but is not limited thereto.

A $C_1$-$C_{60}$ alkyl group as used herein refers to a linear or branched aliphatic saturated hydrocarbon monovalent group having 1 to 60 carbon atoms. Detailed examples thereof are a methyl group, an ethyl group, a propyl group, an iso-butyl group, a sec-butyl group, a tert-butyl group, a pentyl group, an iso-amyl group, and a hexyl group. A $C_1$-$C_{60}$ alkylene group as used herein refers to a divalent group having the same structure as the $C_1$-$C_{60}$ alkyl group.

A $C_1$-$C_{60}$ alkoxy group as used herein refers to a monovalent group represented by —$OA_{101}$ (wherein $A_{101}$ is the $C_1$-$C_{60}$ alkyl group). Detailed examples thereof are a methoxy group, an ethoxy group, and an iso-propyloxy (iso-propoxy) group.

A $C_2$-$C_{60}$ alkenyl group as used herein refers to a hydrocarbon group formed by including at least one carbon-carbon double bond in the middle or at the terminal of the $C_2$-$C_{60}$ alkyl group. Detailed examples thereof are an ethenyl group, a propenyl group, and a butenyl group. A $C_2$-$C_{60}$ alkenylene group as used herein refers to a divalent group having the same structure as the $C_2$-$C_{60}$ alkenyl group.

A $C_2$-$C_{60}$ alkynyl group as used herein refers to a hydrocarbon group formed by including at least one carbon-carbon triple bond in the middle or at the terminal of the $C_2$-$C_{60}$ alkyl group. Detailed examples thereof are an ethynyl group, and a propynyl group. A $C_2$-$C_{60}$ alkynylene group as used herein refers to a divalent group having the same structure as the $C_2$-$C_{60}$ alkynyl group.

A $C_3$-$C_{10}$ cycloalkyl group as used herein refers to a monovalent saturated hydrocarbon monocyclic group having 3 to 10 carbon atoms. Detailed examples thereof are a cyclopropyl group, a cyclobutyl group, a cyclopentyl group, a cyclohexyl group, and a cycloheptyl group. A $C_3$-$C_{10}$ cycloalkylene group as used herein refers to a divalent group having the same structure as the $C_3$-$C_{10}$ cycloalkyl group.

A $C_1$-$C_{10}$ heterocycloalkyl group as used herein refers to a monovalent saturated monocyclic group having at least one heteroatom selected from N, O, P, Si, and S as a ring-forming atom and 1 to 10 carbon atoms. Detailed examples thereof are a tetrahydrofuranyl group and a tetrahydrothiophenyl group. A $C_1$-$C_{10}$ heterocycloalkylene group as used herein refers to a divalent group having the same structure as the $C_1$-$C_{10}$ heterocycloalkyl group.

A $C_3$-$C_{10}$ cycloalkenyl group as used herein refers to a monovalent monocyclic group that has 3 to 10 carbon atoms and at least one carbon-carbon double bond in the ring thereof and does not have aromaticity, and detailed examples thereof are a cyclopentenyl group, a cyclohexenyl group, and a cycloheptenyl group. A $C_3$-$C_{10}$ cycloalkenylene group as used herein refers to a divalent group having the same structure as the $C_3$-$C_{10}$ cycloalkenyl group.

A $C_1$-$C_{10}$ heterocycloalkenyl group as used herein refers to a monovalent monocyclic group that has at least one heteroatom selected from N, O, P, Si, and S as a ring-forming atom, 1 to 10 carbon atoms, and at least one double bond in its ring. Detailed examples of the $C_1$-$C_{10}$ heterocycloalkenyl group are 2,3-dihydrofuranyl group and 2,3-dihydrothiophenyl group. A $C_1$-$C_{10}$ heterocycloalkenylene group as used herein refers to a divalent group having the same structure as the $C_1$-$C_{10}$ heterocycloalkenyl group.

A $C_6$-$C_{60}$ aryl group as used herein refers to a monovalent group having a carbocyclic aromatic system having 6 to 60 carbon atoms, and a $C_6$-$C_{60}$ arylene group as used herein refers to a divalent group having a carbocyclic aromatic system having 6 to 60 carbon atoms. Detailed examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

A $C_1$-$C_{60}$ heteroaryl group as used herein refers to a monovalent group having an heterocyclic aromatic system that has at least one heteroatom selected from N, O, P, Si, and S as a ring-forming atom, and 1 to 60 carbon atoms. A $C_1$-$C_{60}$ heteroarylene group as used herein refers to a divalent group having an aromatic system that has at least one heteroatom selected from N, O, P, Si, and S as a ring-forming atom and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

A $C_6$-$C_{60}$ aryloxy group as used herein indicates —$OA_{102}$ (wherein $A_{102}$ is the $C_6$-$C_{60}$ aryl group), a $C_6$-$C_{60}$ arylthio group as used herein indicates —$SA_{103}$ (wherein $A_{103}$ is the $C_6$-$C_{60}$ aryl group), and a $C_7$-$C_{60}$ arylalkyl group as used herein indicates -$A_{104}A_{105}$ (wherein $A_{104}$ is the $C_1$-$C_{54}$ alkylene group and $A_{105}$ is the $C_6$-$C_{59}$ aryl group).

A monovalent non-aromatic condensed polycyclic group as used herein refers to a monovalent group (for example, having 8 to 60 carbon atoms) that has two or more rings condensed to each other, only carbon atoms as a ring forming atom, and non-aromaticity in the entire molecular structure. A detailed example of the monovalent non-aromatic condensed polycyclic group is a fluorenyl group. A divalent non-aromatic condensed polycyclic group as used herein refers to a divalent group having the same structure as the monovalent non-aromatic condensed polycyclic group.

A monovalent non-aromatic condensed heteropolycyclic group as used herein refers to a monovalent group (for example, having 1 to 60 carbon atoms) that has two or more rings condensed to each other, has a heteroatom selected from N, O, P, Si, and S, other than carbon atoms, as a ring forming atom, and which is non-aromatic in the entire molecular structure. An example of the monovalent non-aromatic condensed heteropolycyclic group is a carbazolyl group. A divalent non-aromatic condensed heteropolycyclic group as used herein refers to a divalent group having the same structure as the monovalent non-aromatic condensed heteropolycyclic group.

At least one of substituent(s) of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a biphenyl group, a terphenyl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, and —$Si(Q_{61})(Q_{62})(Q_{63})$, wherein $Q_1$ to $Q_3$, $Q_{11}$ to $Q_{13}$, $Q_{21}$ to $Q_{23}$, $Q_{31}$ to $Q_{33}$, $Q_{41}$ to $Q_{43}$, $Q_{51}$ to $Q_{53}$, and $Q_{61}$ to $Q_{63}$ may each independently be selected from hydrogen, deuterium, a $C_1$-$C_{60}$ alkyl group, a $C_1$-$C_{60}$ alkoxy group, a phenyl group, a biphenyl group, a terphenyl group, a naphthyl group, and an anthracenyl group.

When a group containing a specified number of carbon atoms is substituted with any of the groups listed in the preceding paragraphs, the number of carbon atoms in the resulting "substituted" group is defined as the sum of the carbon atoms contained in the original (unsubstituted) group and the carbon atoms (if any) contained in the substituent. For example, when the term "substituted $C_1$-$C_{60}$ alkyl" refers to a $C_1$-$C_{60}$ alkyl group substituted with $C_6$-$C_{60}$ aryl group, the total number of carbon atoms in the resulting aryl substituted alkyl group is $C_7$-$C_{120}$.

The term "room temperature" as used herein refers to a temperature of about 25° C.

The term "biphenyl group" as used herein refers to a monovalent group in which two benzene rings are linked together via a single bond.

The term "terphenyl group" as used herein refers to a monovalent group in which three benzene rings are linked together via a single bond.

Hereinafter, an organic light-emitting device according to one or more embodiments of the present inventive concept will be described in more detail with reference to Synthesis Examples and Examples. The expression "B was used instead of A" used in describing Synthesis Examples may refer to a molar equivalent of A, which is identical to a molar equivalent of B. The expression "eq" may refer to a molar equivalent.

EXAMPLES

Evaluation Example 1

Evaluation of Photoluminescence Quantum Yield (PLQY)

A $CH_2Cl_2$ solution of polymethyl methacrylate (PMMA) was mixed with 8 percent by weight (wt %) of a mixture of Compound E-8, Compound H-16, and FIr6 (a volume ratio of Compounds E-8 to H-16 was 7:3, and a weight of FIr6 was 10 wt % based on 100 wt % of total weights of Compound E-8, Compound H-16 and FIr6), and the resulting product was coated on a quartz substrate by using a spin coater. The quartz substrate was subjected to a heat treatment in an oven at a temperature of 80° C., and cooled to room temperature, thereby manufacturing Film 1. Films 2 and 3 and Comparative Film A were additionally manufactured by using composition variations as shown in Table 2.

The luminescence quantum yields in Films 1 to 3 and Comparative Film A were each measured and evaluated by using a Hamamatsu Photonics absolute PL quantum yield measurement system equipped with a xenon light source, a monochromator, a photonic multichannel analyzer, and an integrating sphere, and utilizing PLQY measurement software (Hamamatsu Photonics, Ltd., Shizuoka, Japan). The results are summarized in Table 2.

TABLE 2

|  | The first compound | The second compound | Phosphorescent dopant | Volume ratio of the first compound to the second compound | PLQY in film |
| --- | --- | --- | --- | --- | --- |
| Film 1 | Compound E-8 | Compound H-16 | FIr6 (10 wt %) | 7:3 | 0.619 |
| Film 2 | Compound E-2 | Compound H-16 | FIr6 (10 wt %) | 7:3 | 0.621 |
| Film 3 | Compound E-5 | Compound H-16 | FIr6 (10 wt %) | 7:3 | 0.596 |
| Comparative film A | Compound B | Compound H-2 | FIr6 (10 wt %) | 7:3 | 0.365 |

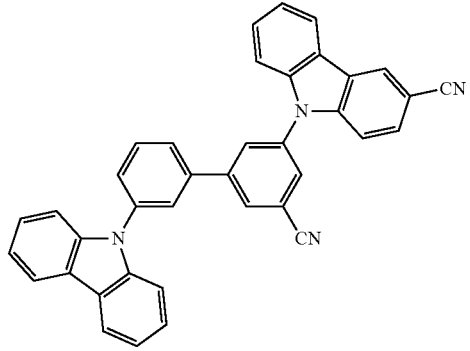 [SMILES: N#Cc1cc(-c2cccc(-n3c4ccccc4c4ccccc43)c2)cc(-n2c3ccccc3c3cc(C#N)ccc32)c1]

E-8

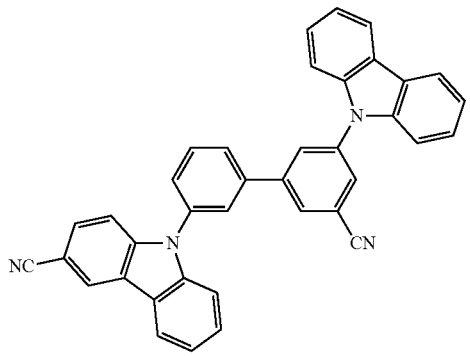 [SMILES: N#Cc1cc(-c2cccc(-n3c4ccccc4c4cc(C#N)ccc43)c2)cc(-n2c3ccccc3c3ccccc32)c1]

E-2

TABLE 2-continued

|  The first compound | The second compound | Phosphorescent dopant | Volume ratio of the first compound to the second compound | PLQY in film |
| --- | --- | --- | --- | --- |

E-5

Compound B

H-16

H-2

Based on the results shown in Table 2, it was determined that the PLQY values of Films 1 to 3 each utilizing Compounds E-8, E-2, and E-5 that are formed of two carbazole rings, were higher than the PLQY value of Comparative Film A utilizing Compound B that is formed of only one carbazole ring.

Example 1

As a substrate and an anode, a glass substrate, on which an indium tin oxide (ITO) electrode was formed, was cut into a size of 50 millimeters (mm)×50 mm×0.5 mm, ultrasonically washed with acetone, iso-propyl alcohol and pure water, each for 15 minutes, and washed by exposure to UV ozone for 30 minutes.

Compounds HT3 and HP-1 (a concentration of Compound HP-1 was 3 wt %) were co-deposited on the anode to form a hole injection layer having a thickness of 100 Angstroms (Å), and Compound HT3 was deposited on the hole injection layer to form a hole transport layer having at thickness of 1,350 Å. Compound H-16 was deposited on the hole transport layer to form an electron blocking layer having a thickness of 100 Å, thereby forming a hole transport region.

Compounds E-8 and Compound H-16 each as a host and FIr6 as a phosphorescent dopant were co-deposited on the hole transport region to form an emission layer having a thickness of 300 Å (compositions of the emission layer are shown in Table 3).

mCP was vacuum deposited on the emission layer to form a hole blocking layer having a thickness of 100 Å, and Compound ET17 and LiQ were co-deposited on the hole blocking layer at a weight ratio of 5:5 to form an electron transport layer having a thickness of 300 Å. Then, LiQ was deposited on the electron transport layer to form an electron injection layer having a thickness of 10 Å, and Al was formed on the electron injection layer to a thickness of 1,000 Å, thereby completing the manufacture of an organic light-emitting device.

Examples 2 to 6 and Comparative Examples A to D

Organic light-emitting devices were manufactured in the same manner as in Example 1, except that in forming the emission layer, hosts and dopants shown in Table 3 were respectively used.

TABLE 3

| | Host | | Phosphorescent dopant | Volume ratio of the first compound to the second compound |
|---|---|---|---|---|
| | The first compound | The second compound | | |
| Example 1 | Compound E-8 | Compound H-16 | FIr6 (10 wt %) | 7:3 |
| Example 2 | Compound E-2 | Compound H-16 | FIr6 (10 wt %) | 7:3 |
| Example 3 | Compound E-5 | Compound H-16 | FIr6 (10 wt %) | 7:3 |
| Example 4 | Compound E-8 | Compound H-16 | FIr6 (10 wt %) | 1:9 |
| Example 5 | Compound E-8 | Compound H-16 | FIr6 (10 wt %) | 5:5 |
| Example 6 | Compound E-8 | Compound H-24 | FIr6 (10 wt %) | 5:5 |
| Comparative Example A | mCP | | FIr6 (10 wt %) | — |
| Comparative Example B | Compound C | | FIr6 (10 wt %) | — |
| Comparative Example C | Compound B | Compound H-16 | FIr6 (10 wt %) | 5:5 |
| Comparative Example D | Compound B | Compound H-16 | FIr6 (10 wt %) | 7:3 |

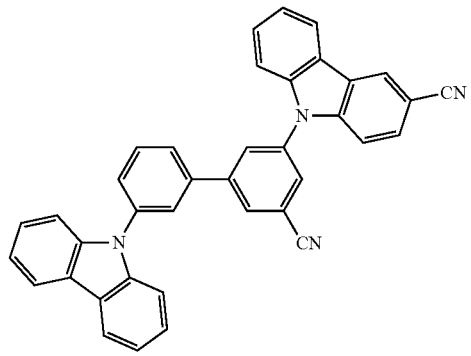 [SMILES: N#Cc1cc(-c2cccc(-n3c4ccccc4c4ccccc43)c2)cc(-n2c3ccccc3c3cc(C#N)ccc32)c1]

E-8

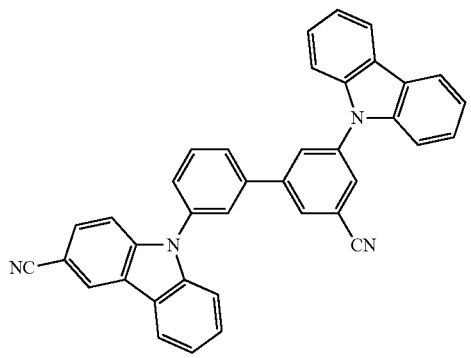 [SMILES: N#Cc1cc(-c2cccc(-n3c4ccccc4c4cc(C#N)ccc43)c2)cc(-n2c3ccccc3c3ccccc32)c1]

E-2

E-5

TABLE 3-continued

| Host | | Volume ratio of the first |
|---|---|---|
| The first compound | The second compound | Phosphorescent compound to the second dopant compound |

H-16

H-24

Compound B mCP

Compound C

TABLE 3-continued

| Host | | | Volume ratio of the first |
|---|---|---|---|
| The first compound | The second compound | Phosphorescent dopant | compound to the second compound |

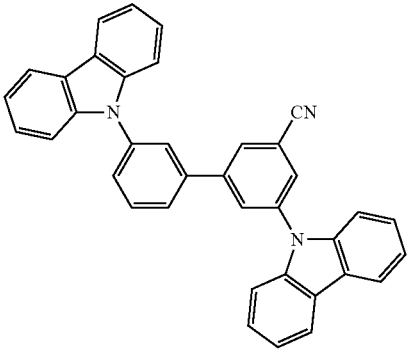

Evaluation Example 2: Evaluation of Characteristics of Organic Light-Emitting Devices The driving voltage, luminescent efficiency, power efficiency, quantum efficiency and lifespan ($T_{95}$) characteristics of the organic light-emitting devices of Examples 1 to 6 and Comparative Examples A to D were measured by using a current-voltage measuring meter (Keithley 2400) and a brightness measuring meter (Minolta Cs-1000A), and results thereof are shown in Table 4. Here, the lifespan $T_{70}$ (at 500 nit) results were obtained by measuring the time at which the brightness of the organic light-emitting devices reached 70% of the initial brightness (that is, 100%).

Based on the results shown in Table 4, it was determined that the organic light-emitting devices of Examples 1 to 6 had lower driving voltage, higher luminescent efficiency, higher power efficiency, higher quantum efficiency and longer lifespan than those of the organic light-emitting devices of Comparative Examples A to D.

An organic light-emitting device according to the one or more embodiments includes a composition or a thin film including a first compound and a second compound, and accordingly, has low driving voltage, high luminescent efficiency, high power efficiency, high quantum efficiency and long lifespan at the same time.

TABLE 4

| | Host | | Phosphorescent dopant | Driving voltage (V) | Luminescent Efficiency (cd/A) | Power efficiency (Lm/W) | Quantum efficiency (QE, %) | Lifespan ($T_{70}$) (hr) |
|---|---|---|---|---|---|---|---|---|
| | First compound | Second compound | | | | | | |
| Example 1 | Compound E-8 | Compound H-16 | FIr6 | 4.05 | 31.6 | 24.5 | 20.1 | 135 |
| Example 2 | Compound E-2 | Compound H-16 | FIr6 | 4.08 | 30.4 | 23.4 | 19.3 | 123 |
| Example 3 | Compound E-5 | Compound H-16 | FIr6 | 3.93 | 30.1 | 24.0 | 19.1 | 100 |
| Example 4 | Compound E-8 | Compound H-16 | FIr6 | 3.98 | 30.5 | 24.1 | 19.4 | 110 |
| Example 5 | Compound E-8 | Compound H-16 | FIr6 | 4.16 | 34.3 | 25.9 | 21.8 | 124 |
| Example 6 | Compound E-8 | Compound H-24 | FIr6 | 4.06 | 31.8 | 24.6 | 20.2 | 148 |
| Comparative Example A | mCP | | FIr6 | 6.31 | 28.3 | 14.1 | 18.0 | 15 |
| Comparative Example B | Compound C | | FIr6 | 5.23 | 12.1 | 7.3 | 7.7 | 3 |
| Comparative Example C | Compound B | Compound H-16 | FIr6 | 6.14 | 11.3 | 5.8 | 7.2 | 1 |
| Comparative Example D | Compound B | Compound H-16 | FIr6 | 6.58 | 10.8 | 5.2 | 6.9 | 2 |

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. A composition comprising:
a first compound represented by Formula 1; and
a second compound represented by Formula 2:

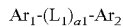   Formula 1

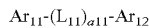   Formula 2

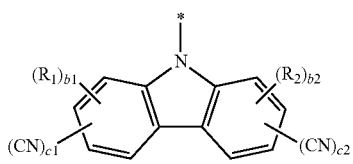   Formula 11

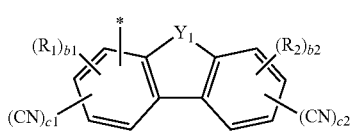   Formula 12

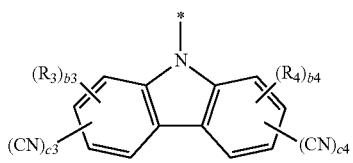   Formula 13

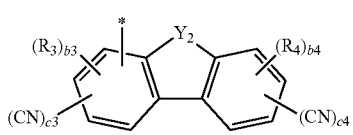   Formula 14

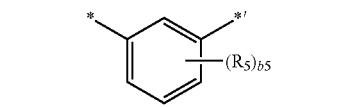   Formula 15

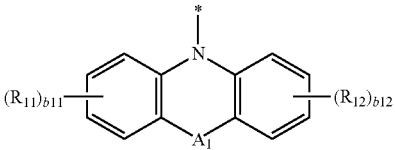   Formula 21

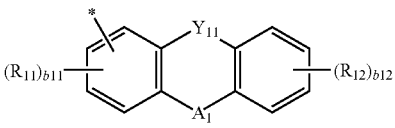   Formula 22

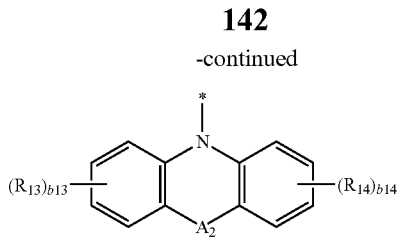   Formula 23

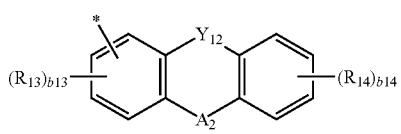   Formula 24 wherein
$Ar_1$ in Formula 1 is a group represented by Formula 11 or 12,
$Ar_2$ in Formula 1 is a group represented by Formula 13 or 14,
$Y_1$ in Formula 12 is O, S, or $N(R_{21})$,
$Y_2$ in Formula 14 is O, S, or $N(R_{22})$,
$L_1$ in Formula 1 is a group represented by Formula 15,
a1 in Formula 1 is an integer selected from 1 to 5, wherein when a1 is two or more, two or more groups $L_1$ are identical to or different from each other,
$R_1$ to $R_5$, $R_{21}$ and $R_{22}$ in Formulae 11 to 15 are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, and —Si(Q$_1$)(Q$_2$)(Q$_3$),
b1 to b5 in Formulae 11 to 15 are each independently an integer selected from 0 to 4,
the number of the cyano group comprised in a group represented by *-(L$_1$)$_{a1}$-*' in Formula 1is denoted as "c5", and the sum of c1 to c5 in Formula 1 is an integer selected from 1 to 5,
i) when $Ar_1$ in Formula 1 is a group represented by Formula 12, $Ar_2$ in Formula 1 is a group represented by Formula 14 , and $Y_1$ in Formula 12 is $N(R_{21})$, $Y_2$ in Formula 14 is O or S, and
ii) when $Ar_1$ in Formula 1 is a group represented by Formula 12, $Ar_2$ in Formula 1 is a group represented by Formula 14, and $Y_2$ in Formula 14 is $N(R_{22})$, $Y_1$ in Formula 12 is O or S, Ar$_{11}$ in Formula 2 is a group represented by Formula 21 or 22, Ar$_{12}$ in Formula 2 is selected from:

a group represented by Formula 23 or 24;

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group not comprising a double bond between N and C, a C$_6$-C$_{60}$ aryl group, a biphenyl group, a terphenyl group, a C$_6$-C$_{60}$ aryloxy group, a C$_6$-C$_{60}$ arylthio group, a C$_7$-C$_{60}$ arylalkyl group, a C$_1$-C$_{60}$ heteroaryl group not comprising a double bond between N and C, a C$_1$-C$_{60}$ heteroaryloxy group not comprising a double bond between N and C, a C$_1$-C$_{60}$ heteroarylthio group not comprising a double bond between N and C, a C$_2$-C$_{60}$ heteroarylalkyl group not comprising a double bond between N and C, a monovalent non-aromatic condensed polycyclic group, and a monovalent non-aromatic condensed heteropolycyclic group not comprising a double bond between N and C; and a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group not comprising a double bond between N and C, a C$_6$-C$_{60}$ aryl group, a biphenyl group, a terphenyl group, a C$_1$-C$_{60}$ heteroaryl group not comprising a double bond between N and C, a monovalent non-aromatic condensed polycyclic group, and a monovalent non-aromatic condensed heteropolycyclic group not comprising a double bond between N and C, each substituted with at least one selected from deuterium, an amino group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a biphenyl group, a terphenyl group, a C$_1$-C$_{60}$ heteroaryl group, a monovalent non-aromatic condensed polycyclic group, a monovalent non-aromatic condensed heteropolycyclic group not comprising a double bond between N and C, and —Si(Q$_{11}$)(Q$_{12}$)(Q$_{13}$), A$_1$ and A$_2$ in Formulae 21 to 24 are each independently selected from:

a single bond, a C$_1$-C$_4$ alkylene group, and a C$_2$-C$_4$ alkenylene group; and a C$_1$-C$_4$ alkylene group and a C$_2$-C$_4$ alkenylene group, each substituted with at least one selected from deuterium, a C$_1$-C$_{10}$ alkyl group, a C$_1$-C$_{10}$ alkoxy group, a phenyl group, a biphenyl group, a terphenyl group, a naphthyl group, a fluorenyl group, a carbazolyl group, a dibenzofuranyl group, a dibenzothiophenyl group, and —Si(Q$_{21}$)(Q$_{22}$)(Q$_{23}$), Y$_{11}$ in Formula 22 is O, S, or N(R$_{41}$), Y$_{12}$ in Formula 24 is O, S, or N(R$_{42}$), R$_{11}$ to Ru in Formulae 21 to 24 and R$_{41}$ and R$_{42}$ are each independently selected from:

hydrogen, deuterium, an amino group, a C$_1$-C$_{60}$ alkyl group, a C$_2$-C$_{60}$ alkenyl group, a C$_2$-C$_{60}$ alkynyl group, and a C$_1$-C$_{60}$ alkoxy group;

a C$_1$-C$_{60}$ alkyl group, a C$_2$-C$_{60}$ alkenyl group, a C$_2$-C$_{60}$ alkynyl group, and a C$_1$-C$_{60}$ alkoxy group, each substituted with at least one selected from deuterium and an amino group;

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group not comprising a double bond between N and C, a C$_6$-C$_{60}$ aryl group, a biphenyl group, a terphenyl group, a C$_6$-C$_{60}$ aryloxy group, a C$_6$-C$_{60}$ arylthio group, a C$_7$-C$_{60}$ arylalkyl group, a C$_1$-C$_{60}$ heteroaryl group not comprising a double bond between N and C, a C$_1$-C$_{60}$ heteroaryloxy group not comprising a double bond between N and C, a C$_1$-C$_{60}$ heteroarylthio group not comprising a double bond between N and C, a C$_2$-C$_{60}$ heteroarylalkyl group not comprising a double bond between N and C, a monovalent non-aromatic condensed polycyclic group, and a monovalent non-aromatic condensed heteropolycyclic group not comprising a double bond between N and C;

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group not comprising a double bond between N and C, a C$_6$-C$_{60}$ aryl group, a biphenyl group, a terphenyl group, a C$_1$-C$_{60}$ heteroaryl group not comprising a double bond between N and C, a monovalent non-aromatic condensed polycyclic group, and a monovalent non-aromatic condensed heteropolycyclic group not comprising a double bond between N and C, each substituted with at least one selected from deuterium, an amino group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a biphenyl group, a terphenyl group, a C$_1$-C$_{60}$ heteroaryl group, a monovalent non-aromatic condensed polycyclic group, a monovalent non-aromatic condensed heteropolycyclic group not comprising a double bond between N and C, and —Si(Q$_{41}$)(Q$_{42}$)(Q$_{43}$), and —Si(Q$_{51}$)(Q$_{52}$)(Q$_{53}$), b11 to b14 in Formulae 21 to 24 are each independently an integer selected from 0 to 4, L$_{11}$ in Formula 2 is selected from:

a C$_3$-C$_{10}$ cycloalkylene group, a C$_1$-C$_{10}$ heterocycloalkylene group, a C$_3$-C$_{10}$ cycloalkenylene group, a C$_1$-C$_{10}$ heterocycloalkenylene group not comprising a double bond between N and C, a C$_6$-C$_{60}$ arylene group, a C$_1$-C$_{60}$ heteroarylene group not comprising a double bond between N and C, a divalent non-aromatic condensed polycyclic group, and a divalent non-aromatic condensed heteropolycyclic group not comprising a double bond between N and C; and a C$_3$-C$_{10}$ cycloalkylene group, a C$_1$-C$_{10}$ heterocycloalkylene group, a C$_3$-C$_{10}$ cycloalkenylene group, a C$_1$-C$_{10}$ heterocycloalkenylene group, a C$_6$-C$_{60}$ arylene group, a C$_1$-C$_{60}$ heteroarylene group not comprising a double bond between N and C, a divalent non-aromatic condensed polycyclic group, and a divalent non-aromatic condensed heteropolycyclic group not comprising a double bond between N and C, each substituted with at least one selected from deuterium, an amino group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a biphenyl group, a terphenyl group, a C$_1$-C$_{60}$ heteroaryl group, a monovalent non-aromatic condensed polycyclic group, a monovalent non-aromatic condensed heteropolycyclic group not comprising a double bond between N and C, and —Si(Q$_{31}$)(Q$_{32}$)(Q$_{33}$), a11 in Formula 2 is an integer selected from 0 to 5, wherein when a11 is two or more, two or more groups $L_{11}$ are identical to or different from each other, the second compound represented by Formula 2 does not comprise a —F, a cyano group and a nitro group, and at least one of substituent(s) of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a biphenyl group, a terphenyl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, and —Si($Q_{61}$)($Q_{62}$)($Q_{63}$), wherein $Q_1$ to $Q_3$, $Q_{11}$ to $Q_{13}$, $Q_{21}$ to $Q_{23}$, $Q_{31}$ to $Q_{33}$, $Q_{41}$ to $Q_{43}$, $Q_{51}$ to $Q_{53}$, and $Q_{61}$ to $Q_{63}$ are each independently selected from hydrogen, deuterium, a $C_1$-$C_{60}$ alkyl group, a $C_1$-$C_{60}$ alkoxy group, a phenyl group, a biphenyl group, a terphenyl group, a naphthyl group, and an anthracenyl group, and

* and *' in the group represented by *-($L_1$)$_{a1}$-*' each independently indicate a binding site to a neighboring atom.

2. The composition of claim 1, wherein $R_1$ to $R_5$, $R_{21}$, and $R_{22}$ are each independently selected from:

hydrogen, deuterium, a cyano group, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group;

a $C_1$-$C_{10}$ alkyl group and a $C_1$-$C_{10}$ alkoxy group, each substituted with at least one selected from deuterium and a cyano group; and a phenyl group, a biphenyl group, a terphenyl group, a fluorenyl group, a pyridinyl group, a carbazolyl group, a dibenzofuranyl group, and a dibenzothiophenyl group, each substituted with at least one selected from deuterium, a cyano group, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group.

3. The composition of claim 1, wherein An in Formula 1 is selected from groups represented by Formulae 11-1 to 11-3 and 12-1 to 12-14, and wherein $Ar_2$ in Formula 1 is selected from groups represented by Formulae 13-1 to 13-3 and 14-1 to 14-14:

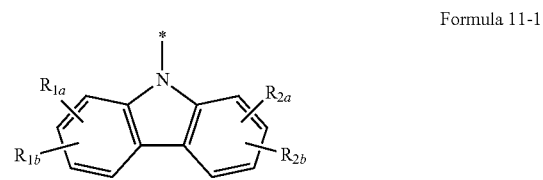

Formula 11-1

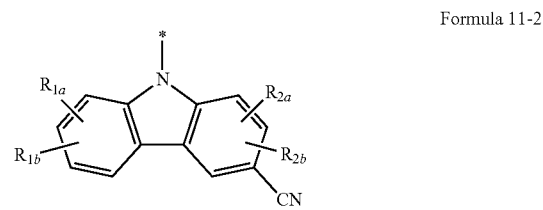

Formula 11-2

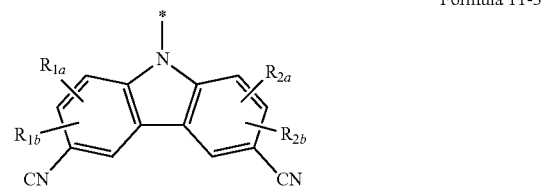

Formula 11-3

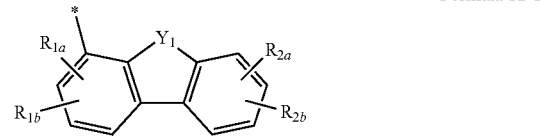

Formula 12-1

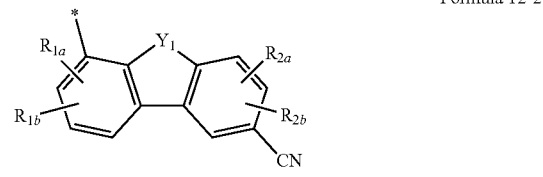

Formula 12-2

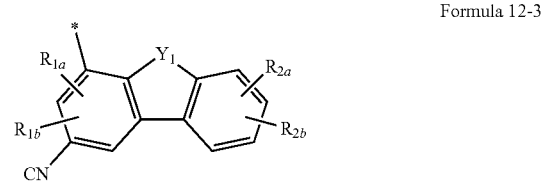

Formula 12-3

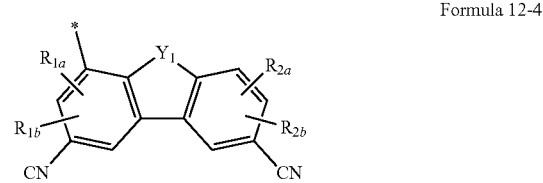

Formula 12-4

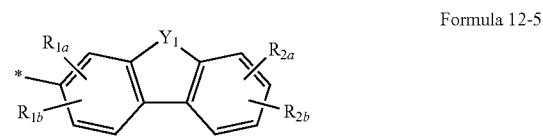

Formula 12-5

-continued
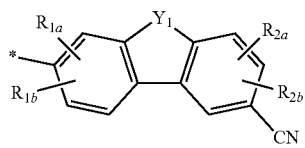
Formula 12-6
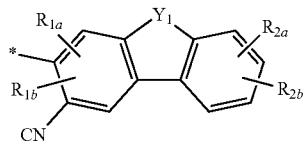
Formula 12-7
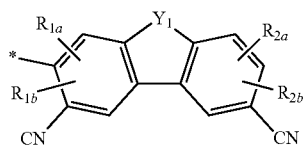
Formula 12-8
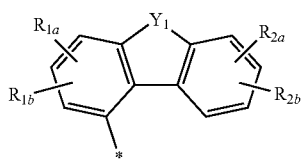
Formula 12-9
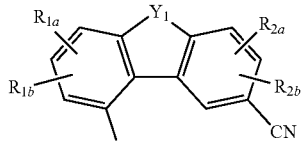
Formula 12-10
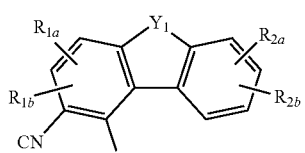
Formula 12-11
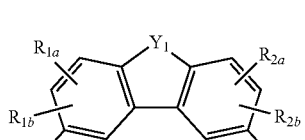
Formula 12-12
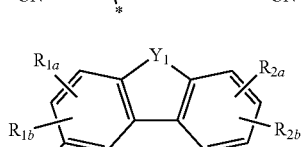
Formula 12-13
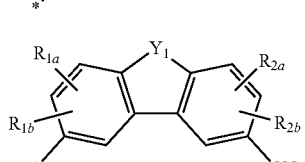
Formula 12-14
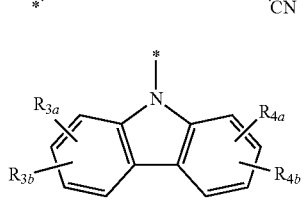
Formula 13-1
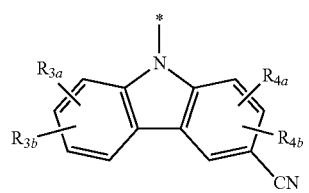
Formula 13-2
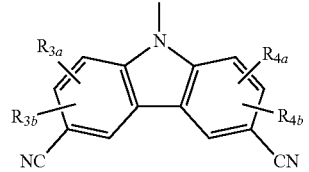
Formula 13-3
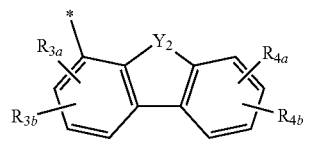
Formula 14-1
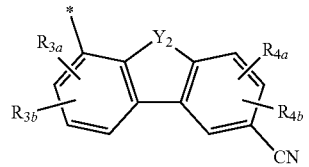
Formula 14-2
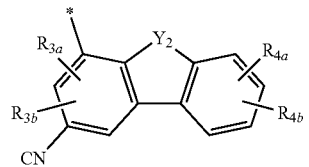
Formula 14-3
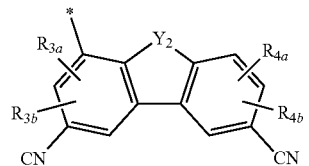
Formula 14-4
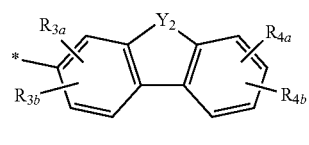
Formula 14-5
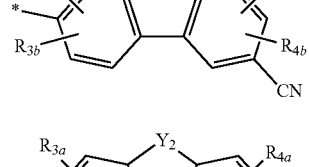
Formula 14-6
Formula 14-7

-continued

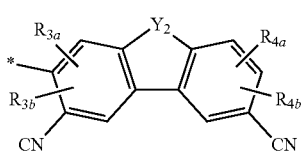
Formula 14-8

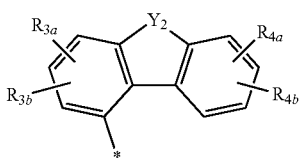
Formula 14-9

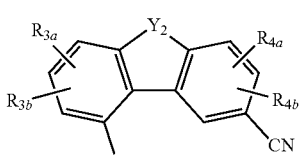
Formula 14-10

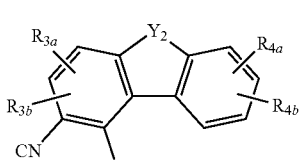
Formula 14-11

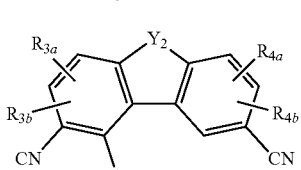
Formula 14-12

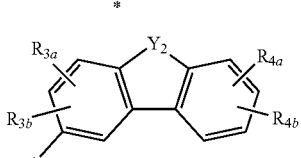
Formula 14-13

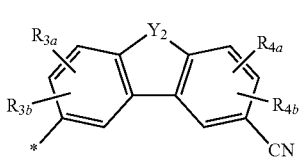
Formula 14-14 wherein in Formulae 11-1 to 11-3, 12-1 to 12-14, 13-1 to 13-3, and 14-1 to 14-14, $Y_1$ and $Y_2$ are the same as in claim 1, $R_{1a}$, $R_{1b}$, $R_{2a}$, $R_{2b}$, $R_{3a}$, $R_{3b}$, $R_{4a}$, and $R_{4b}$ are each independently selected from:

hydrogen, deuterium, a cyano group, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group;

a $C_1$-$C_{10}$ alkyl group and a $C_1$-$C_{10}$ alkoxy group, each substituted with at least one selected from deuterium and a cyano group; and a phenyl group, a biphenyl group, a terphenyl group, a fluorenyl group, a pyridinyl group, a carbazolyl group, a dibenzofuranyl group, and a dibenzothiophenyl group, each substituted with at least one selected from deuterium, a cyano group, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group, and

* indicates a binding site to a neighboring atom.

4. The composition of claim 1, wherein $L_1$ is selected from groups represented by Formulae 15(1) to 15(16):

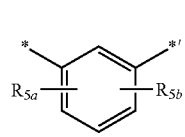
Formula 15(1)

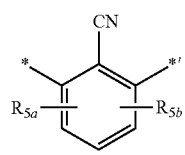
Formula 15(2)

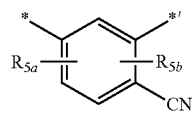
Formula 15(3)

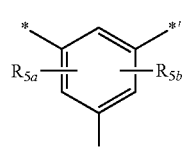
Formula 15(4)

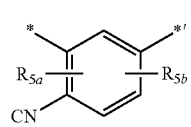
Formula 15(5)

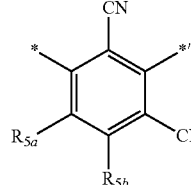
Formula 15(6)

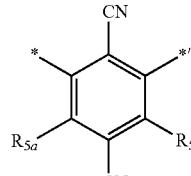
Formula 15(7)

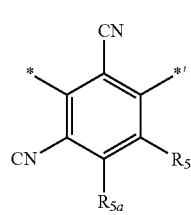
Formula 15(8)

-continued

Formula 15(9)

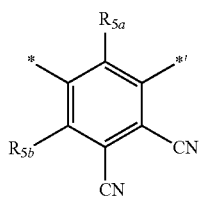

Formula 15(10)

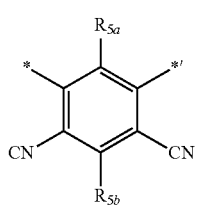

Formula 15(11)

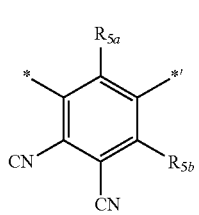

Formula 15(12)

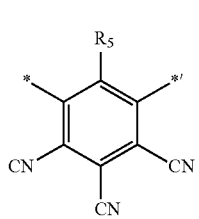

Formula 15(13)

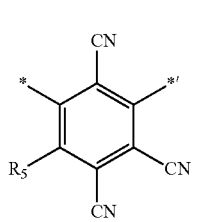

Formula 15(14)

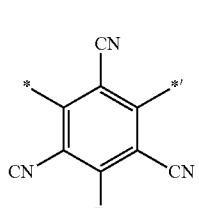

Formula 15(15)

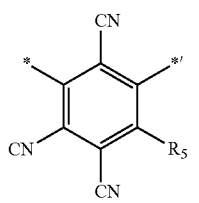

Formula 15(16)

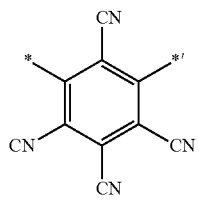

wherein in Formulae 15(1) to 15(16), $R_5$, $R_{5a}$, and $R_{5b}$ are each independently selected from:

hydrogen, deuterium, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group;

a $C_1$-$C_{10}$ alkyl group and a $C_1$-$C_{10}$ alkoxy group, each substituted with at least one selected from deuterium and a cyano group; and a phenyl group, a biphenyl group, a terphenyl group, a fluorenyl group, a pyridinyl group, a carbazolyl group, a dibenzofuranyl group, and a dibenzothiophenyl group, each substituted with at least one selected from deuterium, a cyano group, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group, and

* and *' each independently indicate a binding site to a neighboring atom.

5. The composition of claim 1, wherein a1 is 2 or 3.

6. The composition of claim 1, wherein the first compound is represented by one selected from Formulae 1-1 to 1-5:

Formula 1-1

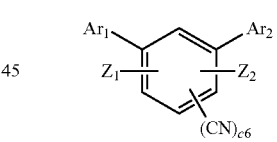

Formula 1-2

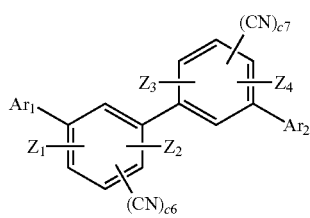

Formula 1-3

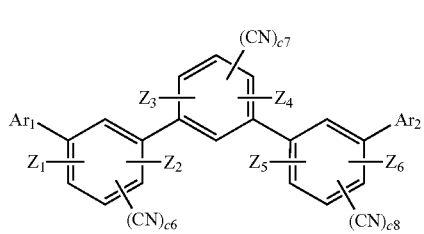

-continued

Formula 1-4

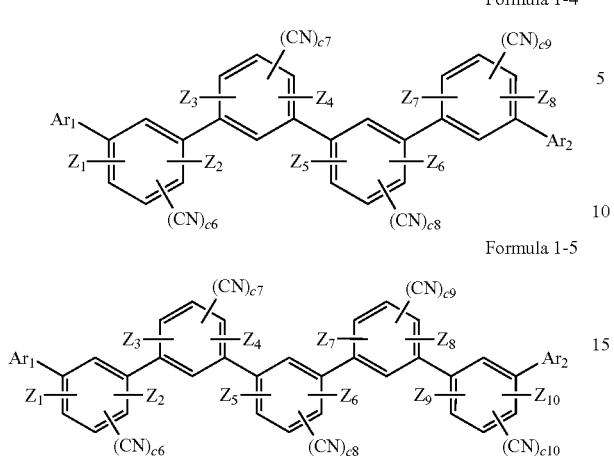

Formula 1-5 wherein in Formulae 1-1 to 1-5,
Ar$_1$ and Ar$_2$ are the same as in claim 1,
Z$_1$ to Z$_{10}$ are the same as R$_5$ in claims 1, and
c6 to c10 are each independently 0, 1, or 2.

7. The composition of claim 6, wherein i) the sum of c1, c2, c3, c4, and c6 in Formula 1-1, ii) the sum of c1, c2, c3, c4, c6, and c7 in Formula 1-2, iii) the sum of c1, c2, c3, c4, c6, c7, and c8 in Formula 1-3, iv) the sum of c1, c2, c3, c4, c6, c7, c8, and c9 in Formula 1-4, and v) the sum of c1, c2, c3, c4, c6, c7, c8, c9, and c10 in Formula 1-5 are each independently 2, 3, or 4.

8. The composition of claim 6, wherein the sum of c1, c2, c3, and c4 in Formulae 1-1 to 1-5 is 1 or 2, and
i) c6 in Formula 1-1, ii) the sum of c6 and c7 in Formula 1-2, iii) the sum of c6, c7, and c8 in Formula 1-3, iv) the sum of c6, c7, c8, and c9 in Formula 1-4, and v) the sum of c6, c7, c8, c9, and c10 in Formula 1-5 are each independently 1 or 2.

9. The composition of claim 1, wherein in Formulae 21 to 24,
R$_{11}$ to R$_{14}$ are each independently selected from:
hydrogen, deuterium, a C$_1$-C$_{10}$ alkyl group, a C$_1$-C$_{10}$ alkoxy group, a phenyl group, a biphenyl group, a terphenyl group, a fluorenyl group, a pyridinyl group, a carbazolyl group, a dibenzofuranyl group, and a dibenzothiophenyl group;
a C$_1$-C$_{10}$ alkyl group and a C$_1$-C$_{10}$ alkoxy group, each substituted with at least one deuterium; and
a phenyl group, a biphenyl group, a terphenyl group, a fluorenyl group, a pyridinyl group, a carbazolyl group, a dibenzofuranyl group, and a dibenzothiophenyl group, each substituted with at least one selected from deuterium, a C$_1$-C$_{10}$ alkyl group, a C$_1$-C$_{10}$ alkoxy group, a phenyl group, a biphenyl group, a terphenyl group, a fluorenyl group, a pyridinyl group, a carbazolyl group, a dibenzofuranyl group, and a dibenzothiophenyl group, and
R$_{41}$ to R$_{42}$ are each independently selected from:
a phenyl group, a biphenyl group, a terphenyl group, a fluorenyl group, a pyridinyl group, a carbazolyl group, a dibenzofuranyl group, and a dibenzothiophenyl group; and
a phenyl group, a biphenyl group, a terphenyl group, a fluorenyl group, a pyridinyl group, a carbazolyl group, a dibenzofuranyl group, and a dibenzothiophenyl group, each substituted with at least one selected from deuterium, a C$_1$-C$_{10}$ alkyl group, a C$_1$-C$_{10}$ alkoxy group, a phenyl group, a biphenyl group, a terphenyl group, a fluorenyl group, a pyridinyl group, a carbazolyl group, a dibenzofuranyl group, and a dibenzothiophenyl group.

10. The composition of claim 1, wherein
Ar$_{11}$ in Formula 2 is selected from groups represented by Formulae 21-1 to 21-3 and 22-1 to 22-12,
Ar$_{12}$ in Formula 2 is selected from:
groups represented by Formulae 23-1 to 23-3 and 24-1 to 24-12;
a phenyl group, a biphenyl group, a terphenyl group, a fluorenyl group, and a pyridinyl group; and
a phenyl group, a biphenyl group, a terphenyl group, a fluorenyl group, and a pyridinyl group, each substituted with at least one selected from deuterium, a C$_1$-C$_{10}$ alkyl group, a C$_1$-C$_{10}$ alkoxy group, a phenyl group, a biphenyl group, a terphenyl group, a fluorenyl group, a pyridinyl group, a carbazolyl group, a dibenzofuranyl group, and a dibenzothiophenyl group:

Formula 21-1

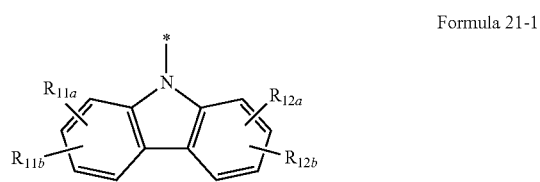

Formula 21-2

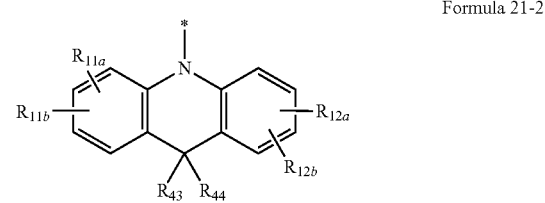

Formula 21-3

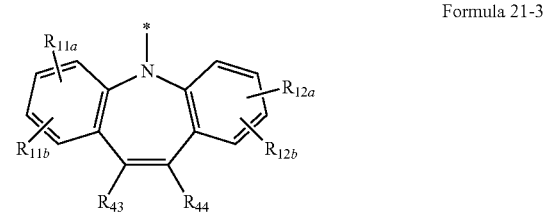

Formula 22-1

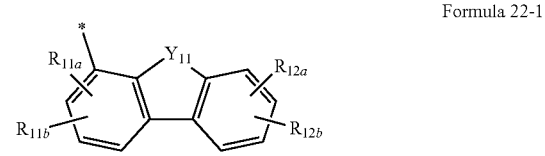

Formula 22-2

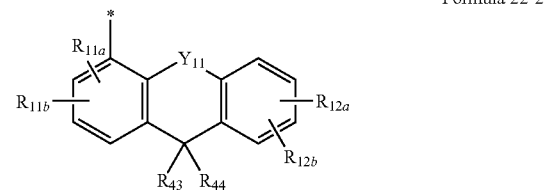

Formula 22-3
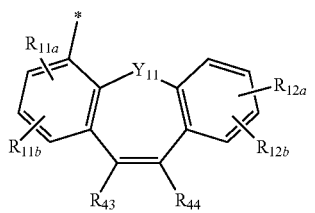
Formula 22-4
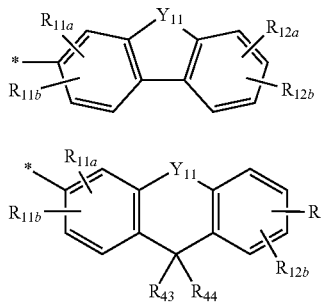
Formula 22-5
Formula 22-6
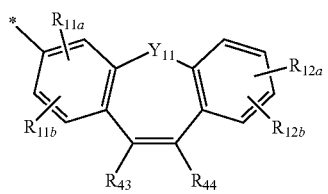
Formula 22-7
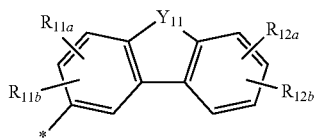
Formula 22-8
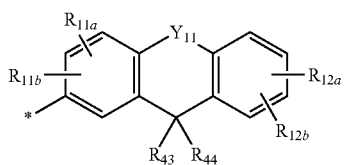
Formula 22-9
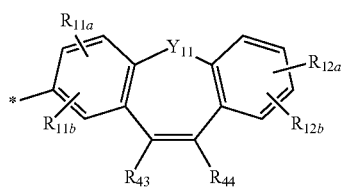
Formula 22-10
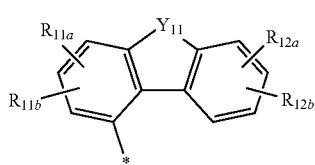
Formula 22-11
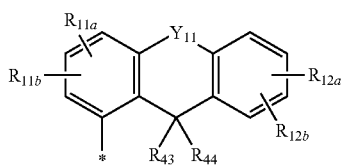
Formula 22-12
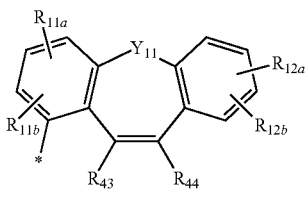
Formula 23-1
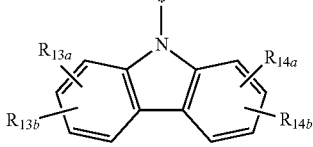
Formula 23-2
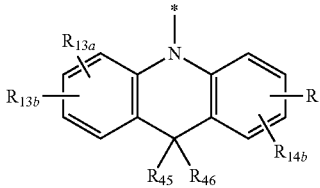
Formula 23-3
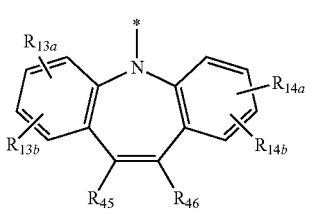
Formula 24-1
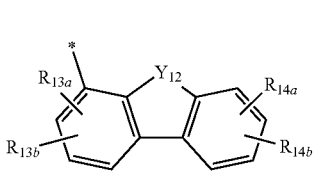
Formula 24-2
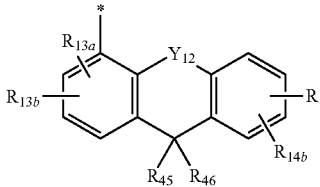
Formula 24-3
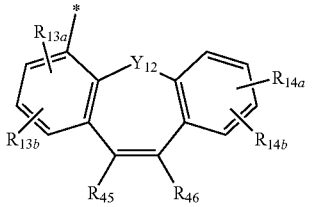
Formula 24-4
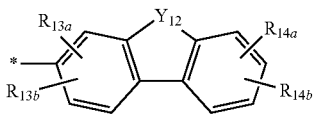

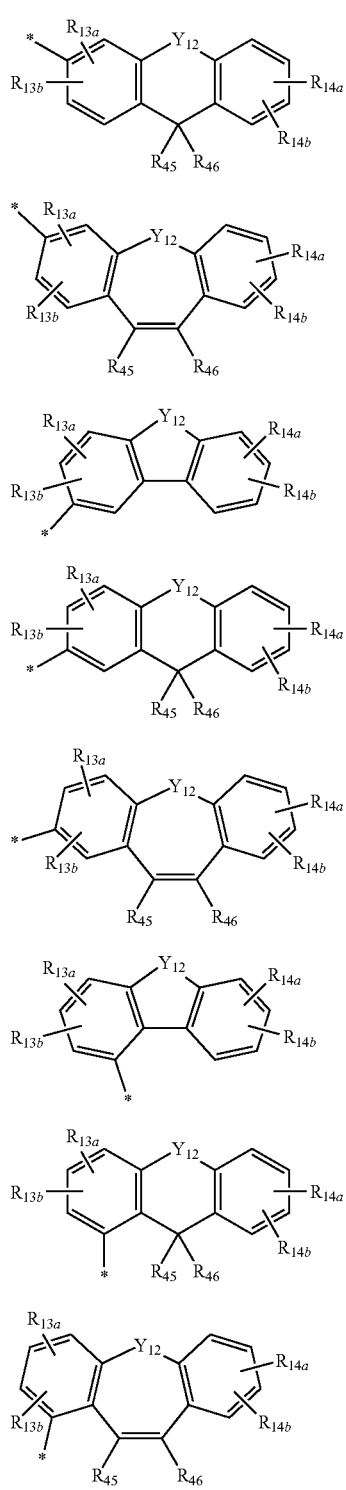

Formula 24-5
Formula 24-6
Formula 24-7
Formula 24-8
Formula 24-9
Formula 24-10
Formula 24-11
Formula 24-12 wherein in Formulae 21-1 to 21-3, 22-1 to 22-12, 23-1 to 23-3, and 24-1 to 24-12, $Y_{11}$ and $Y_{12}$ are the same as in claim 1, $R_{11a}$, $R_{11b}$, $R_{12a}$, $R_{12b}$, $R_{13a}$, $R_{13b}$, $R_{14a}$, and $R_{14b}$ are each independently selected from:

hydrogen, deuterium, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group;

a $C_1$-$C_{10}$ alkyl group and a $C_1$-$C_{10}$ alkoxy group, each substituted with at least one deuterium; and a phenyl group, a biphenyl group, a terphenyl group, a fluorenyl group, a pyridinyl group, a carbazolyl group, a dibenzofuranyl group, and a dibenzothiophenyl group, each substituted with at least one selected from deuterium, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group, $R_{43}$ to $R_{46}$ are each independently selected from hydrogen, deuterium, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group, $R_{43}$ and $R_{44}$ are optionally linked to each other through a single bond; a $C_1$-$C_4$ alkylene group; or a $C_1$-$C_4$ alkylene group substituted with at least one selected from a $C_1$-$C_{10}$ alkyl group and a phenyl group, $R_{45}$ and $R_{46}$ are optionally linked to each other through a single bond; a $C_1$-$C_4$ alkylene group; or a $C_1$-$C_4$ alkylene group substituted with at least one selected from a $C_1$-$C_{10}$ alkyl group and a phenyl group, and

* indicates a binding site to a neighboring atom.

11. The composition of claim 1, wherein $L_{11}$ in Formula 2 is selected from:

a phenylene group, a fluorenylene group, a carbazolylene group, a dibenzofuranylene group, and a dibenzothiophenylene group; and a phenylene group, a fluorenylene group, a carbazolylene group, a dibenzofuranylene group, and a dibenzothiophenylene group, each substituted with at least one selected from deuterium, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group.

12. The composition of claim 1, wherein the second compound is represented by $Ar_{11}$-$Ar_{12}$ or one selected from Formulae 2-1 to 2-95:

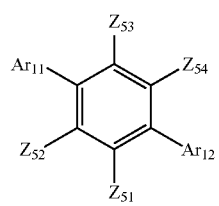

Formula 2-1

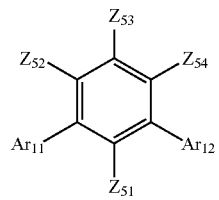

Formula 2-2

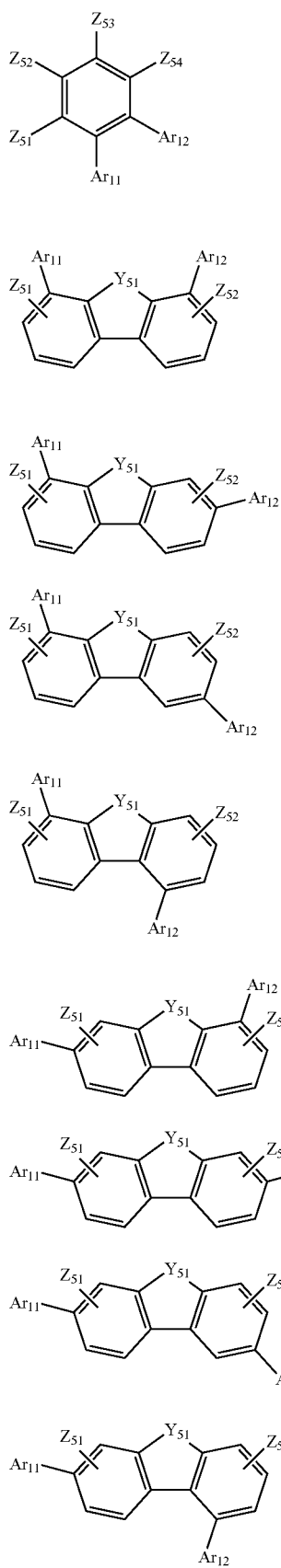
Formula 2-3
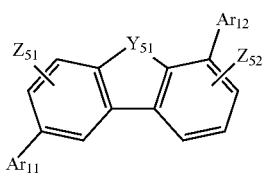
Formula 2-4
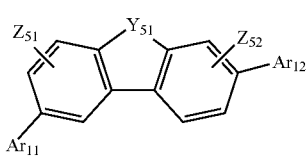
Formula 2-5
Formula 2-6
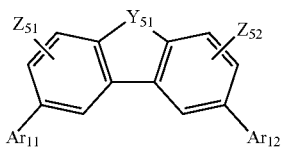
Formula 2-7
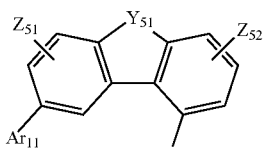
Formula 2-8
Formula 2-9
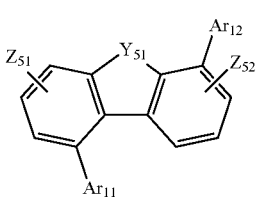
Formula 2-10
Formula 2-11
Formula 2-12
Formula 2-13
Formula 2-14
Formula 2-15
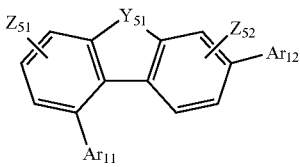
Formula 2-16
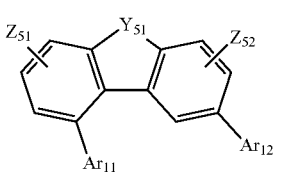
Formula 2-17
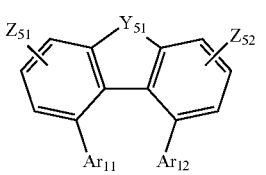
Formula 2-18
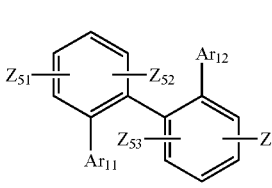
Formula 2-19
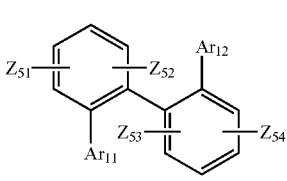
Formula 2-20
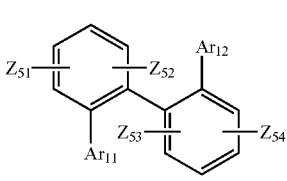

Formula 2-21
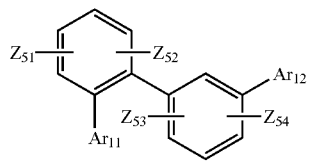
Formula 2-22
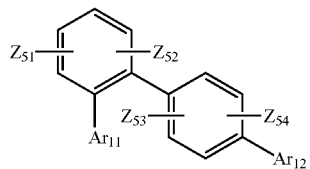
Formula 2-23
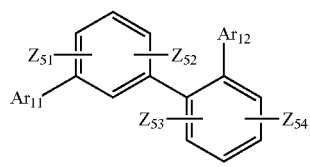
Formula 2-24
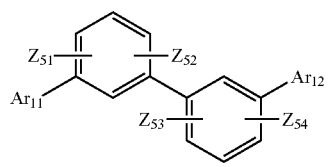
Formula 2-25
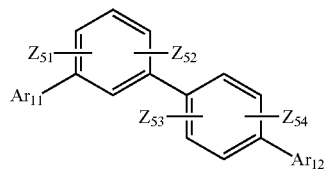
Formula 2-26
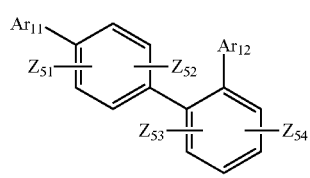
Formula 2-27
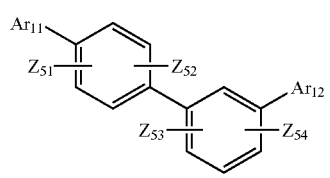
Formula 2-28
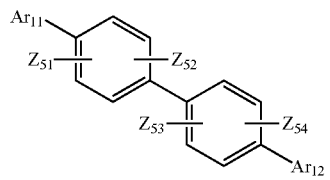
Formula 2-29
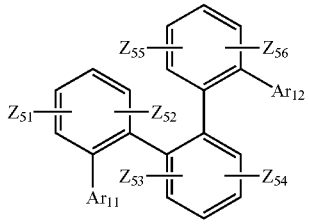
Formula 2-30
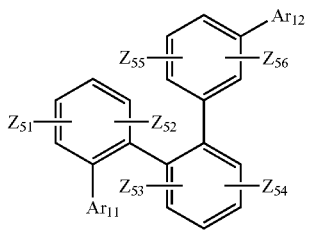
Formula 2-31
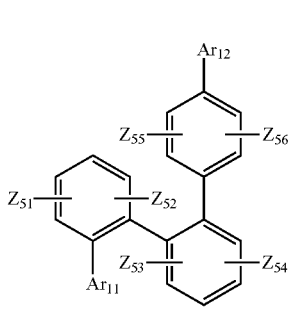
Formula 2-32
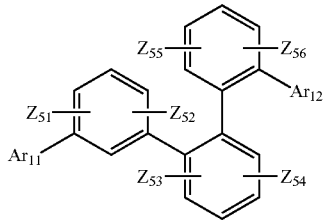
Formula 2-33
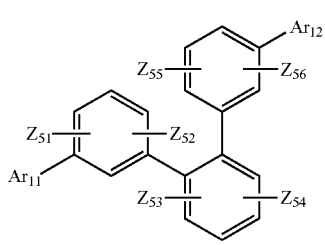
Formula 2-34
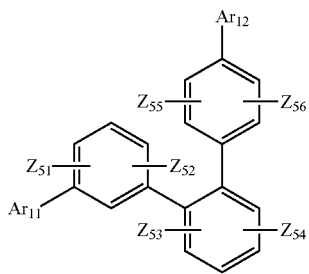

Formula 2-35
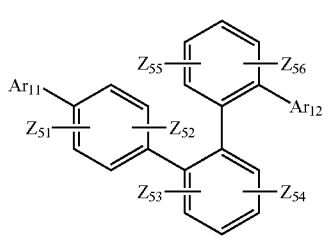
Formula 2-36
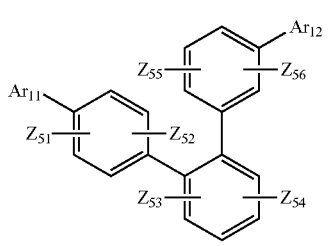
Formula 2-37
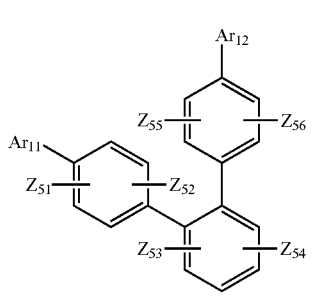
Formula 2-38
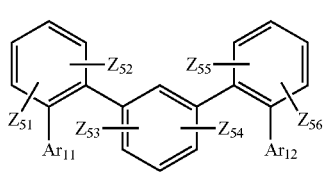
Formula 2-39
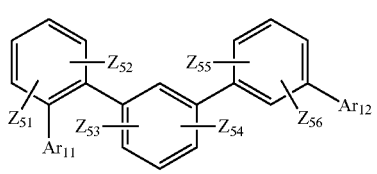
Formula 2-40
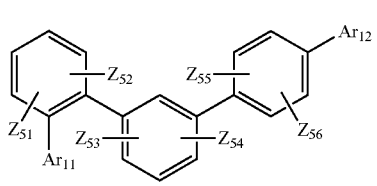
Formula 2-41
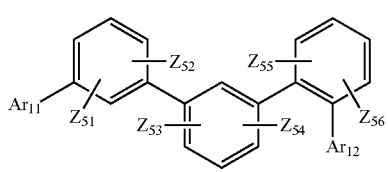
Formula 2-42
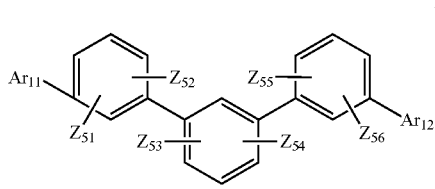
Formula 2-43
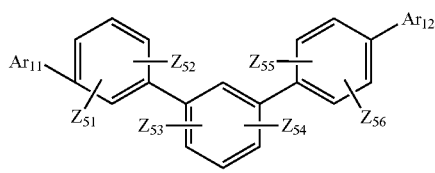
Formula 2-44
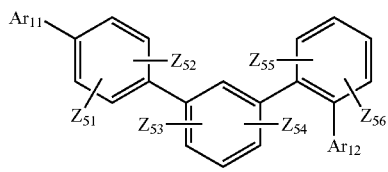
Formula 2-45
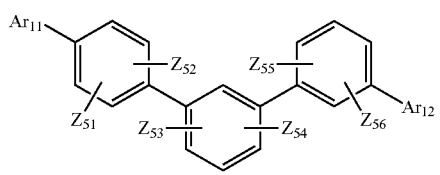
Formula 2-46
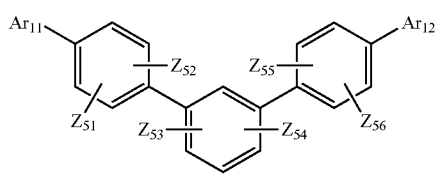
Formula 2-47
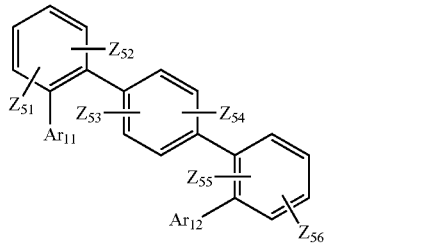
Formula 2-48
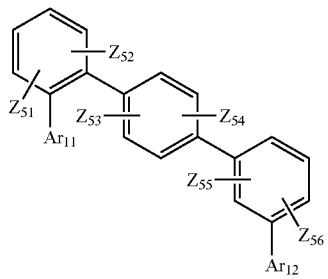
Formula 2-49
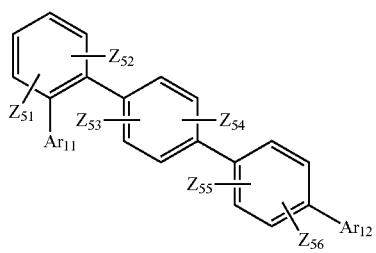

Formula 2-50
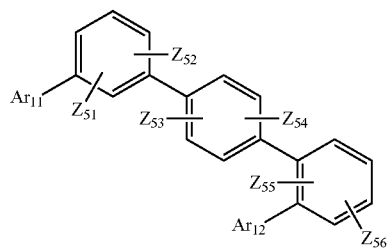
Formula 2-51
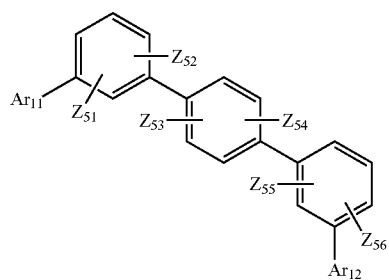
Formula 2-52
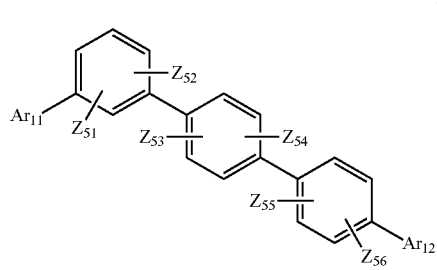
Formula 2-53
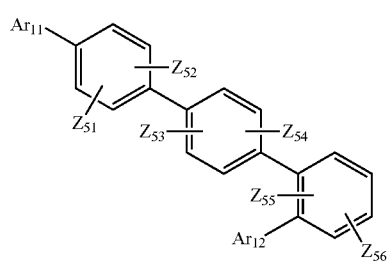
Formula 2-54
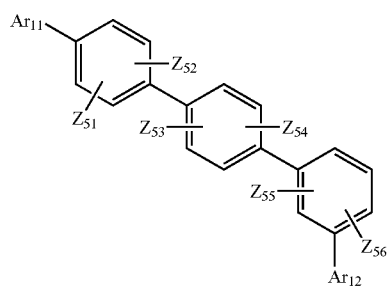
Formula 2-55
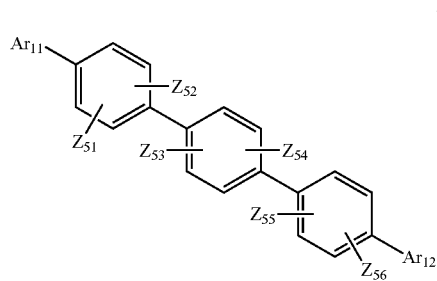
Formula 2-56
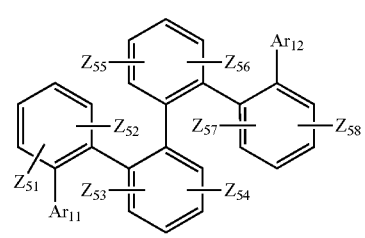
Formula 2-57
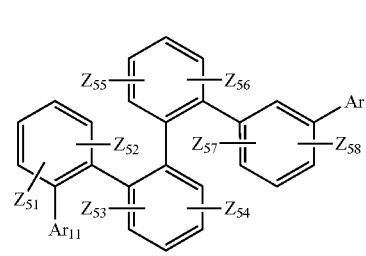
Formula 2-58
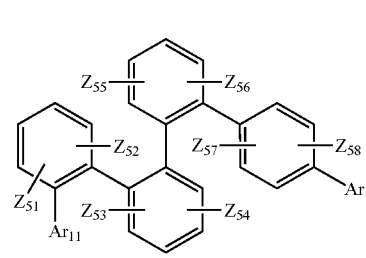
Formula 2-59
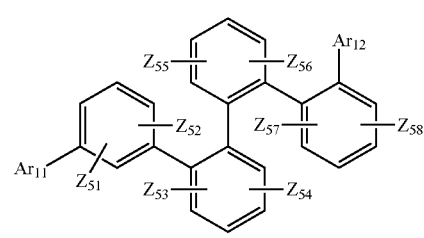
Formula 2-60
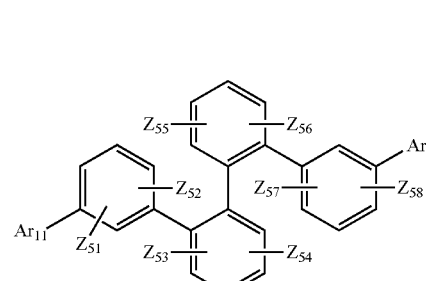
Formula 2-61
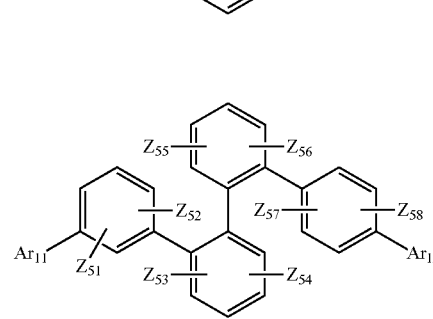

Formula 2-62
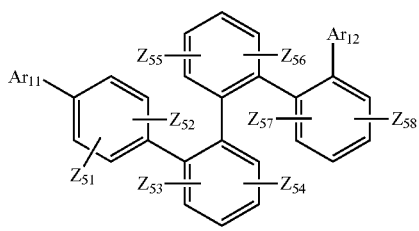
Formula 2-63
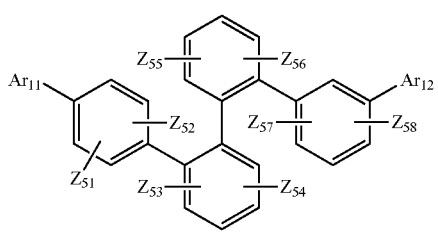
Formula 2-64
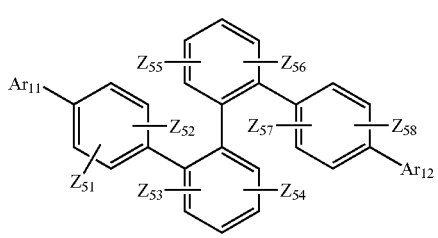
Formula 2-65
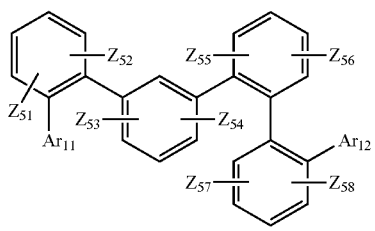
Formula 2-66
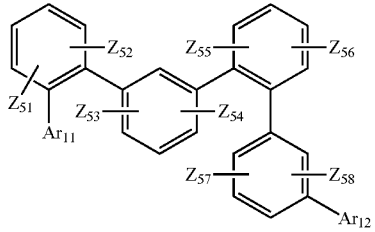
Formula 2-67
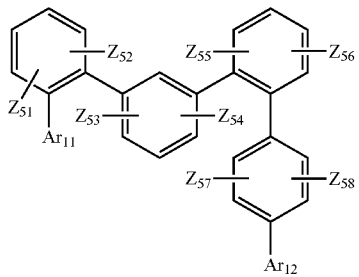
Formula 2-68
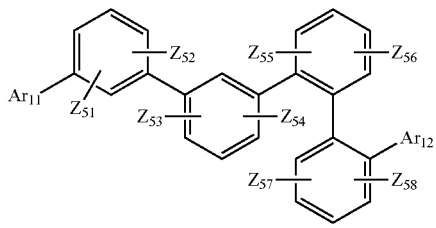
Formula 2-69
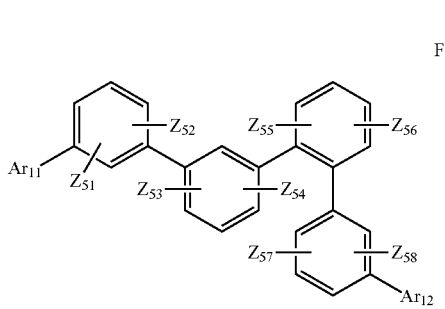
Formula 2-70
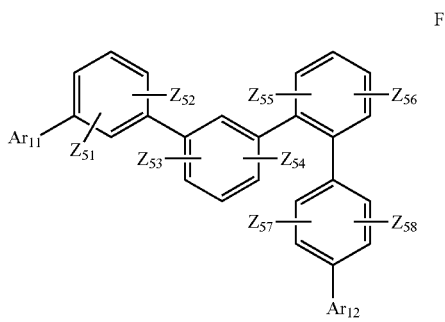
Formula 2-71
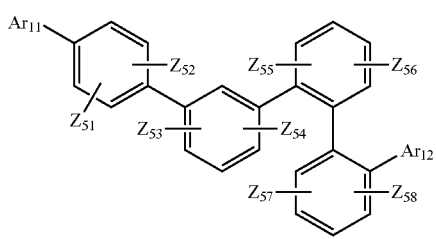
Formula 2-72
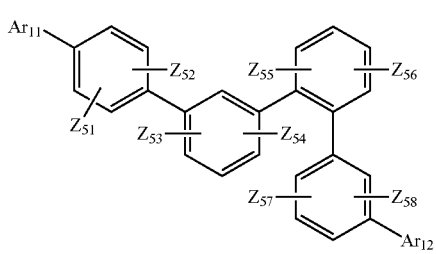

Formula 2-73
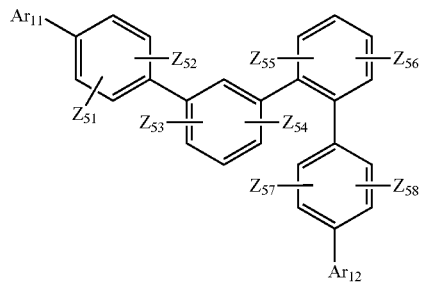
Formula 2-74
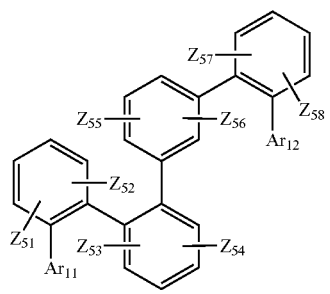
Formula 2-75
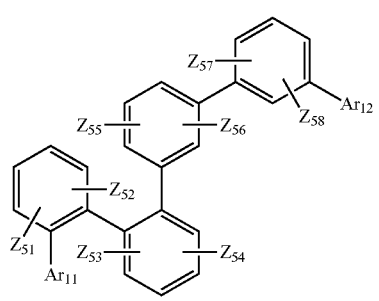
Formula 2-76
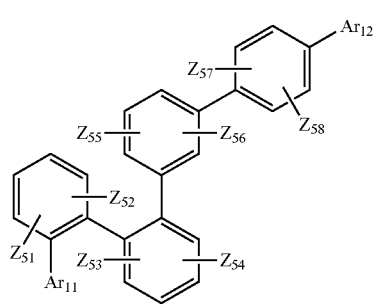
Formula 2-77
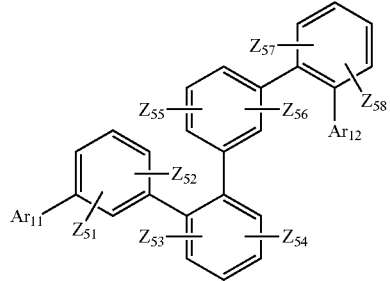
Formula 2-78
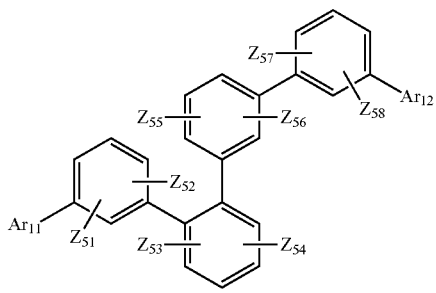
Formula 2-79
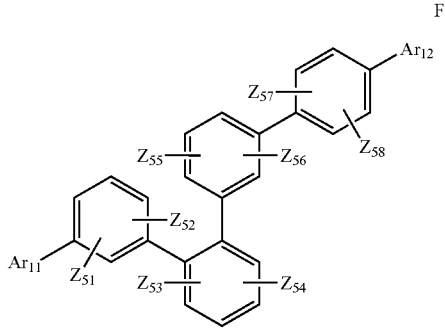
Formula 2-80
Formula 2-81
Formula 2-82

-continued

Formula 2-83
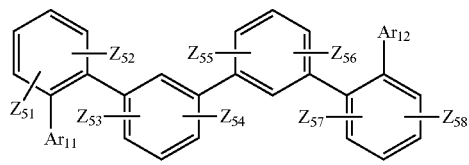

Formula 2-84
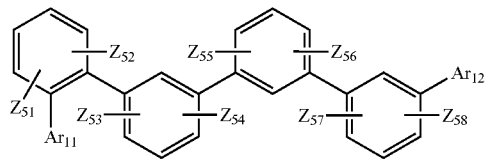

Formula 2-85
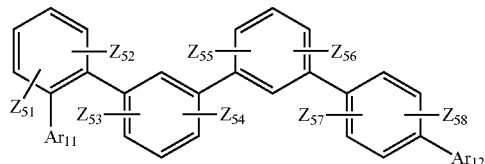

Formula 2-86
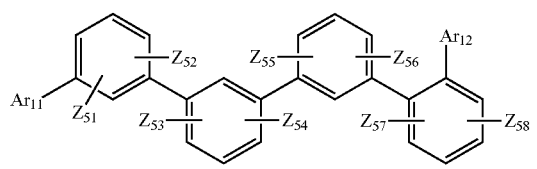

Formula 2-87
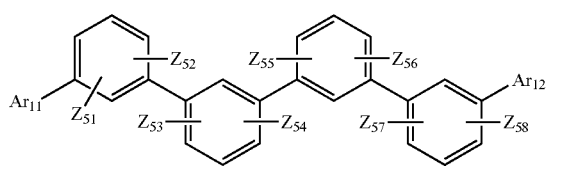

Formula 2-88
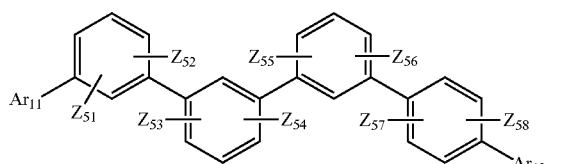

Formula 2-89
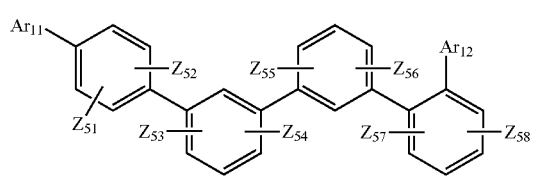

Formula 2-90
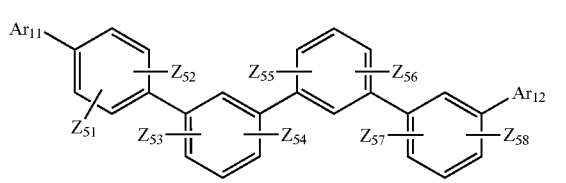

-continued

Formula 2-91
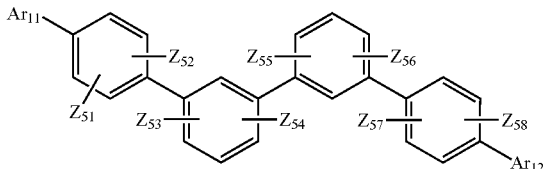

Formula 2-92
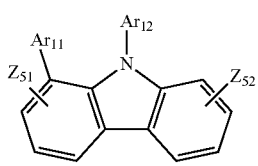
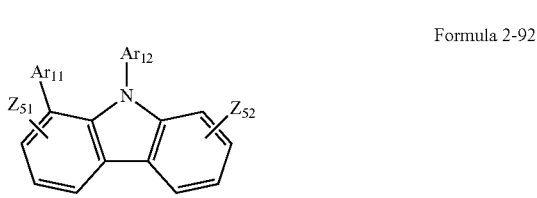

Formula 2-93
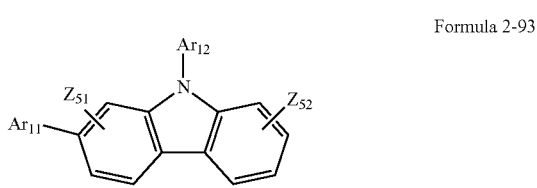

Formula 2-94
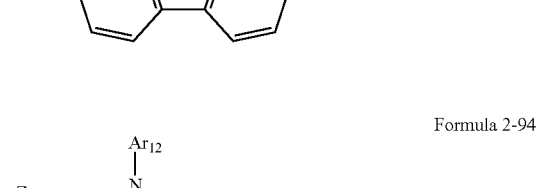

Formula 2-95
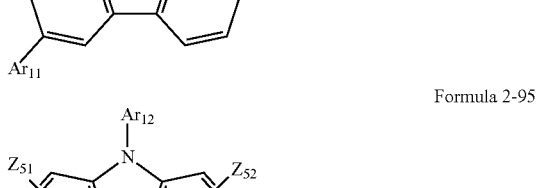

wherein in Formulae 2-1 to 2-95, $Ar_{11}$ and $Ar_{12}$ are the same as in claim 1, $Y_{51}$ is O, S, $C(Z_{61})(Z_{62})$, or $N(Z_{61})$, and $Z_{51}$ to $Z_{58}$, $Z_{61}$, and $Z_{62}$ are each independently selected from hydrogen, deuterium, a $C_1$-$C_{10}$ alkyl group, a $C_1$-$C_{10}$ alkoxy group, a phenyl group, a biphenyl group, a terphenyl group, a fluorenyl group, a pyridinyl group, a carbazolyl group, a dibenzofuranyl group, and a dibenzothiophenyl group.

13. The composition of claim 1, wherein the first compound and the second compound each have an actually measured triplet ($T_1$) energy value of 2.75 electron volts or greater.

14. The composition of claim 1, wherein the first compound is one selected from Compounds E-1 to E-8, and the second compound is one selected from Compounds H-1 to H-42:

E-1
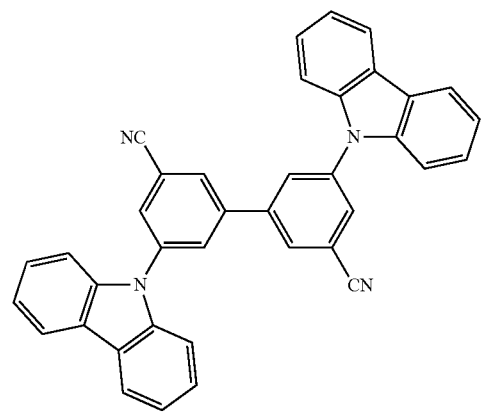
E-5
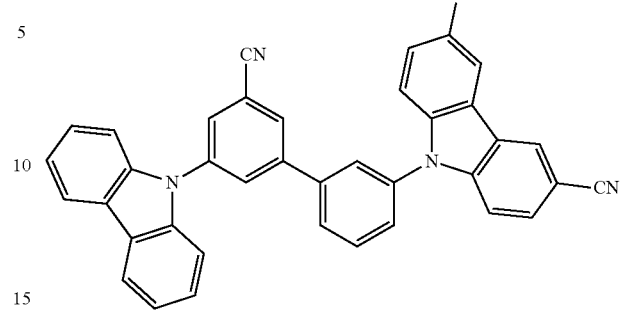
E-2
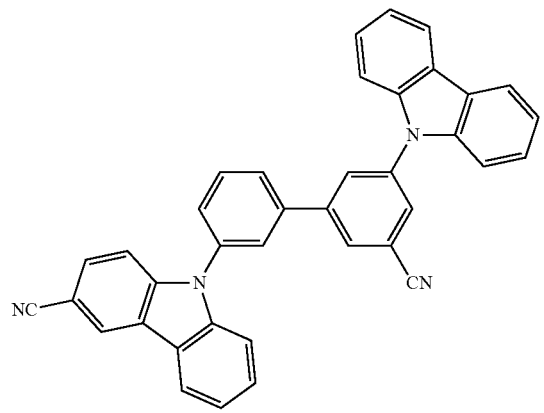
E-6
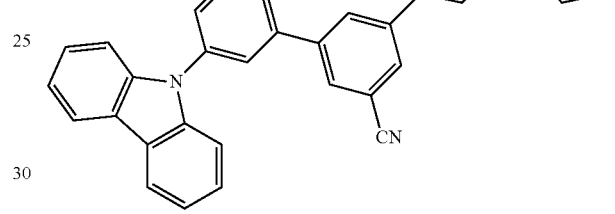
E-3
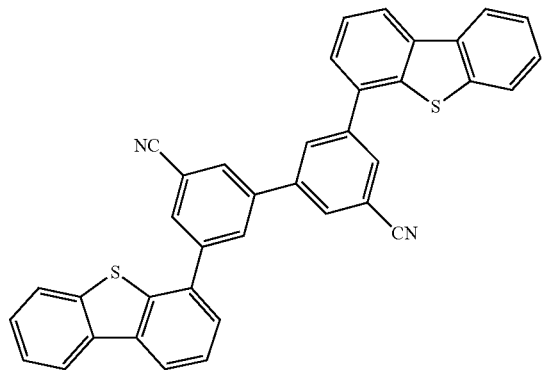
E-7
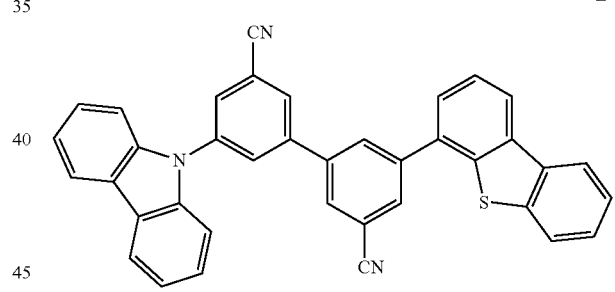
E-4
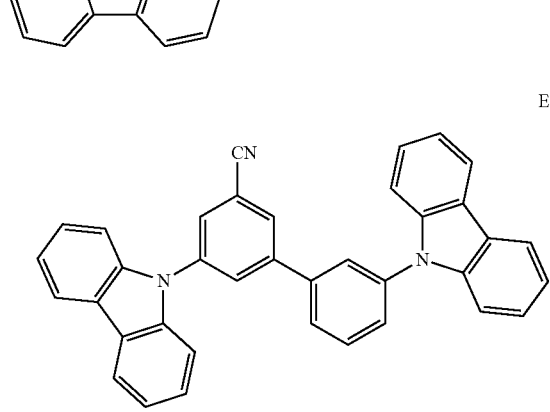
E-8
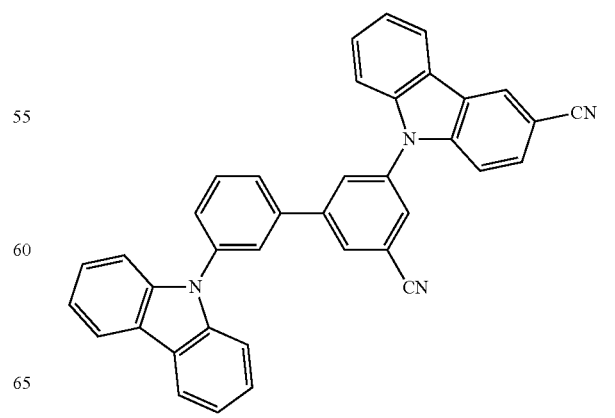

H-1
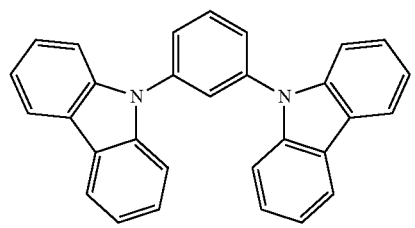 [SMILES: c1cc(-n2c3ccccc3c3ccccc32)cc(-n2c3ccccc3c3ccccc32)c1]
H-2
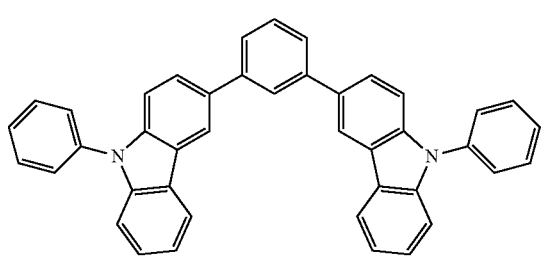
H-3
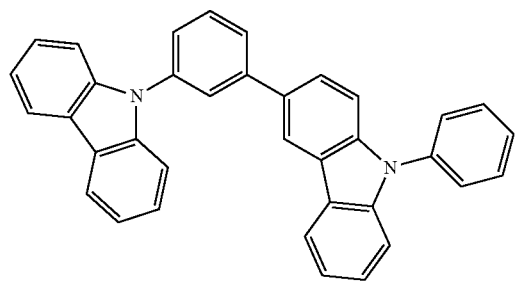
H-4
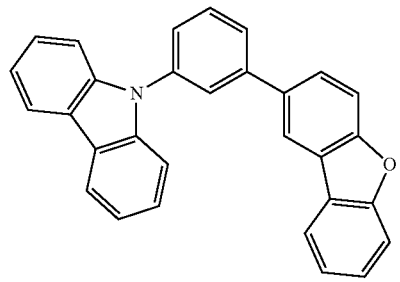
H-5
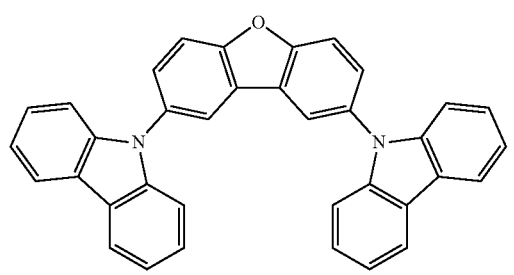
H-6
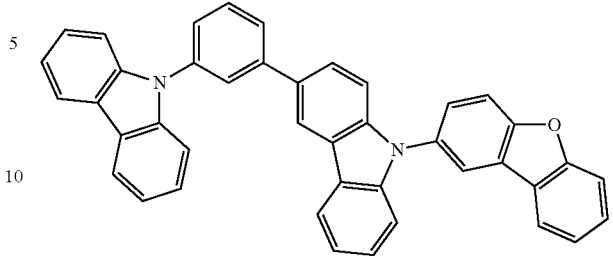
H-7
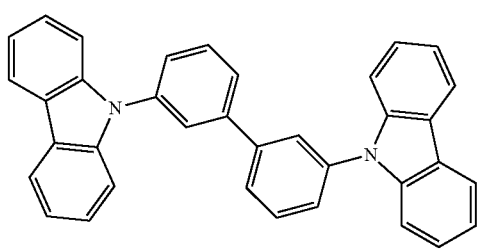
H-8
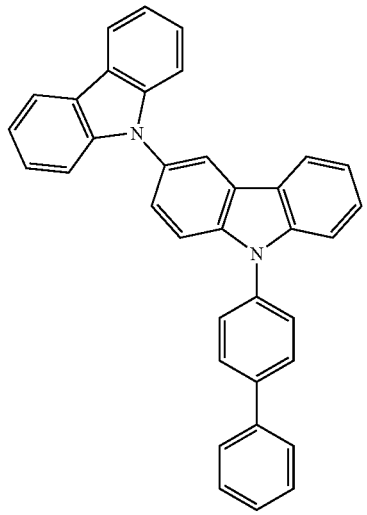
H-9
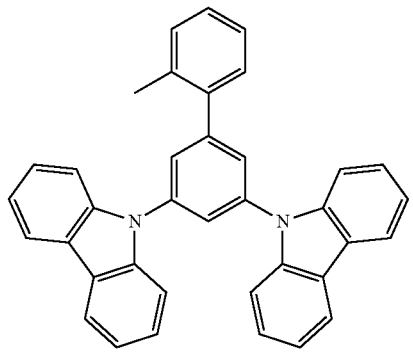

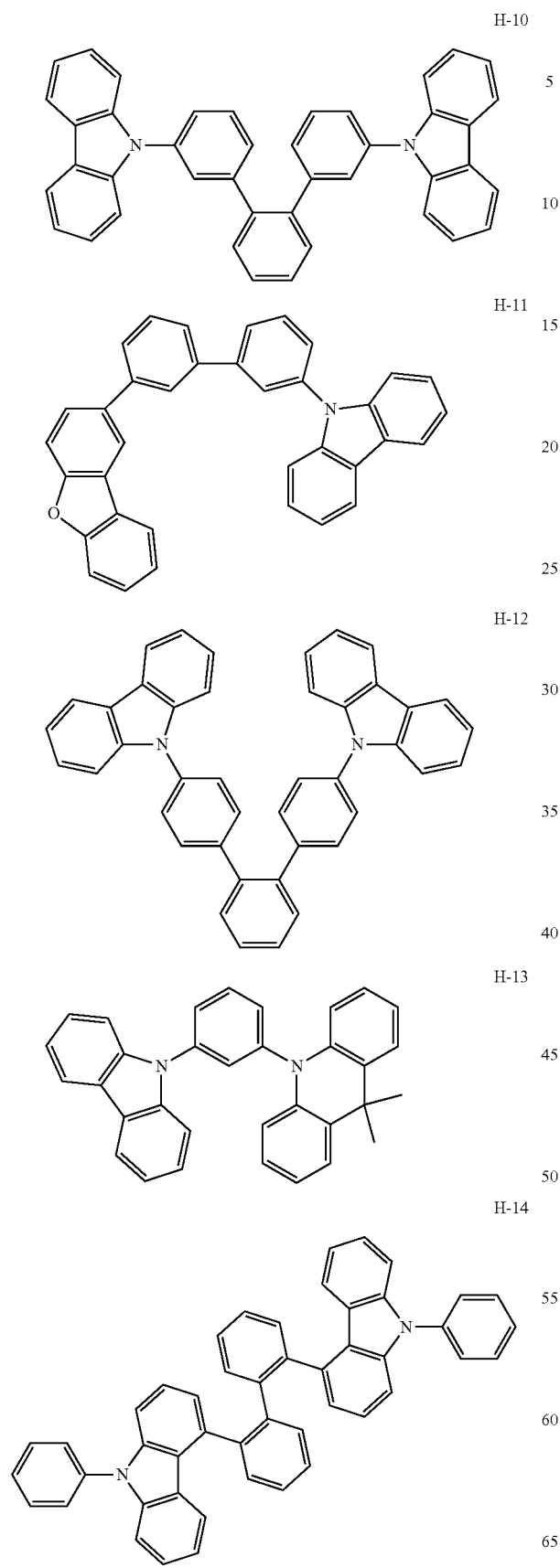
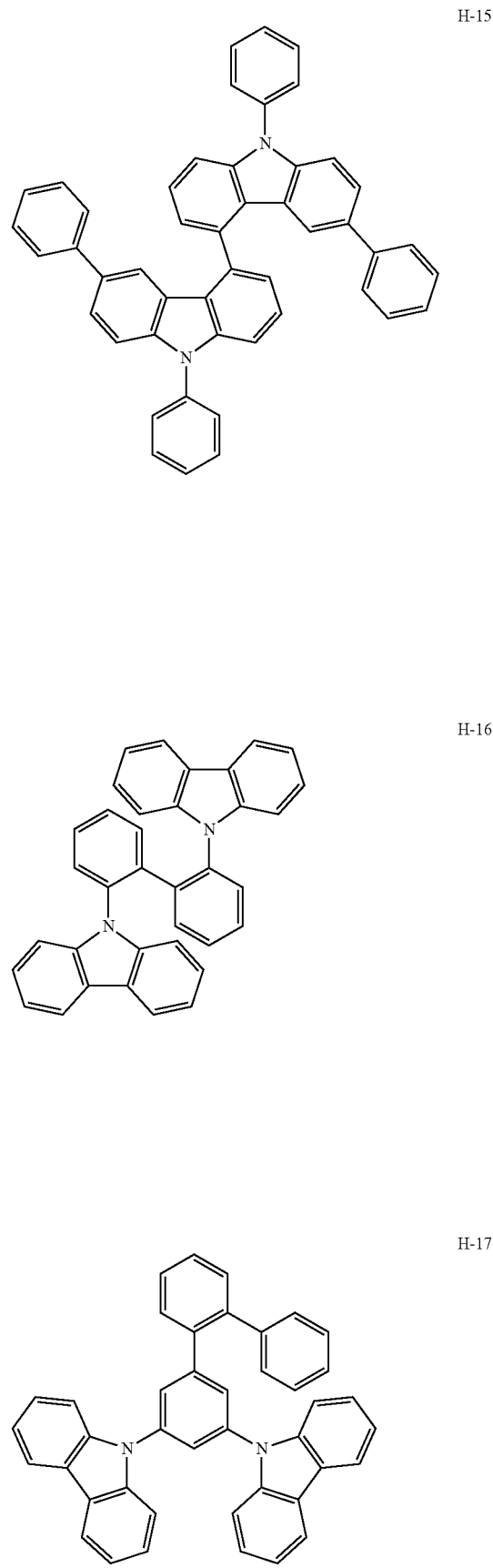

H-18
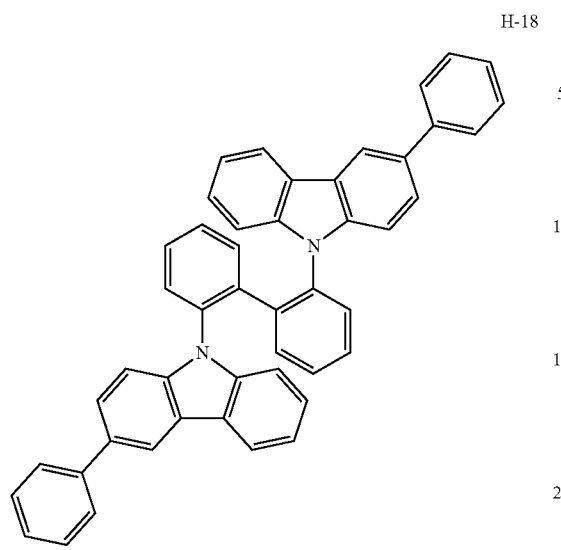
H-19
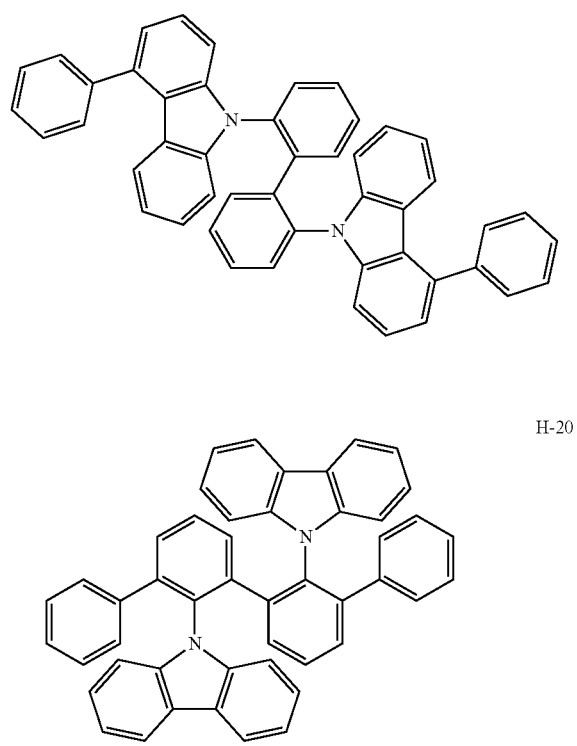
H-20
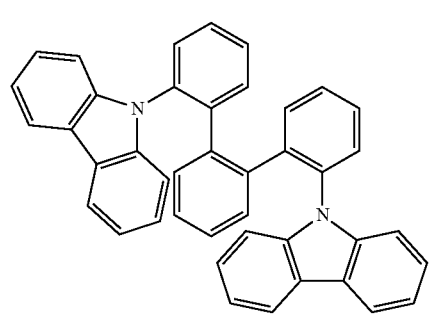
H-21
H-22
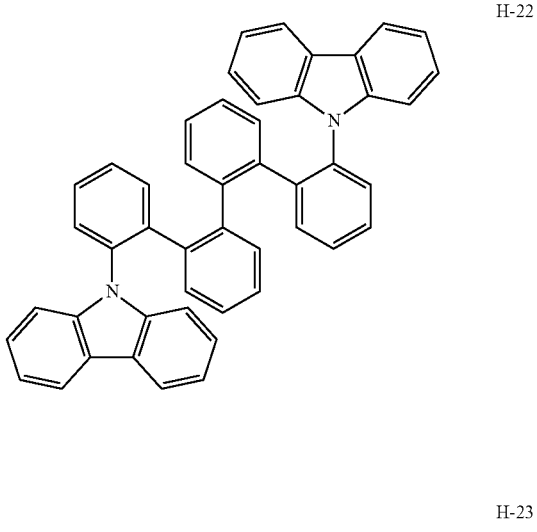
H-23
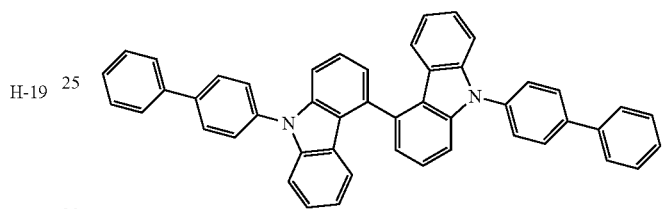
H-24
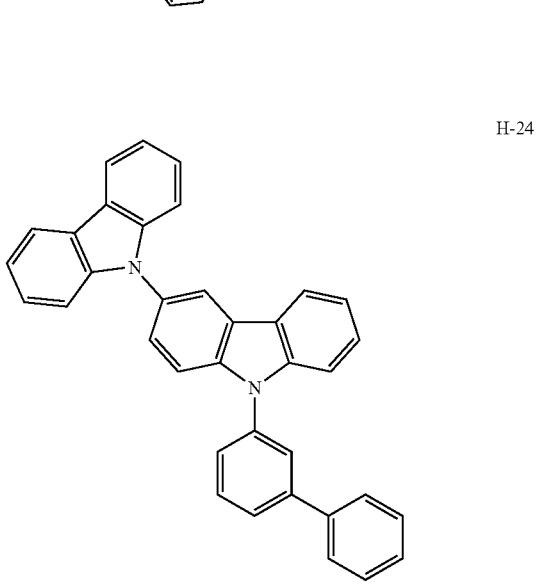
H-25
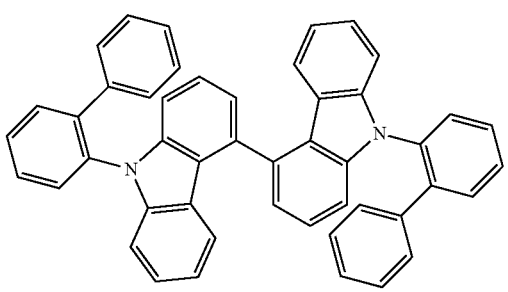

H-26
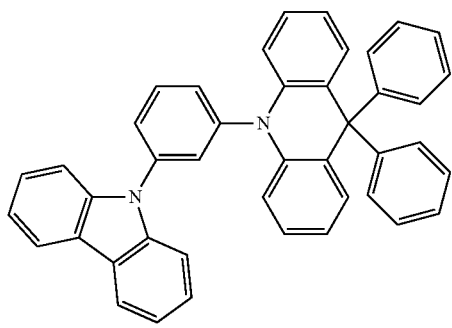
H-27
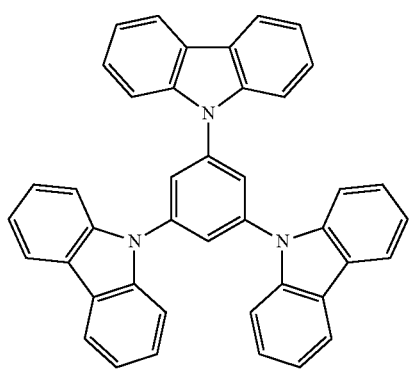
H-28
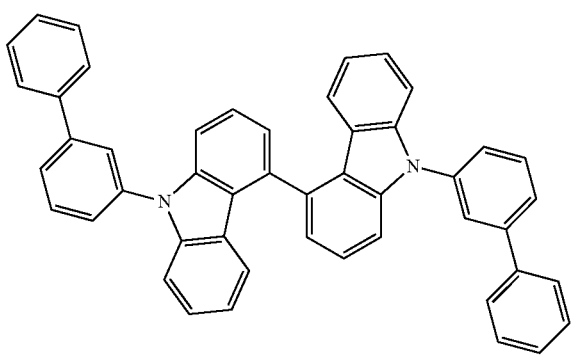
H-29
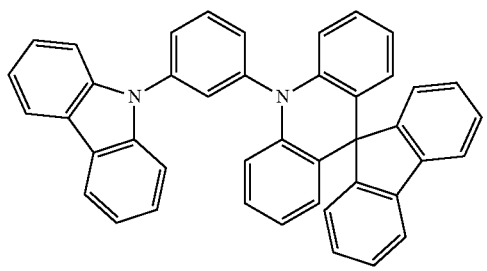
H-30
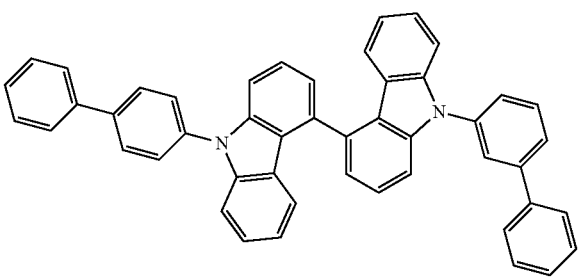
H-31
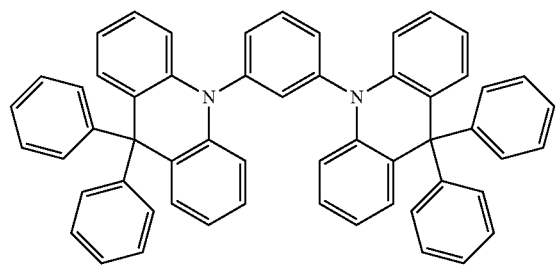
H-32
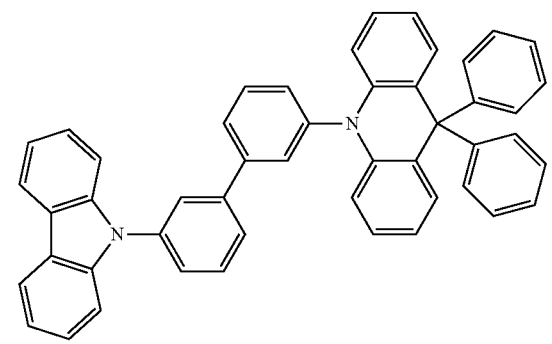
H-33
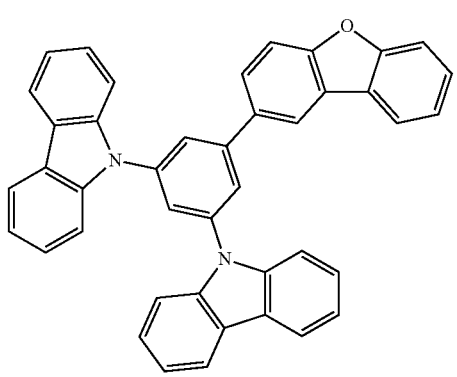

H-34
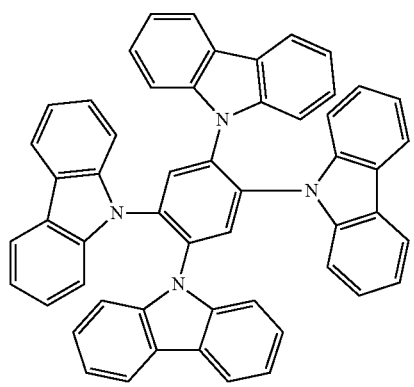
H-35
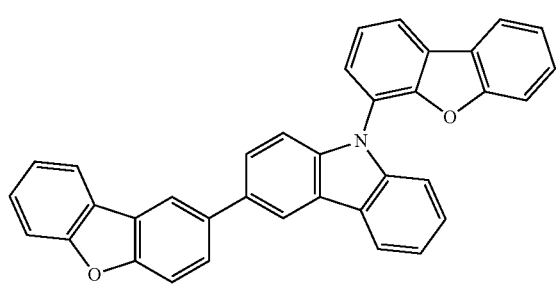
H-36
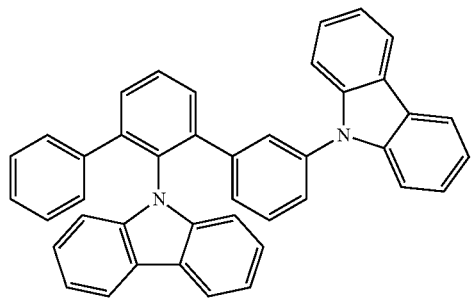
H-37
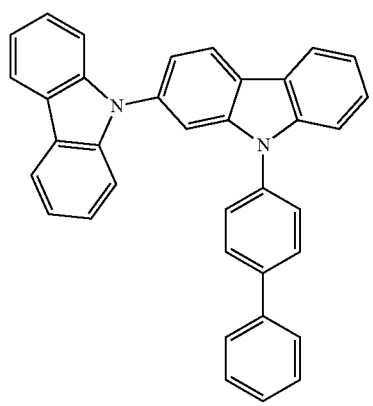
H-38
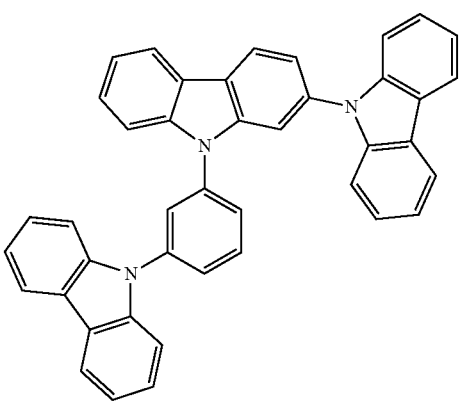
H-39
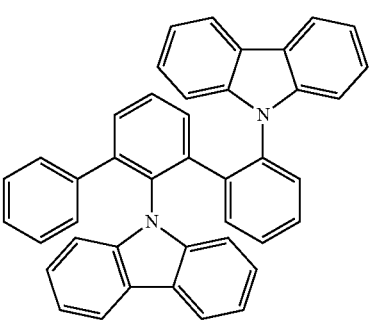
H-40
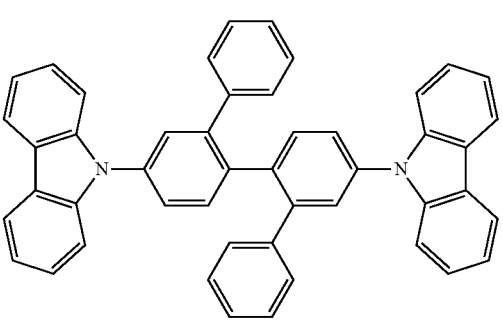
H-41
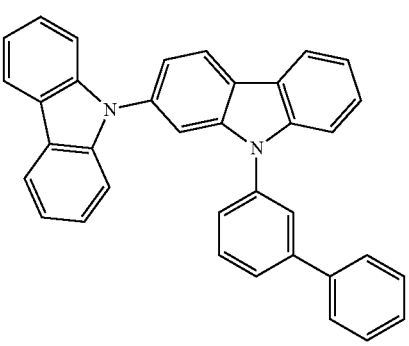

-continued

H-42

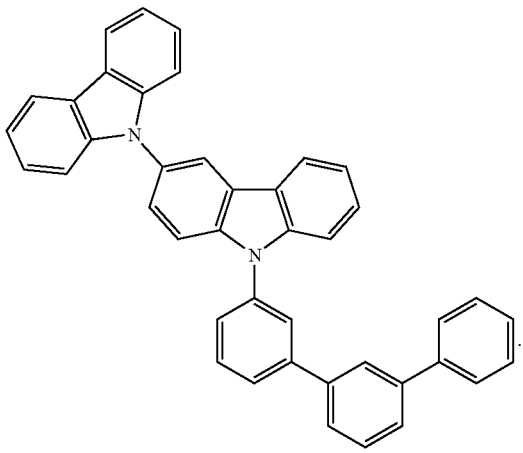

15. A thin film comprising the composition of claim 1 and a phosphorescent dopant.

16. The thin film of claim 15, wherein the phosphorescent dopant comprises an organometallic compound represented by Formula 81:

$$M(L_{81})_{n81}(L_{82})_{n82}$$ Formula 81

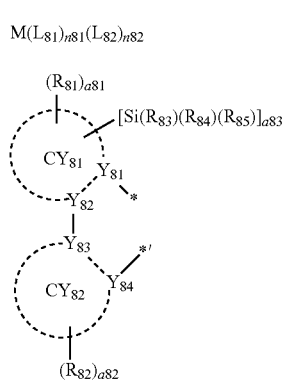

Formula 81A wherein in Formulae 81 and 81A,

M is selected from iridium, platinum, osmium, titanium, zirconium, hafnium, europium, terbium, thulium, and rhodium, $L_{81}$ is a ligand represented by Formula 81A, and n81 is an integer selected from 1 to 3, wherein when n81 is two or more, two or more ligands $L_{81}$ are identical to or different from each other, $L_{82}$ is an organic ligand, and n82 is an integer selected from 0 to 4, wherein when n82 is two or more, two or more ligands $L_{82}$ are identical to or different from each other, $Y_{81}$ to $Y_{84}$ are each independently C or N, $Y_{81}$ and $Y_{82}$ are linked to each other through a single bond or a double bond, and $Y_{83}$ and $Y_{84}$ are linked to each other through a single bond or a double bond, $CY_{81}$ and $CY_{82}$ are each independently selected from a $C_5$-$C_{30}$ carbocyclic ring and a $C_1$-$C_{30}$ heterocyclic ring, $CY_{81}$ and $CY_{82}$ are further optionally linked to each other through an organic linking group, $R_{81}$ to $R_{85}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —Si($Q_{81}$)($Q_{82}$)($Q_{83}$), —N($Q_{84}$)($Q_{85}$), —B($Q_{86}$)($Q_{87}$), and —P(=O)($Q_{88}$)($Q_{89}$), a81 to a83 are each independently an integer selected from 0 to 5, wherein when a81 is two or more, two or more groups $R_{81}$ are identical to or different from each other, when a82 is two or more, two or more groups $R_{82}$ are identical to or different from each other, when a81 is two or more, a plurality of adjacent groups $R_{81}$ are optionally linked to each other to form a saturated or unsaturated ring, and when a82 is two or more, a plurality of groups $R_{82}$ are optionally linked to each other to form a saturated or unsaturated ring,

* and *' in Formula 81A each independently indicate a binding site to M of Formula 81, and at least one of substituent(s) of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group is selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, and —Si($Q_{91}$)($Q_{92}$)($Q_{93}$), wherein $Q_{81}$ to $Q_{89}$ and $Q_{91}$ to $Q_{93}$ are each independently selected from hydrogen, deuterium, a $C_1$-$C_{60}$ alkyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one $C_1$-$C_{60}$ alkyl group, a $C_6$-$C_{60}$ aryl group substituted with at least one $C_6$-$C_{60}$ aryl group, a $C_1$-$C_{60}$ heteroaryl group, a monovalent non-aromatic condensed polycyclic group, and a monovalent non-aromatic condensed heteropolycyclic group.

17. The thin film of claim 16, wherein $Y_{81}$ is N, $Y_{82}$ and $Y_{83}$ are C, and $Y_{84}$ is N or C, $CY_{81}$ and $CY_{82}$ are each independently selected from a cyclopentadiene ring, a benzene ring, a heptalene ring, an indene ring, a naphthalene ring, an azulene ring, an indacene ring, acenaphthylene ring, a fluorene ring, a spiro-bifluorene ring, a benzofluorene ring, a dibenzofluorene ring, a phenalene ring, a phenanthrene ring, an anthracene ring, a fluoranthene ring, a triphenylene ring, a pyrene ring, a chrysene ring, a naphthacene ring, a picene ring, a perylene ring, a pentacene ring, a hexacene ring, a pentaphene ring, a rubicene ring, a corocene ring, an ovalene ring, a pyrrole ring, an isoindole ring, an indole ring, an indazole ring, a pyrazole ring, an imidazole ring, a triazole ring, an oxazole ring, an isoxazole ring, an oxadiazole ring, a thiazole ring, an isothiazole ring, a thiadiazole ring, a purine ring, a furan ring, a thiophene ring, a pyridine ring, a pyrimidine ring, a quinoline ring, an isoquinoline ring, a benzoquinoline ring, a phthalazine ring, a naphthyridine ring, a quinoxaline ring, a quinazoline ring, a cinnoline ring, a phenanthridine ring, an acridine ring, a phenanthroline ring, a phenazine ring, a benzimidazole ring, a benzofuran ring, a benzothiophene ring, an isobenzothiazole ring, a benzoxazole ring, an isobenzoxazole ring, a benzocarbazole ring, a dibenzocarbazole ring, an imidazopyridine ring, an imidazopyrimidine ring, a dibenzofuran ring, a dibenzothiophene ring, a dibenzothiophene sulfone ring, a carbazole ring, a dibenzosilole ring, and a 2,3-dihydro-1H-imidazole ring.

18. The thin film of claim 16, wherein $R_{81}$ and $R_{82}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —B($Q_{86}$)($Q_{87}$) and —P(=O)($Q_{88}$)($Q_{89}$), wherein $Q_{86}$ to $Q_{89}$ are each independently selected from: —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

19. The thin film of claim 16, wherein in Formula 81A, at least one selected from $R_{81}$ in the number of a81 and $R_{82}$ in the number of a82 is a cyano group.

20. The thin film of claim 16, wherein in Formula 81A, at least one selected from $R_{81}$ in the number of a81 and $R_{82}$ in the number of a82 is deuterium.

21. An organic light-emitting device comprising:
a first electrode;
a second electrode; and
an organic layer disposed between the first electrode and the second electrode,
wherein the organic layer comprises the thin film of claim 15.

22. The organic light-emitting device of claim 21, wherein the thin film is an emission layer.

23. The organic light-emitting device of claim 22, wherein the organic light-emitting device emits blue light having a CIE y coordinate of 0.3 or less.

* * * * *